US010953956B2

(12) United States Patent
Szydlowski et al.

(10) Patent No.: US 10,953,956 B2
(45) Date of Patent: *Mar. 23, 2021

(54) METHOD AND SYSTEM FOR A TOWED VESSEL SUITABLE FOR TRANSPORTING LIQUIDS

(71) Applicants: Allen Szydlowski, Las Condes (CL); Ian Szydlowski, New York, NY (US)

(72) Inventors: Allen Szydlowski, Las Condes (CL); Ian Szydlowski, New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/594,266

(22) Filed: Oct. 7, 2019

(65) Prior Publication Data
US 2020/0039611 A1 Feb. 6, 2020

Related U.S. Application Data

(63) Continuation of application No. 15/959,438, filed on Apr. 23, 2018, now Pat. No. 10,435,118, which is a
(Continued)

(51) Int. Cl.
*B63B 35/58* (2006.01)
*B63B 22/02* (2006.01)
(Continued)

(52) U.S. Cl.
CPC ............. *B63B 25/08* (2013.01); *B60L 8/003* (2013.01); *B63B 25/12* (2013.01); *B63B 35/285* (2013.01);
(Continued)

(58) Field of Classification Search
CPC ..... B63B 22/02; B63B 22/021; B63B 22/023; B63B 22/24; B63B 22/28; B63B 25/08;
(Continued)

(56) References Cited

U.S. PATENT DOCUMENTS 2,371,404 A 3/1945 Mumford
2,391,926 A 1/1946 Scott
(Continued)

FOREIGN PATENT DOCUMENTS

CA 1049856 3/1979
CA 2744617 1/2013
(Continued)

OTHER PUBLICATIONS

U.S. Appl. No. 16/549,495, filed Aug. 23, 2019, Szydlowski et al.
(Continued)

*Primary Examiner* — Daniel V Venne
(74) *Attorney, Agent, or Firm* — Sheridan Ross P.C.

(57) ABSTRACT

A towed vessel suitable for containing and transporting various liquids is disclosed. The vessel further comprises various features useful in the transportation, navigation, and storage of the towable vessel, both when in use for transporting fluids and when transported in an emptied state. Such features include navigational and positioning devices and methods, power supply devices and methods, and means for filling, inflating, emptying, and deflating a non-rigid, towed vessel. Aspects of embodiments of the present invention further include features useful for purifying or preserving the purity of the fluid to be transported.

12 Claims, 32 Drawing Sheets

Related U.S. Application Data continuation of application No. 15/187,051, filed on Jun. 20, 2016, now Pat. No. 9,950,773, which is a continuation-in-part of application No. 14/689,203, filed on Apr. 17, 2015, now Pat. No. 9,371,114, which is a continuation of application No. 14/049,539, filed on Oct. 9, 2013, now Pat. No. 9,017,123, which is a continuation-in-part of application No. 14/047,663, filed on Oct. 7, 2013, now Pat. No. 9,010,261, said application No. 15/187,051 is a continuation-in-part of application No. 14/023,331, filed on Sep. 10, 2013, now abandoned, said application No. 14/047,663 is a continuation-in-part of application No. 13/767,675, filed on Feb. 14, 2013, now Pat. No. 8,702,460, said application No. 14/023,331 is a continuation-in-part of application No. 13/222,940, filed on Aug. 31, 2011, now abandoned, said application No. 13/767,675 is a continuation of application No. 13/025,796, filed on Feb. 11, 2011, now Pat. No. 8,403,718.

(60) Provisional application No. 61/378,811, filed on Aug. 31, 2010, provisional application No. 61/303,519, filed on Feb. 11, 2010.

(51) Int. Cl.
  B65D 88/78 (2006.01)
  B63B 25/08 (2006.01)
  H01L 31/042 (2014.01)
  B63B 25/12 (2006.01)
  B63B 35/28 (2006.01)
  H02S 10/12 (2014.01)
  B60L 8/00 (2006.01)
  H02S 10/40 (2014.01)

(52) U.S. Cl.
  CPC ............ H01L 31/042 (2013.01); H02S 10/12 (2014.12); *B60L 2200/32* (2013.01); *B63B 2025/085* (2013.01); *B63B 2213/00* (2013.01); *H02S 10/40* (2014.12); *Y02T 10/7072* (2013.01)

(58) Field of Classification Search
  CPC ....... B63B 25/082; B63B 25/12; B63B 25/14; B63B 25/16; B63B 35/285; B63B 2025/085; B63B 2213/00; H01L 31/042; H02S 10/12; H02S 10/40; B60L 8/003; B60L 2200/32; Y02T 10/7072
  USPC ....... 114/256, 257, 312, 313, 321, 322, 326, 114/328, 329, 330, 331, 333, 342, 242, 114/244, 245, 253, 72, 73, 74 R, 74 T, 114/74 A; 441/4, 21, 22, 23, 28, 30, 32, 441/133, 134
  See application file for complete search history.

(56) References Cited

U.S. PATENT DOCUMENTS

| | | | |
|---|---|---|---|
| 2,968,272 A * | 1/1961 | Berglund | B63B 35/285 114/74 R |
| 2,969,036 A * | 1/1961 | Brown | B63G 7/04 114/244 |
| 2,979,008 A * | 4/1961 | Whipple | B63B 35/285 114/74 T |
| 2,997,973 A * | 8/1961 | Hawthorne | B63B 35/285 114/74 T |
| 2,998,793 A * | 9/1961 | Hawthorne | B63B 35/285 114/74 T |
| 3,779,196 A | 12/1973 | Knaus et al. | |
| 3,955,524 A | 5/1976 | Renoux | |
| 3,967,396 A | 7/1976 | Maisonneuve et al. | |
| 3,999,499 A | 12/1976 | Kitabayashi | |
| 4,108,101 A | 8/1978 | Schirtzinger | |
| 4,117,796 A | 10/1978 | Strain | |
| 4,224,802 A | 9/1980 | Ooka | |
| 4,227,478 A | 10/1980 | Preus | |
| 4,233,085 A | 11/1980 | Roderick et al. | |
| 4,331,129 A | 5/1982 | Hong et al. | |
| 4,399,765 A | 8/1983 | Alkner et al. | |
| 4,409,919 A | 10/1983 | Strain et al. | |
| 4,432,669 A | 2/1984 | Cox et al. | |
| 4,512,886 A | 4/1985 | Hicks et al. | |
| 4,517,094 A | 5/1985 | Beall | |
| 4,563,826 A | 1/1986 | Whitaker, Jr. | |
| 4,564,450 A | 1/1986 | Piper et al. | |
| 4,567,731 A | 2/1986 | Horan | |
| 4,627,375 A | 12/1986 | Davis et al. | |
| 4,713,898 A | 12/1987 | Bull et al. | |
| 4,736,534 A | 4/1988 | Daniels et al. | |
| 4,810,195 A | 3/1989 | Asmussen et al. | |
| 4,890,958 A | 1/1990 | Dancer | |
| 5,032,261 A | 7/1991 | Pyper | |
| 5,099,779 A | 3/1992 | Kawaichi et al. | |
| 5,131,341 A | 7/1992 | Newman | |
| 5,197,912 A | 3/1993 | Lengefeld | |
| 5,229,005 A | 7/1993 | Fok et al. | |
| 5,413,065 A | 5/1995 | Spragg et al. | |
| 5,487,485 A | 1/1996 | Yang et al. | |
| 5,488,921 A | 2/1996 | Spragg | |
| 5,505,585 A | 4/1996 | Hubbard | |
| 5,562,824 A | 10/1996 | Magnusson et al. | |
| 5,657,714 A | 8/1997 | Hsia et al. | |
| 5,727,492 A | 3/1998 | Cuneo et al. | |
| 5,910,248 A | 6/1999 | Tlok | |
| 6,047,655 A | 4/2000 | Cran | |
| 6,125,778 A | 10/2000 | Rodden | |
| 6,139,809 A | 10/2000 | Rodden | |
| 6,194,790 B1 | 2/2001 | Griffin et al. | |
| 6,293,217 B1 | 9/2001 | Savage et al. | |
| 6,330,865 B1 | 12/2001 | Cran | |
| 6,550,410 B2 | 4/2003 | Reimers | |
| 6,580,025 B2 | 6/2003 | Guy | |
| 6,615,759 B2 | 9/2003 | Yaffe | |
| 6,675,734 B2 | 1/2004 | Eagles et al. | |
| 6,718,896 B2 | 4/2004 | Davenport | |
| 6,739,274 B2 | 5/2004 | Eagles et al. | |
| 6,802,684 B2 | 10/2004 | Arntzen et al. | |
| 6,808,808 B2 | 10/2004 | Freeman et al. | |
| 6,832,571 B2 | 12/2004 | Eagles | |
| 6,860,218 B2 | 3/2005 | Eagles et al. | |
| 6,869,540 B2 | 3/2005 | Robinson | |
| 6,902,368 B2 | 6/2005 | Hagenzieker et al. | |
| 6,923,135 B2 | 8/2005 | Kranebitter | |
| 6,928,336 B2 | 8/2005 | Peshkin et al. | |
| 6,997,643 B2 | 2/2006 | Wille et al. | |
| 7,002,472 B2 | 2/2006 | Stratmoen et al. | |
| 7,024,748 B2 | 4/2006 | Eagles | |
| 7,062,406 B2 | 6/2006 | Patwardhan et al. | |
| 7,077,963 B2 | 7/2006 | McConchie | |
| 7,107,921 B2 | 9/2006 | Davis et al. | |
| 7,117,807 B2 | 10/2006 | Bohn, Jr. et al. | |
| 7,143,709 B2 | 12/2006 | Brennan et al. | |
| 7,201,291 B2 | 4/2007 | Vingy et al. | |
| 7,201,624 B2 | 4/2007 | Dyhrberg | |
| 7,273,562 B2 | 9/2007 | Robinson | |
| 7,287,481 B1 | 10/2007 | Wrage et al. | |
| 7,308,862 B2 | 12/2007 | Romanski et al. | |
| 7,320,289 B1 | 1/2008 | Clarke et al. | |
| 7,332,082 B2 | 2/2008 | Brandlmaier | |
| 7,347,970 B2 | 3/2008 | Kim et al. | |
| 7,365,266 B2 | 4/2008 | Heckeroth | |
| 7,390,343 B2 | 6/2008 | Tepper et al. | |
| 7,402,253 B2 | 7/2008 | van Leeuwen et al. | |
| 7,407,592 B2 | 8/2008 | van Leeuwen et al. | |
| 7,410,339 B2 | 8/2008 | Franzen et al. | |
| 7,410,573 B2 | 8/2008 | Saho et al. | |
| 7,416,660 B2 | 8/2008 | van Leeuwen et al. | |
| 7,451,604 B2 | 11/2008 | Yoshida et al. | |

(56) References Cited

U.S. PATENT DOCUMENTS

| | | |
|---|---|---|
| 7,500,442 B1 | 3/2009 | Schanz |
| 7,504,741 B2 | 3/2009 | Wrage et al. |
| 7,546,813 B2 | 6/2009 | Wrage |
| 7,553,418 B2 | 6/2009 | Khudenko et al. |
| 7,564,989 B2 | 7/2009 | Schanz |
| 7,569,148 B2 | 8/2009 | Elefritz et al. |
| 7,588,686 B2 | 9/2009 | Jensen |
| 7,650,848 B2 | 1/2010 | Brennan et al. |
| 7,672,761 B2 | 3/2010 | Wrage et al. |
| 7,686,539 B2 | 3/2010 | Aristaghes et al. |
| 7,690,319 B2 | 4/2010 | Wingate |
| 7,731,847 B2 | 6/2010 | Huy |
| 7,740,765 B2 | 6/2010 | Mitchell et al. |
| 7,755,211 B2 | 7/2010 | Montgomery |
| 7,775,171 B2 | 8/2010 | Tupil |
| 7,798,083 B2 | 9/2010 | Wrage |
| 7,841,289 B1 | 11/2010 | Schanz |
| 7,866,271 B2 | 1/2011 | Wrage et al. |
| 7,900,780 B2 | 3/2011 | Ueki et al. |
| 7,932,461 B2 | 4/2011 | Johnson et al. |
| 7,971,545 B2 | 7/2011 | Wrage |
| 7,987,017 B2 | 7/2011 | Buzzoni et al. |
| 8,007,845 B2 | 8/2011 | Szydlowski |
| 8,056,490 B2 | 11/2011 | Wrage |
| 8,058,985 B2 | 11/2011 | Dobson et al. |
| 8,117,977 B2 | 2/2012 | Reusch |
| 8,215,588 B2 | 7/2012 | Wrage et al. |
| 8,282,972 B2 | 10/2012 | Szydlowski |
| 8,306,649 B2 | 11/2012 | Buzzoni et al. |
| 8,322,294 B2 | 12/2012 | Bowhay |
| 8,403,718 B2 | 3/2013 | Szydlowsk et al. |
| 8,488,246 B2 | 7/2013 | Border et al. |
| 8,492,023 B2 | 7/2013 | Sastry et al. |
| 8,496,423 B2 | 7/2013 | Springett et al. |
| 8,506,739 B2 | 8/2013 | Gautier et al. |
| 8,508,065 B1 | 8/2013 | Lee |
| 8,522,707 B1 | 9/2013 | Shiban |
| 8,527,457 B2 | 9/2013 | Moon et al. |
| 8,529,376 B2 | 9/2013 | Morgan et al. |
| 8,702,460 B2 | 4/2014 | Szydlowski et al. |
| 8,715,756 B2 | 5/2014 | Szydlowski |
| 8,924,311 B2 | 12/2014 | Szydlowski et al. |
| 9,010,261 B2 | 4/2015 | Szydlowski et al. |
| 9,017,123 B2 | 4/2015 | Szydlowski et al. |
| 9,023,410 B2 | 5/2015 | Szydlowski et al. |
| 9,371,114 B2 | 6/2016 | Szydlowski et al. |
| 9,521,858 B2 | 12/2016 | Szydlowski et al. |
| 9,950,773 B2 | 4/2018 | Szxydlowski et al. |
| 10,399,642 B2 | 9/2019 | Szydlowski et al. |
| 10,435,118 B2 | 10/2019 | Szydlowski et al. |
| 2002/0148401 A1 | 10/2002 | Eagles et al. |
| 2002/0188459 A1 | 12/2002 | Erickson |
| 2004/0038089 A1 | 2/2004 | Hoffjann et al. |
| 2004/0144294 A1 | 6/2004 | Yaffe |
| 2004/0215367 A1 | 10/2004 | King et al. |
| 2005/0066868 A1 | 3/2005 | Saho et al. |
| 2005/0276666 A1 | 12/2005 | Wille et al. |
| 2005/0284361 A1 | 12/2005 | Muis et al. |
| 2006/0027507 A1 | 2/2006 | van Leeuwen |
| 2006/0096990 A1 | 5/2006 | Reed |
| 2006/0293770 A1 | 12/2006 | Masunaga |
| 2007/0073609 A1 | 3/2007 | Odom et al. |
| 2007/0246424 A1 | 10/2007 | Hironari |
| 2008/0017591 A1 | 1/2008 | Ranade et al. |
| 2008/0110091 A1 | 5/2008 | Perkins et al. |
| 2008/0116142 A1 | 5/2008 | Fischmann Torres |
| 2008/0127654 A1 | 6/2008 | Darling et al. |
| 2008/0174485 A1 | 7/2008 | Carani et al. |
| 2008/0194160 A1 | 8/2008 | Concannon |
| 2008/0196581 A1 | 8/2008 | Cooley |
| 2008/0200746 A1 | 8/2008 | Bird et al. |
| 2008/0203093 A1 | 8/2008 | Skulnick |
| 2008/0235858 A1 | 10/2008 | Schanz |
| 2008/0251755 A1 | 10/2008 | Matula et al. |
| 2009/0055294 A1 | 2/2009 | Shirazi |
| 2009/0126400 A1 | 5/2009 | Pozivil |
| 2009/0146815 A1 | 6/2009 | Cho |
| 2009/0221983 A1 | 9/2009 | Schanz |
| 2009/0276105 A1 | 11/2009 | Lacaze et al. |
| 2009/0308412 A1 | 12/2009 | Dixon |
| 2009/0314725 A1 | 12/2009 | Parro |
| 2010/0000252 A1 | 1/2010 | Morris et al. |
| 2010/0015325 A1 | 1/2010 | Muis et al. |
| 2010/0042527 A1 | 2/2010 | Mitchell et al. |
| 2010/0063902 A1 | 3/2010 | Constantz et al. |
| 2010/0116647 A1 | 5/2010 | Kornmuller |
| 2010/0116684 A1 | 5/2010 | Sawyer |
| 2010/0119755 A1 | 5/2010 | Chung et al. |
| 2010/0126404 A1 | 5/2010 | Brennan et al. |
| 2010/0226943 A1 | 9/2010 | Brennan et al. |
| 2010/0272630 A1 | 10/2010 | Rosenbaum |
| 2010/0280750 A1 | 11/2010 | Chen et al. |
| 2010/0287073 A1 | 11/2010 | Kocis |
| 2010/0319923 A1 | 12/2010 | Slabaugh |
| 2011/0036919 A1 | 2/2011 | Baird |
| 2011/0089123 A1 | 4/2011 | Kennedy |
| 2011/0091607 A1 | 4/2011 | Szydlowski |
| 2011/0132849 A1 | 6/2011 | Husain |
| 2011/0147293 A1 | 6/2011 | Imahashi |
| 2011/0303277 A1 | 12/2011 | Neumann et al. |
| 2011/0311769 A1 | 12/2011 | Chen et al. |
| 2012/0024215 A1 | 2/2012 | Flockenhagen |
| 2012/0216875 A1 | 8/2012 | Szydlowski et al. |
| 2012/0223583 A1 | 9/2012 | Cooley et al. |
| 2012/0248878 A1 | 10/2012 | Iwanaga et al. |
| 2012/0312364 A1 | 12/2012 | Uhrich et al. |
| 2013/0000342 A1 | 1/2013 | Blasko et al. |
| 2013/0026978 A1 | 1/2013 | Cooley et al. |
| 2013/0160692 A1 | 6/2013 | Skiadas |
| 2013/0175382 A1 | 7/2013 | Brutoco |
| 2013/0175404 A1 | 7/2013 | Shefer |
| 2013/0197717 A1 | 8/2013 | Fraser et al. |
| 2013/0202435 A1 | 8/2013 | Beaudoin |
| 2013/0210461 A1 | 8/2013 | Moldavsky et al. |
| 2013/0213897 A1 | 8/2013 | Jauncey et al. |
| 2013/0217822 A1 | 8/2013 | Hofmann et al. |
| 2013/0220205 A1 | 8/2013 | Henriksen |
| 2013/0221158 A1 | 8/2013 | Binkholder et al. |
| 2013/0228645 A1 | 9/2013 | Van Speybroeck et al. |
| 2013/0230396 A1 | 9/2013 | Wakasa et al. |
| 2013/0230747 A1 | 9/2013 | Patolsky et al. |
| 2014/0014188 A1 | 1/2014 | Szydiowski et al. |

FOREIGN PATENT DOCUMENTS

| | | |
|---|---|---|
| CN | 1079881 | 12/1993 |
| EP | 0203477 | 12/1986 |
| EP | 0538563 | 4/1993 |
| EP | 0832826 | 4/1998 |
| EP | 1006084 | 6/2000 |
| EP | 0855012 | 8/2003 |
| EP | 1447384 | 8/2004 |
| EP | 1637819 | 3/2006 |
| EP | 1723021 | 11/2006 |
| EP | 2499212 | 9/2012 |
| GB | 821195 | 9/1959 |
| JP | 2003/081177 | 3/2003 |
| WO | WO 99/28182 | 6/1999 |
| WO | WO 99/65797 | 12/1999 |
| WO | WO 00/39408 | 7/2000 |
| WO | WO 02/44089 | 6/2002 |
| WO | WO 02/074692 | 9/2002 |
| WO | WO 03/104089 | 12/2003 |
| WO | WO 2008/110762 | 9/2008 |
| WO | WO 2010/063135 | 6/2010 |
| WO | WO 2011/066193 | 6/2011 |
| WO | WO 2011/071892 | 6/2011 |
| WO | WO 2011/124222 | 10/2011 |
| WO | WO 2012/020259 | 2/2012 |

(56) References Cited

FOREIGN PATENT DOCUMENTS

| WO | WO 2013/016440 | 1/2013 |
|---|---|---|
| WO | WO 2013/040521 | 3/2013 |

OTHER PUBLICATIONS

"Alaska Glacier Cap Bottled Water," Fine Waters, Aug, 2004, found at www.web.archive.org/web/20040809211105/www.finewaters.com/Bottled_Water/USA/Alaska_Glacier_Cap.asp, printed Sep. 30, 2010, 2 pages.
"Aqua Pacific: Fiji's Finest Mineral Water," Crystal Clear Mineral Water & Aqua Pacific, Jun. 11, 2009, [retrieved on Mar. 20, 2014], 5 pages. Retrieved from: http://web.archive.org/web/20090611120827/http://www.aquapacific.com/underground.html.
"Argonne Lab Experiment Simulates Comet Collision, The University of Chicago," Chronicle, Apr. 26, 2001, vol. 20, No. 15, 2 pages.
"Bottled Water and Energy A Fact Sheet," © 2008 Pacific Institute, www.pacinst.org/topics/water_and_sustainability/bottled_water/bottled_water_and_energy.html, printed Sep. 9, 2009, 2 pages.
"CargoWiz Truck, Container and Pallet Loading Software," Softtruck, 2007, [retrieved on Dec. 24, 2013], 3 pages. Retrieved from: www.softtruck.com/index.htm.
"Comet discovered at a crucial ingredient for life," LATERCERA.CL, Aug. 18, 2009, (Mechanical Translation), 2 pages.
"ContainerPacTM Disposable and Reusable Flexitanks," Flexitank, 2008, [retrieved on Apr. 25, 2013], 3 pages. Retrieved from: flexitank.com.au/subproducts/containerpac.html.
"Global Ballast Water Management Programme—The New Convention," GloBallast, 2006, 3 pages (found at www.globallast.imo.org/index.asp?page=mepc.htm).
"Report 4 of 5: Water Cigars—Greece," Hands On—The Earth Report from TVE.org, Series 2: Programme 10 of 14—WaterWays, 4 pages, 2004, www.tve.org/ho/series2/waterways_reports/watercigars_greece.html.
"Soil and Aquifer Properties and Their Effect on Groundwater," found at www.co.portage.wi.us/groundwater/undrstnd/soil.htm, printed Sep. 21, 2009, 8 pages.
"Solar-powered plane completes cross-country flight," Fox News.com, Jul. 7, 2013 [retrieved on Jul. 8, 2013], 2 pages. Retrieved from: www.foxnews.com/us/2013/07/07/solar-powered-plane-completes-cross-country-flight/?test=latestnews.
"Solar powered plane completes history-making cross-country flight, lands at JFK airport," The Washington Post, Jul. 6, 2013, [retrieved on Jul. 8, 2013], 4 pages. Retrieved from: www.washingtonpost.com/politics/solar-powered-plane-has-tear-on-wing-earlier-landing-expected-in-nyc-on-final-leg-of-flight/2013/07/06/98e50c56-e69a-11e2-97c2-eee7eab7397e_story.html.
"Terroir" Wikipedia, found at www.en.wikipedia.org/wiki/Terroir, printed Sep. 21, 2009, 6 pages.
"The Fiji Aquifer—450 Year Old Water," FineWaters, Nov. 2003, found at www.web.archive.org/web/20031102060856/finewaters.com/Resources/Water_Science/The_Fiji_Aquifer.asp, 1 page.
"The Problem," GloBallast, retrieved Jan. 8, 2013, 5 pages (found at: www.globallast.imo.org/index.asp?page=problem.htm).
"Water Transport Technology," MH Waters Pty Ltd., 2005, downloaded from www.mywaters.com/watertransport.html, 1 page.
"What it Greenland was Africa's water fountain?" Pruned, Oct. 2, 2006, www.pruned.blogspot.com/2006/10/what-if-greenland-was-africas-water.html, 5 pages.
"World's Most Expensive Bottled Water," Alvinology, Apr. 15, 2008, 12 pages. (www.alvinology.com/2008/04/15/worlds-most-expensive-bottled-water/).
10 Thousand BC—Luxury Glacier Water, found at www.10thousandbc.com, printed Sep. 30, 2010, 3 pages.
10 Thousand BC trademark, [on line]], [retrieved on Sep. 30, 2010]. Retrieved from the Internet: URL:www.tess2.uspto.gov/bin/showfield?f=doc&state=4008:gktt2k.2.1 , 2 pages.

Alfredo, "Carbon Dating Bottled Water," Fine Waters Vintage, Jul. 4, 2004 found at www.finewaters.com/Bottled_Water_Etiquette/Flavor_of_Water/FineWaters_Vintage/Print.asp, 1 page.
Christner et al., "Recovery and Identification of Viable Bacteria Immured in Glacial Ice," Icarus vol. 144, iss. 2, Apr. 2000, (Abstract) 3 pages.
Doyle "Sea-Going Water Bags to Quench World Thirst?" Reuters, Nov. 27, 2011, 4 pages.
Epica community members, "Eight glacial cycles from an Antarctic ice core," Nature, 2004, vol. 429, pp. 623-628.
Felton, "A Fashion Trend Meets a Watery Grave," The Wall Street Journal, Aug. 6, 2009, 2 pages.
Fickling, "Australian Bladders Become New Normal for Wine Exports," Bloomberg.com, Jan. 30, 2013 [retrieved on Apr. 25, 2013], 4 pages. Retrieved from: www.bloomberg.com/news/2013-01-30/australian-bladders-become-new-normal-for-wine-exports.html.
Gardiner, "How to Load a Giant Container Ship," Wired.com, Aug. 1, 2013, [retrieved on Dec. 26, 2013], 6 pages. Retrieved from: www.wired.com/business/2013/08/qq_containership/.
Ghose, "A Year of Global Shipping Routes Mapped by GPS," Wired Science, Jan. 25, 2010, [retrieved on Jul. 25, 2013], 2 pages. Retrieved from: www.wired.com/wiredscience/2010/01/global-shipping-map/.
Glavin et al. "Re-examination of amino acids in Antarctic micrometeorites," Advances in Space Research, 2004, vol. 33, No. 1, pp. 106-113.
Haeberli, "Absolute and Relative Age Dating of Rock Glacier Surfaces in Alpine Permafrost," European Geological Society, Geophysical Research Abstracts, Apr. 2003, vol. 5, Issue 10890, 2 pages.
Hajim, "Iceberg Hunters," Fortune, Nov. 14, 2005, 1 page.
Mascha, "The Age of Water—How Old is Your Water?" Fine Waters, Mar. 2, 2005, found at www.finewaters.com/Bottled_Water_Etiquette/Bottled_Water_History/The_Age_of_Water_How_Old_is_Your_Water/All_Pages.asp, 2 pages.
Mission 2012:Clean Water, "Contingency Plans," archived on Aug. 21, 2009, available online at http://web.archive.org/web/20090821170721/http://web.mit.edu/12.000/www/m2012/finalwebsite/solution/contingency.shtml, 8 pages.
Old Water—10 Thousand BC Luxury Glacier Water, Trendhunter, found at www.trendhunter.com/trends/old-water-10-thousand-bc-luxury-g lacier-water, printed Sep. 30, 2010, 2 pages.
Scott, "Running Dry," Chemical and Engineering News, Jul. 22, 2013, pp. 11-15.
Thompson, "The Energy Footprint of Bottled Water," Live Science, Mar. 18, 2009, 1 page.
Zhou et al. "Evaluating the costs of desalination and water transport," Dec. 2004, www.uni-hamburg.de/Wiss/FB/15/Sustainability/DesalinationFNU41_revised.pdf, 16 pages.
International Preliminary Report on Patentability for International (PCT) Patent Application No. PCT/US2013/063690, dated Apr. 8, 2015, 11 pages.
International Search Report and Written Opinion for International (PCT) Patent Application No. PCT/US2013/063690 dated Mar. 11, 2014, 12 pages.
Official Action for U.S. Appl. No. 13/025,796, dated Oct. 17, 2012, 8 pages.
Notice of Allowance U.S. Appl. No. 13/025,796, dated Nov. 15, 2012, 5 pages.
Official Action for U.S. Appl. No. 13/767,675, dated Apr. 16, 2013 6 pages.
Notice of Allowance for U.S. Appl. No. 13/767,675, dated Nov. 22, 2013, 10 pages.
Official Action for U.S. Appl. No. 14/047,635 dated Nov. 26, 2014, 7 pages.
Notice of Allowance for U.S. Appl. No. 14/047,635, dated Dec. 24, 2014, 4 pages.
Official Action for U.S. Appl. No. 14/049,539, dated Nov. 24, 2014, 7 pages.
Notice of Allowance for U.S. Appl. No. 14/049,539, dated Dec. 16, 2014, 7 pages.

(56) References Cited

OTHER PUBLICATIONS

Official Action for U.S. Appl. No. 14/689,203, dated Jan. 11, 2016, 6 pages.
Notice of Allowance for U.S. Appl. No. 14/689,203, dated Feb. 23, 2016, 8 pages.
Official Action for U.S. Appl. No. 15/187,051, dated Apr. 4, 2017, 10 pages.
Official Action for U.S. Appl. No. 15/187,051, dated Oct. 19, 2017, 8 pages.
Notice of Allowance for U.S. Appl. No. 15/187,051, dated Dec. 20, 2017, 7 pages.
Official Action for U.S. Appl. No. 15/959,438, dated Feb. 5, 2019, 6 pages.
Notice of Allowance for U.S. Appl. No. 15/959,438, dated May. 30, 2019, 7 pages.

* cited by examiner

METHOD AND SYSTEM FOR A TOWED VESSEL SUITABLE FOR TRANSPORTING LIQUIDS

This application is a continuation of U.S. patent application Ser. No. 15/959,438, filed Apr. 23, 2018 (now U.S. Pat. No. 10,435,118, issued Oct. 8, 2019), which is a continuation of U.S. patent application Ser. No. 15/187,051, filed Jun. 20, 2016 (now U.S. Pat. No. 9,950,773, issuing Apr. 24, 2018), which is a continuation-in-part of U.S. patent application Ser. No. 14/689,203, filed on Apr. 17, 2015 (now U.S. Pat. No. 9,371,114, issued Jun. 21, 2016), which is a continuation of and claims the benefit of U.S. patent application Ser. No. 14/049,539, filed on Oct. 9, 2013 (now U.S. Pat. No. 9,017,123, issued Apr. 28, 2015), which is a continuation-in-part application of and claims the benefit of U.S. patent application Ser. No. 14/047,663, filed on Oct. 7, 2013 (now U.S. Pat. No. 9,010,261, issuing Apr. 21, 2015), which is a continuation-in-part of U.S. patent application Ser. No. 13/767,675, filed Feb. 14, 2013 (now U.S. Pat. No. 8,702,460, issued Apr. 22, 2014), which is a continuation application of and claims the benefit of priority from U.S. patent application Ser. No. 13/025,796 filed on Feb. 11, 2011 (now U.S. Pat. No. 8,403,718, issued Mar. 26, 2013), which claims priority from U.S. Provisional Patent Application Ser. No. 61/303,519, filed on Feb. 11, 2010, entitled "Method and System for a Towed Vessel Suitable for Transporting Liquids," the entire disclosures of which are hereby expressly incorporated herein by reference in their entireties.

This application is a continuation of U.S. patent application Ser. No. 15/187,051, filed Jun. 20, 2016 (now U.S. Pat. No. 9,950,773, issuing Apr. 24, 2018), which is a continuation-in-part and claims the benefit of priority from U.S. patent application Ser. No. 14/023,331, filed Sep. 10, 2013 (abandoned), which is a continuation-in-part application of and claims the benefit of priority from patent application Ser. No. 13/222,940, filed Aug. 31, 2011 (abandoned), which claims priority from U.S. Provisional Patent Application Ser. No. 61/378,811, filed Aug. 31, 2010, entitled "Method and System for Trading Water"; the entire disclosures of which are hereby expressly incorporated by reference in their entireties.

FIELD OF THE INVENTION

The present invention relates generally to a method and system for transporting fluent cargo through a liquid. More specifically, the invention relates to a towable container capable of housing a large volume of water/beverage and capable of being towed or otherwise conveyed through a larger body of water.

BACKGROUND OF THE INVENTION

As the world's population continues to increase, so does the demand for fresh water that is safe for consumption and the like. Despite many advances in water purification technology, many areas of the world are currently affected and will continue to be affected by a lack of this fundamental natural resource. Currently, many methods, such as reverse-osmosis, exist for the purification and desalination of water in order to produce potable and commercially appealing drinking products. Many of these processes suffer from the drawbacks of high production costs, resulting carbon emissions from the facilities in which they take place, and a significant level of waste water per volume of resulting potable water. As the demand for clean water increases, some methods have also been criticized for the strain they put on natural aquifers. In coastal regions with groundwater aquifers underlain by saline layers, concerns of saltwater encroachment exist where the over-burdening of freshwater aquifers creates a pressure differential that allows heavy concentrations of salt water to infiltrate the drinking supply.

Indeed, many areas in need of a reliable water supply do not have the availability of the resource itself to even reap the benefits of purification technologies. At the same time, however, a few specific regions of the Earth have abundant supplies of fresh, clean, and safe water which offer the potential to alleviate demands for water by utilizing the appropriate means for conveyance.

Devices and methods for transporting large volumes of water to distant regions of the Earth have proved costly and inefficient. For example, filtration, purification, and bottling of water for transportation and consumption have become a subject of scrutiny in recent years. In addition to the raw energy consumption required to produce clean water, it is estimated that at least twice the amount water is used in the production process than is actually bottled. In other words, one liter of bottled water may represent as much as three liters of water consumed. It has also been estimated that tens of millions of barrels of oil were required to generate the energy needed to produce the volume of bottled water consumed in the United States in 2007. Furthermore, the production and transportation costs of these methods are proving to be more and more taxing upon our planet's already strained natural resources.

Recent research has also revealed that one common method for transporting water and drinking liquids, containment via plastic bottles, poses a variety of health and environmental risks. It is estimated that approximately 70 million plastic bottles of water are consumed daily in the United States alone. In addition to the obvious strain that this puts on landfills and natural resources, many of these bottles may also contain Bisphenol ("BPA") which may pose health risks to humans. Even bottles that do not contain BPA pose the risk of leaching other chemicals into the contained water or fluid. While bottled water is not without its benefits, it is often desirable to reduce the amount of bottles used or the duration which water or liquid is stored in the bottles.

Accordingly, a long felt but unsolved need exists for a method and system that can be economically employed to contain and convey pure and safe drinking water from various regions of the Earth to those having a need or demand for the same.

Currently, many methods exist for the purification and desalination of water in order to produce potable and commercially appealing drinking products, such as reverse-osmosis. Many of these processes suffer from the drawbacks of high production costs, resulting carbon emissions from the facilities in which they take place, and a significant level of waste water per volume of resulting potable water. As the demand for clean water increases, these methods have also been criticized for the strain they put on natural aquifers. In coastal regions with groundwater aquifers underlain by saline layers, concerns of saltwater encroachment exist where the over-burdening of freshwater aquifers creates a pressure differential that allows heavy concentrations of salt water to infiltrate the drinking supply.

Purification and desalination of water to remove undesired contents such as harmful bacteria and heavy metals is typically an energy-intensive process. In addition to the raw energy consumption required to produce clean water, it is estimated that at least twice the amount of water is used in the production process than is actually bottled. In other words, one liter of bottled water represents three liters of water consumed. It has also been estimated that tens of millions of barrels of oil were required to generate the energy needed to produce the volume of bottled water consumed in the United States in 2007.

SUMMARY OF THE INVENTION

Devices for transporting a single large volume of water or liquid in and through the Earth's waterways have been contemplated. For example, U.S. Pat. No. 6,550,410 to Reimers, which is hereby incorporated by reference in its entirety, discloses a system and method for conveying fluids, where the system is adapted for towing by marine crafts in offshore conditions. Reimers further discloses a collapsible fluid container with an elongated shape, towing, and mooring means, as well as container retrieval, storage and deployment means. Reimers, however, does not teach various novel features of many of the embodiments of the present invention, including, but not limited to, locating means, rapid filling and/or emptying means, renewable energy means, locating and tracking means, and means for preserving the purity and integrity of fluids to be housed within.

Similarly, U.S. Pat. No. 7,500,442 to Schanz, which is hereby incorporated by reference in its entirety, discloses a submerged transport and storage system for liquids and solids. Schanz discloses a towable vessel with optional air and liquid storage bladders useful for adjusting buoyancy and allowing simultaneous transport of different solids and liquids. Schanz further discloses a cord-like connecting spine passing through the hull towing attachment ends to provide longitudinal reinforcement and prevent undesired distortion of the vessel during towing. Schanz, however, fails to teach a device that may be readily transported and/or stored when not in use and a device using renewable energy resources to transport the water vessel. Furthermore, Schanz also fails to teach a device with means for locating the towed vessel.

Canadian Patent No. CA 2,744,617 to Audet discloses a flexible fluid containment vessel and is incorporated by reference herein in its entirety. U.S. Patent Pub. No. 2013/0213897 to Jauncey discloses a towable bladder and is incorporated by reference herein in its entirety.

U.S. Pat. Nos. 6,047,655 and 6,330,865 to Cran, which are hereby incorporated by reference in their entireties, disclose a flexible barge. These references disclose a system comprising a flexible barge structure with a system of straps to prevent propagation of rips and to distribute concentrated tow forces over the flexible barge. Cran fails to teach several novel aspects of the present invention.

U.S. Patent Publication No. 2012/0024215 to Flockenhagen discloses a floating hollow body and is incorporated by reference herein in its entirety. U.S. Pat. No. 6,860,218 to Eagles discloses a flexible fluid containment vessel and is incorporated by reference herein in its entirety. U.S. Pat. No. 3,955,524 to Renoux discloses a flexible marine trailer and is incorporated by reference herein in its entirety.

U.S. Pat. No. 2,391,926 to Scott, which is hereby incorporated by reference in its entirety, discloses a non-rigid barge for transporting fluids and other materials by water. Scott also discloses an upper surface or deck of the barge equipped with radio controlled lights or other means for navigational purposes. Scott, however, fails to teach a device comprising means for rapid filling and emptying of fluids and other substances, signaling or other locating means outside of those for purely navigational purposes, means for filtering and/or preserving the integrity of liquids housed within, and means for storing and transporting the towed vessel when not in use.

Additionally, U.S. Pat. No. 6,293,217 to Savage et al., which is hereby incorporated by reference in its entirety, discloses an apparatus and method for transporting fluid cargo through liquid. Savage et al., discloses an apparatus consisting of one or more units in substantially linear alignment, wherein at least one of the units includes two or more non-internally reinforced containers coupled in a side-by-side manner. Savage et al., further discloses various close coupled configurations of a plurality of fluid containing units, but fails to teach various novel aspects of the present invention, such as means for signaling, identifying, and/or locating a lost fluid containing unit, means for rapid filling and/or emptying of a device, and means for preserving the integrity of water or other contents contained within the device.

U.S. Pat. No. 5,488,921 to Spragg, which is hereby incorporated by reference in its entirety, discloses a flexible fabric barge apparatus and method for transporting fluent cargos. More specifically, Spragg discloses a series of flexible fabric barges that are connected together in a string for towing and further include a fabric towing cone zipper connected to the lead barge. Spragg, however, fails to disclose various novel features of the present invention.

Applicant hereby incorporates by reference in their entireties U.S. Pat. No. 8,007,845 issued to Szydlowski on Aug. 30, 2011; U.S. patent application Ser. No. 14/023,331 to Szydlowski, filed on Sep. 10, 2013; U.S. patent application Ser. No. 13/222,940, filed Aug. 31, 2011; U.S. patent application Ser. No. 12/905,590, filed Oct. 15, 2010; U.S. Provisional Patent Application No. 61/251,912 to Szydlowski, filed on Oct. 15, 2009; PCT Patent Application Serial No. PCT/US12/48166, filed Jul. 25, 2012; and PCT Patent Application Serial No. PCT/US10/52864, filed Oct. 15, 2010.

It is an object of the present invention to provide an at least partially submersible, towed vessel capable of transporting volumes of fluent cargos, such as potable water, juice, wine, and/or various other fluids suitable for human use and consumption. The towable vessel may be a very large bag ("VLB"), preferably having one or more of the following characteristics: solar power and/or wind power capabilities integrally associated with the fluid containing vessel; a drone manipulated steering system; operatively associated fluid segregation systems; and buoyancy controls and/or air venting systems.

It is yet another object of the present invention to provide a device suitable for containing large volumes of fluent cargos that is further capable of being towed by various watercrafts.

It is yet another object of the present invention to provide a towed fluid containing vessel further comprising means to facilitate the rapid filling and emptying of fluids to be contained within. In one embodiment, the present invention comprises a plurality of ports through which a liquid and/or air/gas are conveyed to facilitate the rapid emptying and/or filling of such devices.

In one embodiment, after most of the water has been drained from the VLB, the VLB is towed back to its point of origin (or to another water source) with only a small amount of water remaining in the bag. Accordingly, the mostly-empty VLB is towed behind a vessel like a noodle because the mostly-empty VLB is slightly buoyant with only a small amount of water in the bag. In some embodiments, the VLB is not rolled up and put on a ship to ship it back to its point of origin because rolling up the VLB would damage the material of the bag. In additional embodiments, the substantially-empty bag may be attached to a buoyancy device for its return voyage.

It is yet another object of the present invention to provide a water-towed vessel further comprising means for signaling a physical position of the vessel. For example, means may be provided to signal to other vessels or individuals the presence and location of the vessel. In one embodiment, lighting means and beacons are disposed on a dorsal portion of a vessel to indicate the presence of the vessel to nearby persons and other vessels. Additional devices, such as nets, buoys, and gated systems, for example, may be deployed around a perimeter of the device to alert various individuals and vessels of the presence of the vessel and/or a vessel's sub-surface presence. U.S. Pat. No. 5,197,912 to Lengefeld discloses a buoy for attachment to the net line of a fishing net and is hereby incorporated by reference in its entirety. Devices disclosed in Lengefeld and those similar may be employed in various features and embodiments of the present invention. For example, a ring or net with marker buoys useful for keeping the ring/net afloat and simultaneously serving as a visual indicator may be employed.

Additionally, means may be provided in association with the vessel to convey information to users or devices at various locations throughout the world regarding the coordinates or relative position of the towed vessel, such as through global positioning systems ("GPS") and other similar devices. Thus, in one embodiment, the present invention comprises light-emitting devices for signaling a position of the device as well as at least one GPS transmitter for broadcasting/transmitting a location of the device.

In an alternative embodiment, devices of the present invention comprise at least one GPS transmission device, which is in communication with a network or database that is further accessible by various additional devices. Additional devices of the present invention may include, for example, computer terminals, handheld devices, and a variety of other devices capable of receiving GPS information. Thus, embodiments of the present invention may be tracked by any number of individuals or systems throughout the world.

It is yet another object of the present invention to provide means for ease of storage and/or transportation of the towed vessel when not in use for transporting fluent cargos. Such means may include, for example, the ability to fold, roll, or compress the present invention for ease of storage and/or transportation when towing is not desired or needed. In an alternative embodiment, the present invention comprises variable buoyancy control, which allows for the adjustment of buoyancy at one or more locations of the device. For example, when a device of the present invention is empty, one longitudinal end of the device may be deprived of buoyancy, while an opposing longitudinal end is allowed to remain buoyant, thus allowing the elongate shape to be positioned in a generally vertical position. In this manner, the device is capable of occupying less area at the surface of a body of water.

In another embodiment, the present invention comprises reinforcing straps secured to at least a portion of the device that are further adapted to accommodate and/or distribute stresses applied to the vessel while being towed. In one embodiment, the reinforcing straps are securely connected with a towing portion of the device and extend radially outward along at least a portion of the vessel's longitudinal length.

It is known that various regions of the Earth, which greatly desire and/or require water, for example, are generally devoid of the large-scale infrastructure that is often necessary to quickly extract the contents of a large vessel. Accordingly, embodiments of the present invention include various means for short or long-term off-shore storage. In one embodiment, the present invention is stationed in the proximity of an area in need of water or similar fluids (e.g., a disaster area) in an off-shore location via the use of mooring or substantially immovable objects. Contents of the device are then extracted from the device on an as-needed basis and conveyed to an on-shore location via smaller vessels or temporary conduits (e.g., PVC or similar piping).

In an alternative embodiment, the present invention is capable of selective communication with fixed on-shore infrastructure and devices capable of emptying and subsequently storing the entirety of the volume of a towed vessel. For example, conveying/emptying devices disclosed in U.S. Pat. No. 6,550,410 to Reimers, which is hereby incorporated by reference in its entirety, and those similar may be employed in various embodiments of the present invention.

It is yet another object of the present invention to provide means for filtering fluids to be contained within the device. Such filtering may comprise, for example, filtration upon entrance of the fluid into the vessel, filtration during transport of the fluid, and/or filtration of the fluid upon exit from the vessel. In one embodiment, indigenous (i.e., with respect to the fluids originating source) soils, sands, clays, etc. are provided within or in combination with filters at the entry and exit points of a towed device, thereby forcing water to be conveyed through a natural filter upon entrance and/or exit from a towed device. In one embodiment, disposable filters are provided which may be discarded and/or have filtration contents replaced after a certain number of filtration passes.

It is yet another aspect of the present invention to provide means for mooring, stabilizing, and/or parking devices of the present invention. For example, U.S. Patent Application Publication No. 2004/0157513 to Dyhrberg, which is hereby incorporated by reference in its entirety, discloses a mooring system for mooring a vessel to a floor portion of a body of water. These and similar devices may be incorporated into various embodiments described herein in order to accommodate, for example, issues related to dock or on-shore storage restrictions, weather and tidal conditions, unpredictable transit times, legal and insurance issues related to positioning a device on-shore or at a dock, and physical restrictions associated with shallow water ports. As used herein, a substantially immovable object refers to mooring devices (despite their general ability to drift or float within a certain radius) as well as more traditional fixed objects such as docks, land, anchored vessels, anchors, etc.

In an alternative embodiment, the present invention comprises the ability to be oriented in a substantially vertical position, either when in a filled or emptied state, due to a portion of the towed vessel being capable of decreasing its buoyancy by the intake of various materials. Such a device comprises a two-way valve that enables the selective control of the buoyancy of one longitudinal end of the vessel and thus provides for ease of storage and protection of the vessel and its contents.

In one embodiment, the rapid filling mechanisms may be gravity fed. In additional or alternative embodiments, the ports for filling and emptying the VLB may vary in size or the size may be changed by a user based on the amount of liquid needed from the VLB and the speed at which that liquid needs to be put into or taken out of the VLB.

In another embodiment, the invention comprises structures capable of stabilizing towed vessels in a generally vertical arrangement (e.g., for storage). For example, in one embodiment, a first end of a towed vessel is secured to a substantially immobile device and a second end of a towed vessel is secured to means adapted for altering the depth of the second end. In this embodiment, the second end of a substantially empty towed vessel may be selectively transmitted to a submerged position and the towed vessel oriented in a substantially vertical position. Embodiments of the present invention further allow for the vessel to be resurfaced by, for example, actuating the means adapted for altering the depth of the second end of the vessel. Means adapted for altering depth may be comprised of various known devices comprising at least one linear translation element. For example, worm gears adapted for use in translating associated nuts, pulley systems, hydraulic jack or elevator devices, rail actuators, and various other known devices may be incorporated into embodiments of the present invention. Thus, in one embodiment, the present invention comprises a towed vessel with an elongate shape, a first end adapted for communication with a mooring device that is free to translate within a given radius, and a second end adapted for communication with a linear translation device that selectively adjusts the depth of at least the second end of the vessel.

In one embodiment, water located at greater depths which is known to be of cooler temperature is allowed to cool a volume of fluid or air disposed within a submerged portion of the present invention, thus providing for additional vertical anchoring capabilities. Various selectively controlled valves are useful for further controlling buoyancy. For example, in one embodiment, once a towed vessel is oriented in a generally vertical position, colder/denser water proximal to a submerged location is drawn into at least a portion of the vessel, facilitating vertical storage of the device. User operated valves are further capable of being activated in order to dispel said colder/denser water when the vessel is to be repositioned generally parallel with a surface.

Those of skill in the art will recognize that oceanic thermoclines and haloclines may be taken advantage for the storage, convection, etc. of various embodiments of the present invention. In one embodiment, water or fluid disposed in a submerged portion of the vessel may be heated, thus inducing convection currents within a towed device and preserving integrity of the water. Density of water, which is defined as Mass/Volume ($g/cm^3$) may be accounted for, adjusted, and otherwise modified in various embodiments of the present invention. It is further known that seawater is denser than freshwater, thus facilitating the transport of a contained volume of freshwater through a denser body of salt water. As used herein, the term "fresh" with respect to water need not necessarily mean potable. Rather, it will be recognized that "fresh" is merely a term for the alternative to salt water.

One aspect of some embodiments of the present invention is directed to identifying surface currents, particularly along particular coasts, to determine those currents that are favorable to vessels transporting or towing bulk containers of non-salt water, preferably fresh water (whether or not contaminated). Vessels transporting bulk fresh water may include a combination of tankers, very large bags (hereinafter referred to as VLB's), and ships with shipping containers full of bags of water. As described herein, the combined usage of tugs, ships, and VLB's facilitates the long-felt but unsolved need of conveying non-salt water to regions of the globe in need thereof. Such a system and method, for example, can be employed to recharge the over-taxed aquifers of some Pacific islands until they are able to regain their sustainable hydrostatic pressure. Incorporated herein by reference are several patents directed to a variety of flexible containment vessels that provide written description and enablement support which, in view of the guidance provided herein directs one of skill in the art how best to make and use a vast array of embodiments: U.S. Pat. No. 7,775,171 to Tupil; U.S. Pat. No. 6,739,274 to Eagles, et al.; and U.S. Pat. No. 6,718,896 to Davenport.

It is one object of embodiments of the present invention to provide an economical way to transport water and other liquids. As such, a very large bag filled with liquid may be towed by a towing vessel. The VLB may comprise a bowhead snout, which is an attaching mechanism for towing, straps, and valves. Furthermore, the transport of the VLB must contemplate the cost of fuel to tow the VLB versus the speed/time of the delivery. In one embodiment, the VLB may be towed through the Humboldt current because the Humboldt current moves at approximately 3 mph and the VLB is most economically transported at approximately 2.5 to 4 knots.

The ocean currents, season, weather, storms, route, etc. are all relevant to the calculation of the most economical route to tow the VLB. In one embodiment, software to model the variables relevant to the price of towing the VLB may be use. The software may incorporate many factors to determine the most economical time, speed, and route to tow the VLB. For example, the software may receive information about a storm and change the route of the towable vessel to conserve fuel. Other cost reducing variables (such as the current price of fuel, weather, wind, wave size and direction, size of the towing vessel, size of the VLB, number of employees on the towing vessel, etc.) may also be included in the software algorithm. The software may also determine the most economical size and shape of the VLB depending on the currents, season, route, etc. The software may also take into account the wave drag and the form drag, i.e., the first harmonic and second harmonic. Thus, the software may calculate the drag due to friction on the bag—skin friction. Materials to reduce the friction of the bag may also be used in some embodiments. The software may also calculate and use the Reynolds number of the bag in the present flow (water, ocean) conditions to accurately model the VLB in the water.

The Beaufort scale gives wave heights based on the wind speed and the theoretical maximum wave height based on an unlimited fetch. Eight meters is a possibility if there are storms with wind speeds between 10 to 12 knots. However the wave heights can only build up so much because they quickly begin to crest and collapse upon themselves. The wavelength and wave period are also as important as the wave height. Big ships may suffer from hogging and sagging, which in the extreme case may break the vessel in half. Sagging is when the wave length is such that only the stern and bow are supported by the wave, and hogging is when only the middle is supported by the wave. The VLBs do not have this problem because flex is integral to their design and VLBs sit at the bottom of the wave trough. In some embodiments, the VLBs will fare better when positioned parallel to the wave swell. In other embodiments, the VLBs will fare better when positioned at an oblique angle relative to the wave swell. In further embodiments, the VLBs will fare better when positioned sideways relative to the wave swell. In some embodiments, the VLBs will operate best when positioned into the wind.

The VLB may include sensors to detect the integrity of the bag, stresses on the bag, the velocity of the bag, wave conditions, wave velocity, temperature, etc. These sensors may include strain gauges. For example, integrated sensors and a fiber-optic grid may monitor any deformations in the bag during the bag's voyage across the sea. All of this data may be input into the software to further calculate the most economical route presently or in the future. Further, these data points may affect whether the route of the bag is changed mid-course. Additionally, if the integrity of the bag is compromised, the VLB may have an emptying mechanism to quickly empty the bag in case of emergency. Sensors and software may also be used to calculate the current fuel consumption rate. Additionally, the sensors may calculate the yaw, roll, and pitch of the VLB. Ideally, the VLB will not yaw because this would increase drag and decrease efficiency.

The VLB may be towed at different speeds depending on whether it is being towed by a tug boat or an oil tanker. The software may take the towing boat type and characteristics into account when calculating efficiencies.

In one embodiment, the VLBs are towed by large ocean liners, oil tankers, or supertankers. These large ships may be 30-90 meters deep, and thus may be required to stay in deep waters. If this is the case, then small boats or tugs may travel from land to the VLB secured to the large ship to get water from the VLB. Then the small vessel may return to land with the water or other liquid from the VLB.

In some embodiments, the VLB may be shaped like the flexible containment vessels described in U.S. Pat. No. 7,775,171 to Tupil and U.S. Pat. No. 5,657,714 to Hsia et al., which are incorporated by reference herein in their entireties. In one embodiment, the VLB may have specifications similar to the flexible containment vessels described in Canadian Patent Application No. CA 2,744,617, which is incorporated by reference herein in its entirety. VLBs can be employed in a variety of water quality trading systems and methods such as those described in U.S. Pat. No. 7,062,406 to Patwarahan, which is incorporated herein by reference in its entirety.

Methods of trading water and setting a price for water may be included in the methods described herein. U.S. Patent Publication No. 2009/0055294 to Shirazi discloses an aqua index and is hereby incorporated by reference in its entirety.

It is important in many embodiments of the present invention to properly gauge the currents through which the ships may traverse so as to achieve desired efficiencies of energy use, avoid catastrophic episodes related to adverse ocean conditions, etc. For example, the present inventors have first appreciated that the traditionally mean currents of the Humboldt Current will not provide adequate, useful estimates of the surface currents for the transporting vessels. Thus, obtainment and use of computer model results that predict global surface currents forced by real time satellite sensed winds and sea level height anomalies, which are available in real time, provides a better estimate of the near surface current for the transporting vessels. In certain embodiments, the use of satellite-tracked drifter along a vessel's course is employed to provide valuable additional information of the current for a particular voyage. Specifically, the ability to track bodies and debris can be used to predict real time surface currents. Other situations may be considered when determining when and where to transport the VLB. For example, whale and shark migration may be considered so that the VLBs are not towed or transported through a migration because injury to the animals or to the VLB may occur.

In certain embodiments, data from satellite-tracked surface drifters deployed during 1980 to the present in the Pacific Ocean are employed in a high-tech version of the "message in a bottle." Using a surface buoy and a subsurface drogue (sea anchor), attached by a long, thin tether, the buoy measures location, temperature and other properties, and has a transmitter to send the data to passing satellites. The drogue dominates the total area of the instrument and is centered at a depth of 15 meters beneath the sea surface. The drifters are minimally affected by the wind and give direct estimates of the near-surface velocity. The velocity at the surface of the open ocean is nearly the same as the velocity at a depth of 15 m because there is normally a near surface mixed layer 10's of meters thick in the upper ocean. A real time estimate of surface currents is useful to ships transporting water, and is best accomplished by the use of direct observations and output from real-time computer models of the ocean. These modern computer models are similar to the models that have been developed to predict the weather. Real time satellite wind products using microwaves and real time ship observations and state of the art real time models of ocean circulation are thus employed to determine preferred routes of transport so as to avoid obstacles, conserve energy and to protect the delicate nature of VLB conveyance.

Yachts use sea anchors to assist the yachts in bad storms. In one embodiment, the VLB may be a sea anchor for other boats to use as an anchor and a stabilizer. Additionally, the VLB may act and be employed as a sea anchor for the tug or vessel towing the VLB because the VLB provides stabilization. Thus, the towing vessel will be safer in storms and bad weather conditions. In one embodiment, smaller VLBs may become a requirement for large ships to pull because the small VLB plays the role of a sea anchor by providing security to the towing vessel.

In one embodiment, 2 or more ocean buoys are used to anchor the VLB. An example of an ocean buoy is one found at www.diltancosultores.cl. The system may include 4-6 VLBs and 2 or more ocean buoys. The VLBs may be cycled through such that each VLB is on a 28-day cycle and each VLB is at a different stage of the cycle at any given time.

In one embodiment, the bag may be shipped to the water's destination with one side facing upward toward the sun and the bag may be returned to its original destination with the opposite side facing upward toward the sun. This would reduce UV damage to the bag and damage to the bottom side of the bag due to the bottom side being submerged in salt water.

In certain embodiments, a plot is produced in real time and sent to a vessel prior to departure or conveyed to a vessel at sea. In one embodiment, a five-day average current is the highest frequency output from the model, but consecutive five-day segments can overlap. A color bar showing color contours can be presented to represent the surface current speed with arrows and arrow lengths employed to represent the direction and speed. Sea surface height reflects the distribution of pressure in the ocean and the pressure gradients drive the ocean currents similar to how atmospheric pressure gradients drive the wind. Examples of such data can be obtained from the Ocean Surface Currents Analyses-Real Time (OSCAR) database at the National Oceanic and Atmospheric Administration (NOAA).

One of the defining characteristics of living organisms is their inherent ability to repair physical damage. A growing trend in biomimicry is the creation of non-living structural materials that also have the capacity to heal themselves when cut, torn or cracked. Self-healing materials which can repair damage without external human intervention could give manufactured goods longer lifetimes and reduce the demand for raw materials, as well as improving the inherent safety of materials used in construction or to form the bodies of aircraft.

In some embodiments, the bag may be composed of a self-healing material. One of the defining characteristics of living organisms is their inherent ability to repair physical damage. A growing trend in biomimicry is the creation of non-living structural materials that also have the capacity to heal themselves when cut, torn or cracked. Self-healing materials that can repair damage without external human intervention may give manufactured goods longer lifetimes and reduce the demand for raw materials, as well as improving the inherent safety of materials. Thus, a bag composed of a self-healing material can reduce leakage, water loss, and contamination.

In various embodiments, liners of the present invention comprise a water-resistant, elastomer-coated mesh material, such mesh material being constructed of polymeric material having some inherent elasticity, such as polyester or nylon. A warp knit mesh construction is preferred in certain embodiments. The mesh material also may be steel mesh, preferably hexagonal netting of drawn steel wire or similar high modulus material, such as extended-chain crystallized polymer. In one embodiment, the bag is manufactured of a fabric structure (a plurality of separately formed layers bound together) for a flexible fluid containment vessel similar to the fabric structure described in U.S. Pat. No. 6,718,896 to Davenport, which is incorporated by reference herein in its entirety. In other embodiments, the bag is fabricated out of spirally wound strips of fabric having beam stabilizers, beam separators, and reinforcing similar to the fabric structure described in U.S. Pat. No. 6,675,734 to Eagles et al. and U.S. Pat. No. 6,860,218 to Eagles et al., which are incorporated by reference herein in their entireties. In alternate embodiments, the bag is fabricated out of fabrics and materials similar to those described in U.S. Pat. No. 6,739,274 to Eagles et al., U.S. Pat. No. 6,832,571 to Eagles, U.S. Pat. No. 7,024,748 to Eagles, U.S. Pat. No. 7,107,921 to Davis et al., U.S. Pat. No. 7,308,862 to Romanski et al., and U.S. Pat. No. 7,775,171 to Tupil, which are all incorporated by reference herein in their entireties.

In various embodiments, the base fabric is provided with an elastomeric coating for the purposes of providing waterproofing as well as protecting the material of construction from ultraviolet degradation and marine growth. In some embodiments, the bags may need to be composed of a material that is UV, rot, microbial, and mold resistant.

In various embodiments, the bag is not a body of revolution or, in particular, tubular. In various embodiments, the top and bottom surfaces are indistinguishable and the bag or liner may be periodically turned over to equalize damage due to sun, weather, mold, aging, etc.

Organic electronics—a type of printed electronics—may be used in some embodiments to coat a wide range of surfaces. Organic electronics is the use of organic materials such as polymers to create electronic circuits and devices. In contrast to traditional (silicon-based) semiconductors that are fabricated with expensive photolithographic techniques, organic electronics can be printed using low-cost, scalable processes such as ink jet printing, making them extremely cheap compared with traditional electronics devices, both in terms of the cost per device and the capital equipment required to produce them. While organic electronics are currently unlikely to compete with silicon in terms of speed and density, they have the potential to provide a significant edge in cost and versatility. The cost implications of printed mass-produced solar photovoltaic collectors, for example, could accelerate the transition to renewable energy.

Water scarcity is a worsening ecological problem in many parts of the world due to competing demands from agriculture, cities and other human uses. Where freshwater systems are over-used or exhausted, desalination from the sea offers near-unlimited water but a considerable use of energy—usually from fossil fuels—to drive evaporation or reverse-osmosis systems. Emerging technologies offer the potential for significantly higher energy efficiency in desalination or purification of wastewater, potentially reducing energy consumption by 50% or more. Techniques such as forward-osmosis can additionally improve efficiency by utilizing low-grade heat from thermal power production or renewable heat produced by solar-thermal geothermal installations.

Long-promised technologies for the capture and underground sequestration of carbon dioxide have yet to be proven commercially viable, even at the scale of a single large power station. New technologies that convert the unwanted carbon dioxide ($CO_2$) into saleable goods can potentially address both the economic and energetic shortcomings of conventional CCS strategies. One of the most promising approaches uses biologically engineered photosynthetic bacteria to turn waste $CO_2$ into liquid fuels or chemicals, in low-cost, modular solar converter systems. In some embodiments, these systems are employed on a transport vehicle such that the bags contain photosynthetic bacteria able to convert waste $CO_2$ from the vehicle's engine to supply lower carbon fuels to the vehicle's engines. Thus, the $CO_2$ sequestration system may be a closed loop system on the vehicle to reduce the amount of fuel needed for the journey and to reduce the environmentally harmful impact of traveling long distances.

It is yet another aspect of the present invention to provide a towed device that is capable of being transported in series with additional towed devices. Thus, in one embodiment, a towed device comprises the ability to be placed in secure communication with one or more additional towed devices, thereby providing the ability to increase the total volume of a fluid to be transported. In one embodiment, the present invention comprises tracking abilities, such as those described in European Patent No. EP 1,723,021 to Hendrickson et al., which discloses a Rail Car Tracking System and is hereby incorporated by reference in its entirety. Although Hendrickson relates generally to the field of rail transportation, those of skill in the art will recognize that various embodiments as described therein may be applicable to and useful for tracking water-towed vessels of the present invention, whether towed in consists/trains, or towed individually. Tag readers for use in the present invention may be disposed on, for example, docks, buoys, vessels, aircraft, etc. and may be capable of reading information from water-towed vessels related to physical position, contents, temperature (internal or external to the towed vessel, velocity, and other pertinent information).

In one embodiment of the present invention, water is transported in a large water bag. Such bags are made of a suitable material, such as plastic, rubber, nylon, combinations thereof, and the like, and can vary in size depending on the amount of water being transported. Such bags have the advantage of not altering the quantity or characteristic of the water contained therein. To transfer water using such devices, the bags are filled with the water to be transported, sealed and then transferred to the final destination. Any method of moving such bags can be employed. A particularly useful method is to tow such bags through the ocean using ships, barges, tankers, and the like. In one embodiment, unmanned, GPS-guided, boats tow the bags. Other space-based and terrestrial guidance systems may also be used to guide vessels towing such bags. In some embodiments, the vessels operate autonomously. In still other embodiments, the vessels operate autonomously but can receive updated commands and instructions from remotely located operators. Such transport mechanisms would reduce the cost associated with a crew.

It is known that when pliable vessels are used to tow or transport volumes of water, wave propagation through the body of water and/or stored volume of water can present undesirable complications. Accordingly, various embodiments of the present invention comprise wave damping features adapted to reduce such effects. For example, various devices and features described in U.S. Pat. No. 7,686,539 to Aristaghes, which is incorporated by reference herein, may be utilized with features of the present invention. For example, wave dampening structures may be disposed within water containing vessels and/or positioned around water containing vessels of the present invention.

In various embodiments, devices of the present invention comprise the ability to convert and/or utilize energy from naturally occurring resources such as solar, wind, wave, and thermal resources. In various embodiments, energy captured and/or converted from these sources may be used for various on-board functions, such as propulsion, heating, and various purification techniques. U.S. Patent Application Publication No. 2013/0217822 to Hopper discloses power generation by changing density of a fluid and is incorporated by reference herein in its entirety.

In one embodiment, a vessel comprises photovoltaic arrays adapted for converting solar energy into forms of energy that may be used throughout the device and/or system. In some embodiments, the solar arrays may have mechanisms to lift the arrays above the VLB and orient the solar arrays and/or photovoltaic film in different directions depending on the direction of the sun. For example, solar energy may be captured, concentrated, and/or converted in a manner that allows for heating of a submerged volume of water (i.e., via thermal energy, electrical energy, or various combinations thereof) and the subsequent creation of convection currents throughout the system. The energy from the photovoltaic arrays may also be used to power the vessel or the vessel's navigating systems. Unlike the big, bulky, rigid solar panel units of U.S. Pat. No. 4,233,085 to Roderick et al., which is incorporated by reference herein in its entirety, the photovoltaic arrays should be lightweight and take up a minimal amount of space. Additionally, the solar energy collectors may track the movement of the sun along at least one axis and have a plurality of reflector panels similar to the solar energy collectors described in U.S. Pat. No. 7,932,461 to Johnson et al., which is incorporated by reference herein in its entirety. In one embodiment, the solar energy may be used to power GPS, navigation, or other tracking systems on the VLB.

Solar energy may also be captured, concentrated, and/or converted in a manner that allows for purifying, filtering, and/or treating the water in the VLBs. Additionally, water may be treated on the tug or other towing vessel using energy from solar energy and piped into the VLB while it is being towed or while it is stationary, such as when the VLB is acting as a water island. Furthermore, a tugboat may use a VLB or water island with solar cells or a windmill as a charging station. More specifically, the tug may come to the water island (e.g., a stationary VLB) to get water from the water island and may charge its batteries at the same time, much like a charging station to an electric car. Thus, the tug will get both water and energy from the water island and will use the energy to take the water to destinations needing water.

Most tugs are diesel-electric powered. Thus, having photovoltaic solar cells on the VLB to collect solar power would help power the tug or other towing vessel. In some embodiments, the solar cells may even fully power the VLBs. The solar cells may also power mini/small electric motors that can help steer the VLB en route, at a sea anchor, and/or entering and exiting ports using computer controls, either on-board or remotely. The solar cells may also provide power to all of the needed sensors, pumps to empty the VLB, and transmitting devices to transmit in real time any and all information regarding the water quality, temperature, etc.

In various embodiments, a water purification system may be on board the towing vessel such that the water in the VLB—which may be in multiple bags within the VLB or in bags in shipping containers on the towing vessel—is purified while in route to its destination. In one embodiment, electricity produced from solar cells, solar films, and/or photovoltaic arrays on the VLB is used to run the purification systems. Additionally, some bags on the vessel or within the VLB may be empty while others are initially full of dirty or non-potable water. The dirty or non-potable water may be filtered and purified while on the ship and the clean/purified water may then be put into clean bags or into the VLB. Because the bags may be compacted and compressed, bringing additional bags on-board would not require a significant amount of space. Thus, some bags could be used for clean water and other bags could be used for dirty water and the bags could be reused as such.

Various methods may be employed to fully treat or partially treat the water in the VLB and/or other transported water as it is entering the VLB, sitting in the VLB, or as it is removed from the VLB and/or smaller transport bladders. One such method for partially treated the water is ozonation. Ozonation has been found to be a safe and effective disinfectant method and system to treat water. Ozone can be spayed into the bag or bladders before the bags are filled. Ozone can also be used as an in-line treatment of loading and/or unloading water. This in-line method can comprise injecting ozone into a line of water loading into a VLB prior to charging the water into the VLB; charging the ozone injected water into the bags; and adjusting a rate of injection of the ozone into the water and adjusting the rate of water loading into the vessel to provide a target biokill of species within the water. In-line ozonation is said to be more efficient and more economical than in-tank treatment. By way of example and in further support of the present disclosure, U.S. Pat. No. 6,869,540 to Robinson and U.S. Pat. No. 6,125,778 to Rodden are incorporated herein by reference in their entireties.

In one embodiment, a treatment system to treat the water using a membrane treatment unit to separate out microorganisms is employed. Such a system is described in U.S. Pat. No. 7,900,780 to Ueki and U.S. Patent Application Publication No. 2007/0246424 to Hironari, which by way of example and in further support of the present disclosure, are incorporated herein by reference in their entireties. Another treatment system is described in WO 2013/040521 to Hannemann, which is incorporated by reference herein in its entirety.

Other embodiments employ one or more of a UV system for disinfecting water (WO 02/074,692); chlorine dioxide (WO 02/44089) or pesticides (EP 1,006,084 and EP 1,447,384); at least one filter unit, at least one disinfection unit, and a detection unit (U.S. Patent Application Publication No. 2010/0116647); the infusion of combustion gases into the ballast water to kill harmful microorganisms and bacteria (U.S. Patent Application Publication No. 2011/0132849); as well as various other systems such as those found in U.S. Patent Application Publication No. 2010/0116647 to Kornmuller, U.S. Patent Application Publication No. 2011/0132849 to Husain, WIPO Patent Application Publication No. 02/074,692 to Brodie, WIPO Patent Application Publication No. 02/44089 to Perlich, European Patent Application Publication No. 1,006,084 to Fuchs, and European Patent Application Publication No. 1,447,384 to Hamann, all of which are incorporated herein by reference in their entireties.

A mobile water treatment apparatus that includes a filtration system, a motor, a fluid storage container, and a fluid delivery pump may be used in some embodiments to treat the water onboard the tug or towing vessel and/or in an associated water treatment barge at or near the destination port. By way of example and in further support of the present disclosure, U.S. Patent Application Publication No. 2011/0089123 to Kennedy is incorporated herein by reference in its entirety. The present system in one embodiment provides such conditions for oily, pretreated water. By way of example and in further support of the present disclosure, U.S. Patent Application Publication No. 2010/0272630 to Rosenbaum is incorporated herein by reference in its entirety.

In various embodiments, devices for towing water of the present invention comprise energy conversion means such as solar arrays for powering various devices. Devices of the present invention comprise towable bags or bladders with a surface of up to 60,000 square meters. As it is known that the power density of the sun's radiation on the surface of the earth is approximately 1.4 kW/m2, devices of the present invention are impacted by incredibly large amounts of energy. As such, it is contemplated that embodiments of devices of the present invention may comprise features for harnessing this energy, as well as additional sources of energy such as wind and wave action, to power various on-board features.

Wind energy may also be used in some embodiments through the use of projectable wings and/or sails and/or a variety of wind power and/or tidal power systems, heretofore never employed in association with a VLB during transport of water therein. In further embodiments, hydrogen power may be built in to the VLB itself because hydrogen can be generated via disassociation of water via the power generating systems described herein.

In various embodiments, devices of the present invention comprise the ability to convert and/or utilize energy available not only from the solar and wind, but also from other naturally occurring resources, such as wave and thermal resources. For example, a device for receiving a portion of an ocean wave and converting that energy into useable energy may be employed, such as the device described in U.S. Pat. No. 7,755,211 to Montgomery, which is incorporated by reference herein in its entirety. In various embodiments, energy captured and/or converted from these sources may be used for various functions on-board the towing vessel or on-board the VLB, such as propulsion, navigation, cooling, heating, and various purification techniques.

In various embodiments, bags of the present invention are provided with dispersion means for repelling various creatures such as birds, seals, sea lions, whales, mermaids, mussels, mollusks, octopi, and various other marine and avian creatures. Various creatures and sea life can produce serious detriment to bags and/or to ecosystems to which they may be transported in the event that they use the bag as a "host." Accordingly, in order to solve the long-felt need of repelling such life forms from towed bags, the present invention provides electrically powered means for dispersing such creatures. Such electrically powered means may be powered by various on-board energy devices as discussed herein or may derive power from elsewhere, such as an attached vessel. In one embodiment, features are provided along a surface of the bag to repel various creatures. For example, in one embodiment, a plurality of sprinklers is provided to prevent fowl from congregating on a bag and compromising the hygiene of the same. In another embodiment, flashing or strobe lights are provide to prevent unwanted creatures from inhabiting devices of the present invention.

Another aspect of the present embodiment also includes loading tankers with water through very large bags of water. These bags of water may be brought to where the tanker has unloaded its cargo. Alternatively, these "water islands" can be positioned at various predetermined locations and after a tanker has delivered its cargo, it can then travel to one or more water islands to then take water on-board and then continue to a destination where such water is desired. The water may also be loaded through buoys or filled by lighters, which are smaller tankers. These loading techniques significantly reduce the cost of loading the water because it minimizes the large tankers' travel. For example, U.S. Pat. Nos. 7,841,289 and 7,500,442 to Schanz, which are hereby incorporated by reference in its entirety, discloses water transporter and storage systems for liquids, such as water, by means of a very large bag-like structure. In various aspects of the present invention, methods and systems employ a lightweight towed submerged water transporter and storage system for liquids, which employs a streamlined towable hull with optional air and liquid storage bladders used not only to adjust buoyancy, but to allow the simultaneous transport and storage of different solids and liquids.

Certain embodiments incorporate glow-in-the-dark features to the VLB to enhance detection of such bags by neighboring vessels. In some embodiments, lighting components are provided on the VLBs themselves to illuminate outlines, features, etc. of the VLB at night, thus providing for safety through the avoidance of seafaring collisions. In some embodiments, tritium, radium, or any other radioluminescent material can be used to mark the very large bag-like structure or mark lines on the bag. This "permanent" illumination is beneficial in low light conditions and requires no additional electrical energy, which may be an important feature in emergency situations. Additionally, fluorescence, phosphorescence, photoluminescence, or chemiluminescence technologies may be used to illuminate the bag or lines or words on the towable vessel without the use of electrical energy.

In one embodiment, parts of the bag may comprise color stabilizer comprising a UV absorber or a light stabilizer. The UV absorber comprises triazines, benzoxazinones, benzotriazoles, benzophenones, benzoates, formamidines, cinnamates/propenoates, aromatic propanediones, benzimidazoles, cycloaliphatic ketones, formanilides, cyanoacrylates, benzopyranones, and mixtures thereof. The UV absorber is preferably present in an amount between about 0.1 weight percent and about 6.0 weight percent and more preferably, in an amount between about 1.0 weight % to about 5.0 weight %. Most preferably, the UV absorber is present in an amount between about 3.0 weight % and about 5.0 weight %. U.S. Pat. No. 8,529,376 to Morgan is incorporated by reference herein in its entirety.

In some embodiments, the bag may also include a light emitting diode(s) ("LED") or other light source to illuminate the bag.

In some embodiments, large bags are filled with water at the location of the water source to preserve the purity or other characteristics of the water. As used herein, the terms "water bag," "bag," and "bladder" may be used interchangeably. In one embodiment, the water is not filtered or purified before being put into the bags. In other embodiments, the water is purified and/or filtered at the water source (including glaciers) or at some point before it is put into the bag. In yet other embodiments, the water is bagged at the source and is filtered and/or purified at a later point in the process, if the water needs to be filtered or purified (i.e., if the buyer's needs require additional filtration or purification).

In one embodiment of the present invention, the characteristic possessed by the water is the presence of extraterrestrial-derived components. Such components include, but are not limited to, molecules such as amino acids and other organic molecule, that are derived from comets, asteroids, and the like. One example of such a component is glycine, a basic component of proteins. While the details of the potential health benefits of such components have yet to be evaluated, there exists a viable market for unadulterated drinking water, which could reasonably be calculated to contain glycine and primordial building blocks of life. In addition to the commercially appealing aspects of consuming the origins of life itself, glycine is known to produce a sweet taste for humans.

In various embodiments of the present invention, the water is sequestered in a form suitable for long-term storage that does not affect the unique characteristics of the water. In one embodiment, the water is sequestered as ice. In a particular embodiment, the water is sequestered as glacial ice. In yet another embodiment, the water is sequestered in a polar ice cap. Various combinations of such sequestration means are also included in some embodiments of the present invention.

In some embodiments, the bag is put into the ocean, lake, river, etc. and then is filled with water or another liquid once the bag is in the water. In one embodiment, the bag is filled at the primary source of water. For example, the bag may be filled at a glacier. Thus, the water will be sourced directly from the catchment points of streams and rivers fed from glacier water melt, but the water may not be exclusively from the catchment points. In another embodiment the bag is filled with reserved water from the source at an intermediate port. In this embodiment, the VLB may be filled after the VLB are in the ocean, lake, river, etc. When mechanisms are available to load a VLB full of water or other liquid into the ocean or port, then the bag may be filled before it is in the water. Other embodiments may partially fill the bag with water before the bag is placed into the ocean, river, etc.

In various embodiments, the type, number, configuration, and system of valves; pumps; inlets; and outlets on the VLB—for emptying and filling—may vary. In one embodiment, at least one 2 inch or a 3 inch valve is used. In some embodiments a ball valve may be used to fill and drain the bag. Typically, the valves are metal or plastic, but valves of other materials may be used. A variety of bulkhead configurations may be employed to best accommodate the water being shipped. In one embodiment, a valve is placed on the top, rear side of the bag. The valve may stick out of the side of the bag or may be disposed within the bag. Further, the valves may be located on the outside of the bag in some applications and pushed into the bag for shipping and transportation. In another embodiment, the bags may be filled with water by using a product inlet entry point at the base of the bag located proximate to the shipping container door. The top of the bag may also have vents to allow for the displacement of air while the bag is being filled.

The valve may be used to fill and drain the water into and out of the bag. Other embodiments may locate the valve at different locations on the bag. Additional embodiments may include more than one valve. Some valves may be used only for filling the bag while other valves may be used to drain the bag. In one embodiment, a drain comprising a tube with perforations laid across the bottom of the bag (e.g., a French drain) is used to drain the water out of the bag. In other embodiments, if the valve is higher than the bottom of the bag, then a pump or impeller may be used to pump the water up to the valve.

In some embodiments, the inlet for filling the bag also serves as the outlet to drain the bag. Thus, the vents may allow for the intake of air while the bag is draining the water. Typically, the water outlets are gravity-fed so that a pump is not needed to discharge the water in the bag. The bags may be rolled to unload most of the water. In one embodiment, a pump may be used to pump water out of the bag. Specifically, pumps may be used for longer runs (i.e., tubing or pipes) or where the water needs to be moved uphill.

In various embodiments, the water bag may have one or more of the standard fitting options: a 2 inch (50 mm) male camlock with ball valve and dust cap (one piece construction); 3 inch (75 mm) male camlock with ball valve and dust cap (two piece construction); top fill and decant; top fill and bottom decant; and bottom fill and bottom decant.

The water bags may be supplied with a centrally located pressure relief valve to meet any OH&S standard around the world regarding the issue of having personnel in a confined space, especially once the water bag is full and ready for shipment.

In one embodiment, a channel welding system may be employed that allows the quality of each weld to be inspected before the next is started, ensuring the highest standards of quality are met with each bladder.

Various methods may be employed to empty the bags or VLB of water. Such methods are described in U.S. Pat. No. 6,615,759 to Yaffe, U.S. Pat. No. 8,322,294 to Bowhay, and U.S. Pat. No. 6,923,135 to Kranebitter, which are incorporated by reference herein in their entireties.

In some embodiments, the VLBs are reusable and thus in some distribution schemes the VLBs can be used for more than one filling cycle. The bags may also be recycled after they can no longer be filled and transported. Thus, in one embodiment, once a bag is no longer useable to transport water, the bag may be recycled and used to make water bottles. Specifically, portions of the bags that are HDPE or other recyclable plastic can be used in plastic bottles for water.

The bags may be foldable such that they can be folded and shipped back to the water source for refilling. Alternatively, the bags may be broken down into component materials for recycling depending upon the distribution scheme and distance from the water filling source.

In one embodiment of the present invention, the ice itself may be transported to an agreed upon location. In such embodiment, ice in the required volume and having the desired characteristics, would be removed from the glacier or ice cap, and transported directly to the agreed upon location. Transport of such ice could be achieved in several ways. For example, the ice could be allowed to melt during transport such that upon arrival, it is in a liquid form and ready for consumption. Alternatively, the ice could be kept frozen such that it arrives at its final destination in its original form. Such transportation can be achieved using technology known to those in the refrigeration arts.

In one embodiment of the present invention, the water is transported to a different geographical location than where it is sequestered, without affecting the characteristics of the water. In one embodiment, the water is transported at least 10 miles, at least 250 miles, at least 500 miles, at least 1000 miles, or at least 10,000 miles, from the location where it is sequestered. Such distances can also be measured using kilometers, nautical miles, and the like.

It is another aspect of one embodiment of the present invention to provide a method of scheduling the shipping, storing, and delivery of water in VLBs. In one embodiment, the bags are towed by ships that are not completely full, and, thus, the shipping price is reduced because it does not take much extra fuel or power to tow the VLB (i.e., the Expedia model of shipping water: ship when there is room and a discount). The water can be stored before and after it is shipped such that the time of the shipment either does not depend on the purchase date or only slightly depends on the water purchase date. Additionally, models could be used predict when and where will need water and VLB can be shipped to these locations before these locations actually purchase the water and the water can be stored in the VLB similar to a water island (i.e., war zones, the Middle East in the summer, hurricane season in the Caribbean and southeastern United States, the deserts of Chile in the summer, etc.). In one embodiment, the water is shipped in the VLBs to certain locations when the currents favor shipping to that location, i.e., travel with the current to reduce fuel costs and thus shipping costs. In other embodiments, the timing of the shipping is dependent upon the urgency of the water delivery. If the buyer needs the water quickly, then the water will be shipped right away and the cost of shipping may be increased.

Yet another aspect of embodiments of the present invention is to provide a method of scheduling the shipping, storing, and delivery of the water on boats of different types. Thus, shipping routes traditionally used by container ships may tow the VLB. Alternatively, shipping routes traditionally used by bulk carriers or oil tankers may tow the VLB. The water source location and the water destination location will likely affect the type of boat/ship used to transport the water. A comprehensive map of global shipping routes may be used to determine the best route and type of boat. For example, the map developed by Pablo Kaluza, Andrea Koelzsch, Michael T. Gastner, and Bernard Blasius and printed in the Journal of Royal Society may be used, and is incorporated by reference herein in its entirety.

In various embodiments, organic thin-film solar cells are provided in combination with a vessel for holding and/or towing water. In one embodiment, organic thin-film solar cells for converting solar energy into forms of energy that may be used throughout the transport vehicle, bags of water, and/or system are provided in combination with a bag for holding and/or towing water. "Transport vehicle" as used herein refers to any vehicle for transporting items, e.g., ships, boats, trains, cars, trucks, semis/tractor trailers, planes, etc. Examples of thin-film solar cells are provided in U.S. Patent Application Publication No. 2012/0248878 to Iwanaga, the entire disclosure of which is hereby incorporated by reference. Thin-film solar cells, or photovoltaics, are very light-weight and can be integrated into various materials. In some embodiments, light, flexible, thin-film organic solar cells are applied to surfaces of the vessel and/or bags holding water. U.S. Patent Application Publication No. 2012/0312364 to Uhrich et al. describes an organic solar cell and is hereby incorporated by reference in its entirety. Organic solar cells can be very thin and thus require little material and energy to produce, thereby reducing their environmental impact. However, any type of solar energy conversion means currently known or later invented may be used. For example, photovoltaic energy technology such as that disclosed in U.S. Patent App. Pub. Nos. 2013/0026978, 2012/0223583, and 2008/0196581 to Cooly and U.S. Patent App. Pub. Nos. 2010/0015325 and 2005/0284361 to Muis, which are incorporated by reference herein in their entireties, may be used with embodiments of the present invention.

Furthermore, known methods and systems for mounting the photovoltaic material on the shipping containers or bags of water may be employed, such as those described in U.S. Pat. No. 7,365,266 to Heckeroth, which is incorporated by reference herein in its entirety. Organic solar cells may also be used to coat a wide range of surfaces, including windows that transmit light while generating electricity. One skilled in the art will recognize many benefits of using organic solar cells in embodiments of the current invention. For example, the ship or transport vehicles would be more efficient by reducing dead-weight as fuel storage requirements and other energy production requirements are reduced by use of electricity generating films applied to structural surfaces. For example, the ship or transport vehicles would be more efficient by reducing the dead-weight of stored fuel because the solar cells on the bags or shipping containers may generate some of the shipping vehicle's electricity. Other energy production requirements (e.g., electricity for the crew, such as lighting, power, air conditioning, heating, water heaters, etc., electricity for the communication systems, GPS, radar, sonar, etc.) are also reduced by use of electricity generating films applied to the bags' surfaces and structural surfaces of the containers. Electricity produced from solar energy may be used for any purpose on the transport vehicle, for example to run lighting, air conditioners, heaters, etc., to purify water for sailors' use, to power the ship's engines, to power GPS or sonar equipment, etc. In some embodiments, the towable bags provide solar power, and have detectors to detect deviations in the cargo (e.g., temperature, leaks, etc.) or surrounding conditions (e.g., weather, GPS location, sun direction and intensity, etc.) similar to the smart containers described in U.S. Pat. No. 7,002,472 to Stratmoen et al., which is incorporated by reference herein in its entirety.

Using thin film solar cells on the bags reduces the need for large, bulky, heavy solar panels and solar panel support structures. Thus, the film solar cells save space and weight on board the towable bag.

Additionally, barrier films are contemplated for coating and protecting portions of bags in accordance with the present disclosure. Examples of such barrier films include, but are not limited to backing films with inorganic barriers, such as those disclosed in U.S. Patent Application Publication No. 2011/0303277 to Neumann, the entire disclosure of which is hereby incorporated by reference in its entirety. For example, it is contemplated that a bag or water container of the present disclosure further comprises a barrier foil, comprising: a weathering-resistant protective layer and a backing layer comprising a barrier layer, wherein the protective layer is weathering-resistant, and wherein the barrier layer, comprising at least one inorganic oxide, improves a barrier effect with respect to water vapor and oxygen.

Various embodiments of the present invention contemplate the use of computer-controlled, wind-powered sailing ships to increase fuel efficiency and/or increase velocity of a ship or towed bag of liquid. Such features are provided on at least one of a towed-bag and a cargo ship. The rigging is operated from the bridge by remote control, and there is thus little need for additional crew or skill aboard the vessel. It is further contemplated that the sails are also provided with solar panels. The use of sails and/or photovoltaic solar cells reduces the amount of fuel used by the ship or vessel towing the VLB because energy from the sails and/or solar cells may be used to power the towing vessel. Additionally or alternatively, the energy produced by the sails and/or solar cells may be used to power engines on or secured to the VLB such that the towing vessel only guides the VLB and the VLB uses the solar or wind energy to move itself through the water. The addition of solar cells and/or sails may reduce the fuel consumption of the towing vessel by up to 100% in some conditions and up to 80% in other situations.

U.S. Pat. No. 5,131,341 to Newman, the entire disclosure of which is hereby incorporated by reference in its entirety, discloses a solar powered electric ship system. Newman discloses, for example, photovoltaic solar module array electrical arrangements on sails. Such features may be provided in combination which additional features of the present disclosure. In one embodiment, for example, one or more sail sheets are provided to aid in the propulsion of a cargo ship, tug boat, and/or bags. Similarly, U.S. Pat. No. 6,194,790 to Griffin et al., which is hereby incorporated by reference in its entirety, discloses a solar sail power generation that is suitable for use in various embodiments of the present disclosure.

It is known that raised sails and masts generally provide additional resistance when a ship is under engine or diesel power alone. It is further known that the heights of such features pose various complications for passing ships under bridges and similar infrastructure. Accordingly, the present invention contemplates computer-controlled sail features wherein at least one of sails and masts are regulated based on wind speed and direction. Such features are deployed and retracted as needed, based on environmental conditions, user-preferences, and various similar needs.

The following references, related to transporting watercraft with the aid of sails or sail-like features, are hereby incorporated by reference in their entireties: U.S. Pat. No. 7,798,083 to Wrage, U.S. Pat. No. 7,287,481 to Wrage et al., U.S. Pat. No. 8,117,977 to Reusch, U.S. Pat. No. 7,971,545 to Wrage, U.S. Pat. No. 7,672,761 to Wrage et al., U.S. Pat. No. 8,056,490 to Wrage, U.S. Pat. No. 8,215,588 to Wrage et al., U.S. Pat. No. 7,866,271 to Wrage et al., U.S. Pat. No. 7,546,813 to Wrage, and U.S. Pat. No. 7,504,741 to Wrage et al. In some embodiments, one or more freely flying kite-like elements are connected to the towed-bag or ship by a cable or hawser to provide extra propulsion. These kite-like elements can incorporate solar power generation layers or structures. The kite-like structures take advantage of higher wind speeds at greater altitude compared to wind speeds at the surface of the ocean. The kite-like elements can be raised or lowered to take advantage of suitable winds. In some instances, winds at altitude may be in a more favorable direction than surface winds, allowing the kite-like structures to pull the ship or towed-bag on a more efficient course than traditional sails. The kite-like elements further can also be used to stabilize the ship or towed-bag by reducing vessel movements. The kite-like elements can be controlled by an automated element with wind and weather sensors as well as accelerometers, there-by reducing crew requirements.

In one embodiment, natural sources of energy are harnessed to power various functions such as moving and/or circulating water through a water bag, forming an electric barrier around the bag to deter various creatures, powering lighting elements, GPS units, and rudders, and even providing propulsion for the towed bag device itself. It is further contemplated that power systems aboard a towing device (e.g., tug boat) may be synced with powered devices of a bag unit so as to supplement one or the other. In further embodiments, wind energy may be harnessed to move the bag or vessel through the use of towers, sails, windmills, etc.

In some embodiments, the water bags reduce costs by eliminating and/or reducing return expenses. Plus, the water bags alleviate the need to clean the container. Accordingly, in one embodiment each bag may installed new to eliminate cross contamination problems and to ensuring the integrity of the water. In an alternate embodiment, the bags may be reused to transport the same type of water. Additionally, the water bags may be cleaned after each use to transport water of a different type or of the same type and to ensure that the water quality is not reduced due to contaminates such as bacteria, algae, mold, dirt, etc.

In some embodiments, the present invention utilizes existing systems and devices of water, liquid, and/or gas transport to convey or store water. For example, in various embodiments, devices and systems may be retro-fitted or reconstructed in such a way to safely and efficiently transport large volumes of water. U.S. Pat. No. 5,727,492 to Cuneo et al, U.S. Pat. No. 5,099,779 to Kawaichi et al., U.S. Pat. No. 7,451,604 to Yoshida et al., U.S. Pat. No. 4,224,802 to Ooka, U.S. Pat. No. 4,331,129 to Hong et al., and U.S. Pat. No. 6,997,643 to Wille et al., U.S. Patent Application Nos. 2008/0110091 to Perkins et al, 2005/0095068 to Wille et al., 2009/0126400 to Pozivil, 2005/0276666 to Wille et al., and 2008/0127654 to Darling et al. are incorporated by reference herein in their entireties.

One of skill in the art will recognize that where quantities of water are to be stored, degradation of water quality may become a concern. Accordingly, various embodiments of the present invention contemplate a device, which is adapted for preventing growth and propagation of mold, mildew, algae and other deleterious effects caused over time to a quantity of water.

In various embodiments, methods for maintaining purity and sterility of the water are provided. By way of example and to further provide support and disclosure, the following references are incorporated by reference herein in their entireties:

U.S. Pat. No. 7,731,847 to Huy ("Huy") discloses a submersible reverse osmosis desalination apparatus and method with a submersible desalination unit composed of a structure containing a water intake system for acquiring sea water, a sea water pre-filtration system for removing lager contaminants and debris, a reverse osmosis system for the purification of the water, a permeate transfer system to carry the water to where it will be used, a power source for powering the equipment used in the process and a control system that operates and monitors the equipment and process of removing salt from the water and transferring the desalinated water to other use and returning the brine solution to the sea. Huy is hereby incorporated by reference in its entirety.

U.S. Pat. No. 5,229,005 to Fok et al. ("Fok") discloses an ocean depth reverse osmosis fresh water factory. Further, Fok discloses a process for the desalination of sea water by lowering from a floating platform sets of vessels, which are constructed or laminated in part with reverse osmosis elements, into the ocean depth to extract fresh water. Thereafter, the fresh water filled vessel is to be lifted individually from the ocean depth by means of a mechanical lifting system to a predetermined elevation above the sea surface to facilitate the delivery of the extracted fresh water to a coastal water transportation system via a valve at the bottom of the vessel which is also connected to a water delivery pipeline. Fok is hereby incorporated by reference in its entirety.

U.S. Pat. No. 4,512,886 to Hicks et al. ("Hicks") discloses wave-powered desalination of water using a device for the reverse osmotic desalination of water wherein the required energy is derived from waves. Hicks is hereby incorporated by reference in its entirety.

For example, in one embodiment, ultra-violet light is periodically applied to stored quantities of water so as to neutralize or destroy various bacteria, viruses and protozoan cysts such as giardia and cryptosporidia.

Ultraviolet technology and other purification methods known or described herein may be used with the water bags if the water is stored in the bag for long periods of time. UV purification can kill germs, mold, bacteria, etc. that may grow in the bags after long storage durations. Additionally, the water may be stored for longer periods of time if such purifications methods are employed. The UV purification methods may be employed on the water while the water is in the bag or the purification methods may be employed as the water is removed from the bags. Furthermore, if the water is stored for long durations and such purification methods are not available, then the water may be used for irrigation or construction purposes (i.e., purposes not requiring potable water) or the water may be put into the municipality's water treatment facility.

In some embodiments, the bags may include particular surface textures (either internally or externally or both) that may prevent undesired bacterial contamination of such surfaces. One particular aspect of various embodiments will, therefore, include a surface generally known as Sharklet™. Sharklet™ is the world's first technology to inhibit bacterial survival, growth, transfer and migration through pattern alone. The Sharklet surface is comprised of millions of tiny diamonds arranged in a distinct pattern that mimics the microbe-resistant properties of sharkskin. Sharklet is a simple, cost-effective solution for bacterial control. Sharklet is described in U.S. Pat. No. 7,347,970 to Kim et al., U.S. Pat. No. 7,143,709 to Brennan et al., U.S. Pat. No. 7,650,848 to Brennan et al., and U.S. Pat. No. 7,117,807 to Bohn, Jr. et al., the entire disclosures of which are incorporated by reference herein in their entireties. Sharklet is also described in U.S. Patent Publication Nos. 2010/0226943 to Brennan et al., 2010/0126404 to Brennan et al., 2010/0119755 to Chung et al., and 2011/0311769 to Chen et al. and International Patent Publication No. WO 2011/071892 to Magin, et al., the entire disclosures of which are incorporated by reference herein in their entireties.

These methods for maintaining purity and sterility of the water may be used with any embodiments described herein. For example, water may be purified or sterilized while being stored or transported in a large bag towed behind a ship, in a large bag in a shipping container, in a container on a train, in the cargo compartments on a ship, in the ballast compartments on a ship, in empty oil tanks on a train or truck, in empty oil tankers, etc.

In one embodiment, the VLB may be considered a drone because it has systems to navigate, propel, stop, and steer the VLB without the need for another vessel to tow the VLB or the need for a person to be on-board the VLB to control it. Thus, the VLB may include an engine, one or more propellers, steering mechanisms, a breaking system, sensors and controls, navigation equipment, etc. Furthermore, the breaking system may create power or store energy for other systems, similar to current hybrid and electric car motors. Thus, some embodiments may include an energy storage system.

In some embodiments, one or more drones may be secured to the VLB to move the VLB. The drone may be a device with propulsion and navigation capabilities. The drone will not need a human on board to control or navigate the drone and VLB. Thus, the drone controller may be located thousands of miles away from the drone and the VLB. In one embodiment, the one or more drones may use energy from photovoltaic solar arrays, windmills, or other renewable energy produced by components of the VLB to power the drones' engines and to power the drones' navigation systems. The drones may also be used to get the bag moving (i.e., enough inertia to make the bag move with the towing vessel) and/or slow down or stop the VLB once the VLB is approaching its destination.

The following references disclose drone and automated systems and are hereby incorporated by reference herein in their entireties to provide written description and enablement support: U.S. Patent Application Publication No. 2013/0228645 to Speybroeck; U.S. Pat. No. 8,527,457 to Moon; U.S. Patent Application Publication No. 2013/0221158 to Binkholder; U.S. Patent Application Publication No. 2013/0210461 to Moldaysky; U.S. Patent Application Publication No. 2013/0197717 to Fraser; U.S. Pat. No. 8,492,023 to Sastry; U.S. Pat. No. 8,488,246 to Border; U.S. Patent Application Publication No. 2013/0175404 to Shefer; U.S. Patent Application Publication No. 2013/0175382 to Brutoco; U.S. Patent Application Publication No. 2013/0230747 to Patolsky; U.S. Patent Application Publication No. 2013/0220205 to Henriksen; and U.S. Patent Application Publication No. 2013/0160692 to Skiadas.

In some embodiments, drones may be secured to the VLB most of the time even though the VLB is being towed by a tug or other towing vessel. Thus, the drones may be powered off or may be in a standby mode, in which only tracking or other sensory functions are working and the drones' engines are powered off. In another embodiment, the drones may assist in the towing of the VLB by using their engines to pull or push the VLB through the water. Thus, the towing vessel will have to use less fuel and/or power to tow the VLB. In alternative embodiments, the drones may be used in times of storms or rough seas. For example, if the VLB is being towed by a vessel and they encounter a strong storm, the vessel with the crew may detach the VLB and sail to safety while the VLB waits out the storm in the sea. The drones may be powered on or may be used to keep the VLB in roughly the same position throughout the storm. Accordingly, the drones may use their navigation software and sensors to determine the direction of the storm and ensure the drones' engines counteract the storm's forces. The drones will allow the tug or other vessel to track the VLB's location after the storm has passed. Known tracking software and components, such as GPS receivers for example, may be used to track the drones and the VLB. Alternatively, the drones may continue to move the VLB through the ocean during the storm while the towing vessel is safely away from the storm. In some embodiments, the drones may interconnect and detach from the VLB at any time depending on the needs of the system. With respect to the various systems and methods that may be employed in the use of drones with VLBS, incorporated herein by this reference for written description and enablement purposes is U.S. Patent Publication No. 2009/0276105 to Lacaze, et al.

In one embodiment, the VLB may not need to be towed at all. Rather, the VLB will have drones secured to the VLB to move the VLB through the ocean or sea to the VLB's destination.

In various embodiments, the VLB may include a security system to protect the contents from theft. For example, the valves and/or ports are locked for additional security and may be unlocked from a remote location when the VLB arrives at its destination and the entity desiring or requesting the liquid contents is ready to receive the liquid contents. Such locking apparatuses are described in U.S. Pat. No. 8,058,985 to Dobson et al., which is incorporated by reference herein in its entirety. U.S. Pat. No. 7,690,319 to Wingate, which is incorporated by reference herein in its entirety, discloses an anchoring system and method for docking and/or mooring vehicles, particularly watercraft and for restraining loads in truck beds or trailers. The apparatus utilizes ropes or cables in housing unit that provides for the extension and retraction of the rope or cables preferably without the need of electrical or manual cranks. A method of providing restraining means to a container liner similar to the one described in PCT Patent Application No. WO 2012/020259 to Massie, which is incorporated by reference herein in its entirety, may also be used.

The towable vessel may also need a breaking system to slow down or stop the VLB. The VLB may be up to 800 meters long and thus require a lot of force to stop the VLB.

In some embodiments, a method for storing and conveying fluids is provided. The method comprises: (a) providing: a non-rigid, water-impermeable device with an elongate shape having a first end, a second end and having a generally streamlined shape in plan view; the first end comprising a first attachment device; the second end comprising a second attachment device; at least two ports for intake and exhaust of fluids; at least one of the at least two ports comprising a valve for a user to adjust buoyancy of the device; at least a portion of the device containing a fluid of lower density than a fluid through which the device is transported; one or more valves in two-way communication with at least a portion of an interior volume of the device and an outside environment; a transmitter for conveying information related to the geographic position of the device; at least a portion of an internal surface area of the device being comprised of a flexible and tear resistant material; at least two mooring devices; and an anchored member having a first end, a second end, and a longitudinal length; (b) securing the first attachment device of the first end to one of the at least two mooring devices; (c) securing the second attachment device of the second end to the second of the at least two mooring devices; (d) storing an entirety of the fluid of lower density in the non-rigid, water permeable device; (e) stabilizing the non-rigid, water-impermeable device by mooring the non-rigid, water-impermeable device to a fixed or floating object; (f) signaling a physical position of the non-rigid, water-impermeable device; (g) tracking the non-rigid, water-impermeable device; (h) conveying the non-rigid, water-impermeable device to a predetermined destination through salt water; and (i) emptying the non-rigid, water-impermeable device of fluids through one of the at least two ports. In one embodiment, the method further comprises providing one or more photovoltaic arrays to collect solar energy, the arrays being adapted to contact a non-submerged surface of the non-rigid, water-impermeable device during the conveying step. In another embodiment, the method further comprises using the solar energy to power one or more functions of the non-rigid, water-impermeable device, the one or more functions selected from the group consisting of supplying power to engines employed in the conveying step; supplying power to enable the emptying step; and supplying power to one or more devices responsible for the steps of tracking, stabilizing and signaling. The fluid of lower density may be fresh water. Providing a water purification system and treating the fresh water may also be included in the method. In various embodiments, the method further comprises providing one or more drones, wherein the drones are capable of maneuvering the non-rigid, water-impermeable device. In some embodiments, the method further comprises segregating different liquids within the device; controlling the amount of air within a portion of the device to adjust buoyancy of the device; venting the device in a manner that prevents entrance of contaminants into the device. In some embodiments, a method for storing and conveying fluids is provided comprising: (a) providing: a non-rigid, water-impermeable device with an elongate shape having a first end, a second end, the first end comprising a first attachment device, and the second end comprising a second attachment device; a plurality of ports for intake and exhaust of fluids; at least one of the plurality of ports comprising a valve for the user to adjust buoyancy of the non-rigid, water-impermeable device; at least a portion of the device containing a fluid of lower density than a fluid through which the non-rigid, water-impermeable device is transported; one or more valves in two-way communication with at least a portion of an interior volume of the non-rigid, water-impermeable device and an outside environment; a transmitter for conveying information related to the geographic position of the non-rigid, water-impermeable device; at least a portion of an internal surface area of the non-rigid, water-impermeable device being comprised of a flexible and tear resistant material; and a mooring device; (b) securing the first attachment device of the non-rigid, water-impermeable device to the mooring device; (c) signaling a physical position of the non-rigid, water-impermeable device; (d) tracking the non-rigid, water-impermeable device using a device that receives GPS information; and (e) transmitting coordinates of the non-rigid, water-impermeable device at predetermined temporal increments. The method may further comprise rapidly emptying the non-rigid, water-impermeable device of fluids through at least one of the plurality of ports. In one embodiment, the method comprises steering the non-rigid, water-impermeable device via one or more skegs positioned on the device. In another embodiment, the method further comprises providing at least one of a photovoltaic array and a windmill to collect renewable energy. In one embodiment, the method includes deflating the non-rigid, water-impermeable device to reduce a volume of the device for ease of transport; preserving the integrity of the fluid contained within the non-rigid, water-impermeable device when the non-rigid, water-impermeable device is in a submerged position; coating the internal surface of the non-rigid, water-impermeable device to preserve the purity of the lower density fluid; and identifying the plurality of ports for the intake and exhaust of fluids via a marking system that identifies which of the plurality of ports for the intake and exhaust of fluids are associated with compartments that are connected to at least one of the ports. In some embodiments, the positioning step may include storing the non-rigid, water-impermeable device in a generally horizontal position with respect to a water line using the mooring device and a second mooring device and securing the second mooring device to the second attachment device of the second end of the non-rigid, water-impermeable device. In another embodiment, the method further comprises: operatively associating one or more photovoltaic arrays to the non-rigid, water-impermeable device; and generating electrical power from the solar arrays.

It is one aspect of the present invention to date glaciers and identify the age of various layers within a glacier or ice sheet and to transport water derived therefrom in VLBs, etc. After various layers of the glacier or ice sheet have been dated, the glacier can be mined/tapped according to known processes. The glacier ice can be recovered and segmented into various layers. Each layer corresponds to a different, now determined, age. For example, a first layer may be 100 years old whereas a second layer may be 2000 years old. Once the layers are separated according to date, each dated layer of ice can be processed for consumption as drinking water or for some other type of beverage (e.g., soda, juice, spirits, beer, wine, etc.) Consumers will readily appreciate the advantage of drinking water that existed during the time of Shakespeare, King Arthur, or Jesus, for example.

Another aspect of the present invention relates to the appreciation of how to obtain (without sophisticated chemical analysis and re-creation of waters having certain qualities and lack of pollutants, etc.), water of a very specific time period and/or geographic region. It is therefore part of the present invention that the inventor recognized the problem, which then lead to the solution. The ability to obtain water having particularly desirous aspects (whether that be an absence of present day pollutants, many of which are man made), or the presence of certain natural organic elements (i.e., perhaps pollen of plants that may now be extinct, etc.) by its nature constitutes a new process and product. Similar to the patentability derived from the "purity" of the final product, it is believed that the present inventor is the first to appreciate how to arrive at the substantially pure aspect of water derived from previously frozen ice that is over hundreds, if not thousands, if not millions of years old. Furthermore the ability to date these layers of frozen ice and generally correspond it to a given time era is also advantageous in that different properties of water corresponding to different layers may exist. While it is acknowledged that ice has been melted to derive water in the past, it has not been accomplished under conditions that preserve the pristine aspects of such water and categorize those aspects according to their date.

In accordance with embodiments of the present invention, the ice from a glacier and/or ice sheet can be cut, drilled, and/or divided into various segments. The cutting, drilling, and/or division of the segments can separate the ice into either vertically or horizontally separated segments. The segments can then be further divided by date into other segments. These dated segments are then processed under strict hygienic conditions such that the properties of the water are maintained and not polluted. In a preferred embodiment, the processing of the ice is performed under an increased atmospheric pressure and where staff must be present during the operations. The staff should wear special clothing adapted to the purpose of maintaining the hygienic properties of the water. Preferably the cutting, drilling, and/or tapping and subsequent packaging of the ice are performed in accordance with FDA current good manufacturing practice for processing and bottling of bottled drinking water, 21 CFR 129.

The ice can be drilled from the top or may be extracted from the terminus of the glacier such that the layers are taken out directly without an intermediate step as required by the vertical recovery of the ice. Furthermore, various layers of the ice can be tapped and pumped in an effort to recover the water contained therein. It is one aspect of the present invention to provide a method of processing ice from a glacier or ice sheet. The ice is extracted from the reservoir, i.e., glacier or ice sheet. The ice is then segmented and categorized by date. Thereafter, each segmented section of ice is processed separately under hygienic conditions such that the pristine aspects of the water are maintained. The water is then packaged separately and labeled according to the date from which the ice existed. For example, renaissance water that came from the early 1400 AD era is bottled separate from water that existed at the time of Christ or around 0 BC. The water may be portioned into consumable units or into larger bulk quantities. Consumable units are generally portion sizes acquired by an individual consumer. Units ranging between 0.1 liters and 10 gallons can be partitioned. More preferably, 1.5 liter to 10 liters could be the partition size of the water. Generally, the water is partitioned into individual sellable units, preferably around one-half liter to one liter, due to the categorization of the ice and subsequent processing of the ice into water comprising different properties from one batch to the next. The inventive process merits a higher selling price of water than simply cutting up ice from a glacier and melting it. Consumers may be willing to pay a premium for water that traces its roots back to the same time that Leonardo da Vinci lived, for example. Therefore, reasonable sizing of the sellable units would be desired based on the attractiveness of the process provided by the present invention.

Alternatively, water from a particular era or containing certain properties could be sold in bulk quantities. Particularly, breweries or distilleries that have a long historic tradition could purchase large batches of dated water. They could then use water that dates back to their original product in order to recreate the original beverage that they used to produce. Many breweries and the like pride themselves on not changing certain recipes over the course of many years. Some breweries and distilleries have been creating the same product for over a hundred years. These companies would be able to purchase water that existed during the days of their founders and could create, market, and sell the "original" product to consumers with literally no changes from the true original. Consumers would be willing to pay a premium for a truly original pint of Guinness® or a bottle of Lagavulin scotch made from water dating back to 1816.

Another aspect of the present invention provides a system for categorizing, extracting, processing and packaging water into different historically categorized groups. In accordance with one embodiment, a recovery station is set on or near an ice source (e.g., glacier, ice sheet, ice cap, and the like). Also included is a recovery member that is operable to transmit ice from the ice source to the recovery station. In the recovery station, the ice can then be separated and categorized according to date and processed according to the methods described above.

A further aspect of the present invention provides a method for producing bottled water from glacial ice having a predetermined age. The method includes analyzing the age of a number of layers of glacial ice within an ice source. Then a first layer, whose age is known, is extracted in either a solid or liquid state. The first layer is extracted such that other layers remain substantially undisturbed. This allows the first layer to be substantially separated from the other layers of glacial ice, thereby isolating the characteristics of the water within the first layer. After the water has been extracted it is collected and directed into a container (e.g., a bottle, bag, or the like.) Once the water from the first layer has been effectively bottled or contained, an indication in the form of a tag or label is place on or around the bottle/container to reflect the characteristics of the water that is within the bottle/container.

Still a further aspect of the present invention provides for a way of recovering and preparing dated water in an economically viable fashion. In one embodiment, a number of containers are separated and filled with water (either from the ice source itself or from another source) in a frozen or liquid state. Water from various segments of the ice source are then extracted from the ice source and then placed into different containers. Essentially, a majority of the water in each container does not need to be extracted according to the costly process described herein. However, a non-trivial amount of categorized water is also in each container such that consumers can be assured that the water they are drinking is at least partially derived from a particular time period and thus has the unique characteristics of water from that time period. The primary water that is used (i.e., the non-categorized water) should be held to the highest purity standards so that when the categorized water is added, the unique characteristics of that water are not lost or disrupted.

These and other advantages will be apparent from the disclosure of the invention(s) contained herein. The above-described embodiments and configurations are neither complete nor exhaustive. As will be appreciated, other embodiments of the invention are possible using, alone or in combination, one or more of the features set forth above or described in detail below.

A long felt but unsolved need exists for a method and system that can be economically employed to procure waters having some of the above reference positive attributes without including undesired components. These and other needs are addressed by the various embodiments and configurations of the present invention.

Applicant hereby incorporates by reference in its entirety U.S. patent application Ser. No. 11/551,125 to Szydlowski, filed on Oct. 19, 2006, 61/303,519 to Szydlowski, filed Feb. 11, 2010, and 61/378,811 to Szydlowski filed Aug. 31, 2010. It is contemplated that various methods, systems, and devices of these references may be utilized in various embodiments of the present invention.

In addition to the numerous environmental concerns surrounding the current methods of procuring potable water, various health concerns are present as well. Concerns over undesirable foreign contents in municipal water supplies have forced many consumers to balance the aforementioned environmental risks with the perhaps more personal and immediate concerns posed by these health risks. Contaminants such as heavy metals, including transition metals, metalloids, lanthanoids, and actinides (e.g. Mercury, Lead, Chromium, etc.), PCBs (polychlorinated biphenyls), and pesticides frequently occur in water supplies of even advanced regions. The primary causes of these contamination concerns, aging water distribution infrastructure and pollution, are significant public works concerns that will require significant time and cost to update and repair.

Many water sources are tainted as a result of their latitudes and relative proximity to industrialized nation's carbon emissions, e.g. mercury from coal and petroleum fired power plants. Accordingly, in a preferred embodiment of the present invention, the selected water source is located in a region that is generally unaffected by pollution from industrialized nations. Glacial ice situated in regions between 15 and 60 degrees south latitude, such as Chilean glaciers, provides desirable sources of ice and water for use in the present invention. Additionally, many natural sources of water contain harmful microorganisms, such as Giardi, which often require energy intensive methods such as boiling or the addition of otherwise undesirable substances such as chlorine to eliminate. These concerns are prevalent even in relatively unpolluted areas as such microorganisms frequently enter the water supply from a wide range of their mammalian hosts. Giardia, which is estimated to infect over 2.5 million people annually, typically results in severe gastrointestinal symptoms causing weight loss, malaise, and fatigue.

In recent years, groundbreaking research has yielded evidence of the existence of microorganisms within terrestrial ice. These microorganisms are theorized to have originated with amino acid-bearing comets that collided with Earth approximately four billion years ago and may have assembled into early proteins and DNA. In 2004, a collection of high speed dust samples taken from the comet Wild-2 by the NASA Stardust probe revealed the existence of glycine, a basic component of proteins, within the comet. The existence of these components in the Wild-2 comet provides much of the basis for the theory that the building blocks for life on Earth were delivered by meteorite and comet impacts. These components have also been found on Earth, preserved in glacial ice in a similar manner as to how they are preserved in frozen comets. It is known that amino acids are crucial elements of life as they form the basis of proteins, which are linear chains of amino acids. Accordingly, credible evidence exists to state a theory that the early origins of life on Earth are present in current polar and non-polar ice sheets.

While the details of the potential health benefits of these amino acids have yet to be evaluated, there exists a viable market for unadulterated drinking water which could reasonably be calculated to contain glycine and primordial building blocks of life. In addition to the commercially appealing aspects of consuming the origins of life itself, glycine is known to produce a sweet taste for humans. It is known that glycine may be manufactured industrially by treating chloroacetic acid with ammonia. However, one of skill in the art will recognize the economic and practical benefits of obtain, distributing, and/or marketing glycine of a naturally occurring form.

It is an object of the present invention to obtain water from naturally occurring sources, where it is naturally filtered by its desirable geographic and topographic surroundings, and ensure purification of the water without pasteurizing, filtering, sanitizing, or otherwise eliminating certain commercially viable contents. In one particular embodiment, glacial water is procured and directed through a conduit system that comprises one or more sections having native Chilean earth components thereto.

It is a further object of the present invention to utilize only natural, non-biological, non-chemical additives to the filtration process of water. In one specific embodiment, filters comprised of natural and native soils are constructed to obtain the appropriate level of purity without adding content to the water or using biological processes. In one embodiment, the natural filtration process of water flowing in, around, or through desirable soils is selectively repeated by diverting natural flow through additional natural or man-made filters at lower elevations. In another embodiment, the natural filtration processes may be aided by the addition of advantageous biologic or chemical substances.

It is a further object of the present invention to obtain water from naturally occurring sources where the gravitational potential energy of the water is utilized in connection with the natural environment to filter and purify the water. In one embodiment, water to be filtered, cleaned, or otherwise used in the present invention is delivered by the force of gravity alone.

It is a further object of the present invention to filter, assess and ensure purity via predetermined criteria, and obtain clean water by channeling glacial water through additional phases of natural filtration through which the water passes largely, if not solely, under gravitational force. This process allows for substantially continuous natural filtration and purification of water without continuous energy consumption from man-made power inputs, resulting in reduced production costs and reduced carbon emissions.

It is a further object of the present invention to implement a filtration and purification process which initially uses source water from strategic geographic locations, such as those regions of Earth that are not generally impacted by carbon emissions and other pollutants produced by industrialized countries due to the physical location of the source and prevailing winds. In a preferred embodiment, the present invention includes a method whereby only water from desirable latitudinal locations of the Earth is selected for filtration and/or processing.

It is yet another object of the present invention to produce safe and healthy drinking water with signature characteristics of the geographic location from which it originated. In certain embodiments, water treated in accordance with the method/system set forth herein may have added to it particular "markers," or have certain characteristics or "markers" enhanced to provide later evidence and proof of at least one of origin, quality, source, purity, geological formation, treatment regimen, latitudinal characteristics, mineral content, extra territorial content, etc. In such a manner, counterfeiting of legitimate water can be deterred, prevented, and/or investigated.

It is another object of the present invention to procure water for distribution which is of sufficient purity, without being subjected to chemical or biological treatments, that it may be reasonably calculated or asserted to contain amino acids and other compounds that can form the building blocks of life. Furthermore, the present invention contemplates employing known methods for evaluating and detecting the presence of these and other compounds in order to affirmatively establish their presence.

To facilitate best mode and written description concerns, various aspects of how to make and use the present invention can be better understood by referring to the particular prior art systems. For example, U.S. Pat. No. 7,332,082 to Brandlmaier, which is hereby incorporated by reference in its entirety, discloses a chemical-free method of treating and keeping clean water and is hereby incorporated by reference in its entirety. Brandlmaier discloses a method of transporting water to different filter stages by gravity. However, Brandlmaier necessarily involves a biologic filter, such as a planted ground filter, as one phase of the filtration process before optionally returning the water to a swimming facility.

U.S. Pat. No. 7,569,148 to Elefritz, Jr. et al., which is hereby incorporated by reference in its entirety, discloses a method of treating wastewater utilizing sequence batch reactors and membrane filters, and is hereby incorporated by reference in its entirety. Elefritz, Jr. et al. teach a filtration system that requires a biological reactor, thereby requiring additional production costs as compared to the present invention.

U.S. Pat. No. 7,077,963 to McConchie et al., which is hereby incorporated by reference in its entirety, discloses a process for treating acidic water containing dissolved organic solvents. McConchie et al. fails to teach a method for treating water that does not require the addition of substances. In this manner, McConchie et al. fails to teach at least some of the novel aspects of the present invention.

U.S. Pat. No. 5,032,261 to Pyper, which is hereby incorporated by reference in its entirety, discloses a system for filtering bacteria and preparing drinking water. Pyper discloses a system that includes biological filtration and does not rely upon gravity as a source of energy input.

U.S. Pat. No. 4,564,450 to Piper et al. which is hereby incorporated by reference in its entirety, discloses a modular array of filter elements for treating water. Piper et al. disclose a quadrilateral module. Accordingly, Piper et al. teach away from aspects of the present invention which are not confined to quadrilateral arrays.

United States Patent Application Publication No. 2009/0230061 to Mitchell et al., which is hereby incorporated by reference in its entirety, discloses a method for filtering and removing bacteria from water. Mitchell et al. disclose a system that involves a filter housing comprising mesoporous activated carbon. Mitchell et al. fail to teach novel aspects of the present invention. As one of ordinary skill in the art will appreciate, various aspects of the above systems can be employed in practicing different embodiments of the present invention.

One embodiment is directed to a system for storing and conveying fluids, such system including a non-rigid, water-impermeable device with an elongate shape having a first end, a second end and having a generally streamlined shape in plan view. The first end has a first attachment device and the second end has a second attachment device. At least two ports for intake and exhaust of fluids are employed, with at least one of the at least two ports comprising a valve for a user to adjust buoyancy of the non-rigid, water-impermeable device. At least a portion of the non-rigid, water-impermeable device is adapted to contain a fluid of lower density than a fluid through which the non-rigid, water-impermeable device is transported. One or more valves in two-way communication with at least a portion of an interior volume of the non-rigid, water-impermeable device are employed. A transmitter for conveying information related to the geographic position of the device is also employed. At least a portion of an internal surface area of the non-rigid, water-impermeable device is made of a flexible and tear resistant material. A first attachment device on the first end of the water-impermeable device is secured to one of at least two mooring devices, with a second attachment device on the second end being secured to the other of the at least two mooring devices. The non-rigid, water-impermeable device is moored to a fixed or floating object, and a global positioning system (GPS) transponder is positioned on the water-impermeable device.

One or more photovoltaic arrays are employed to collect solar energy, with such arrays being adapted to contact a non-submerged surface of the water-impermeable device. Preferably different liquids within the water-impermeable device are segregated, and the amount of air within a portion of the device adjusts the buoyancy of the device in a manner so as to prevent entrance of contaminants. One or more skegs may be positioned on the device. The device may also be reduced in volume for ease of transport. Preferably, the fluid contained within the device is in a state of original integrity when in a submerged position, and the device is preferably in a generally horizontal position with respect to a water line and is emptied of fluids through at least one of at least two ports.

These and other advantages will be apparent from the disclosure of the invention(s) contained herein. The above-described embodiments, objectives, and configurations are neither complete nor exhaustive. As will be appreciated, other embodiments of the invention are possible using, alone or in combination, one or more of the features set forth above or described in detail below.

DETAILED DESCRIPTION OF EMBODIMENTS OF THE INVENTION

Figure 1:
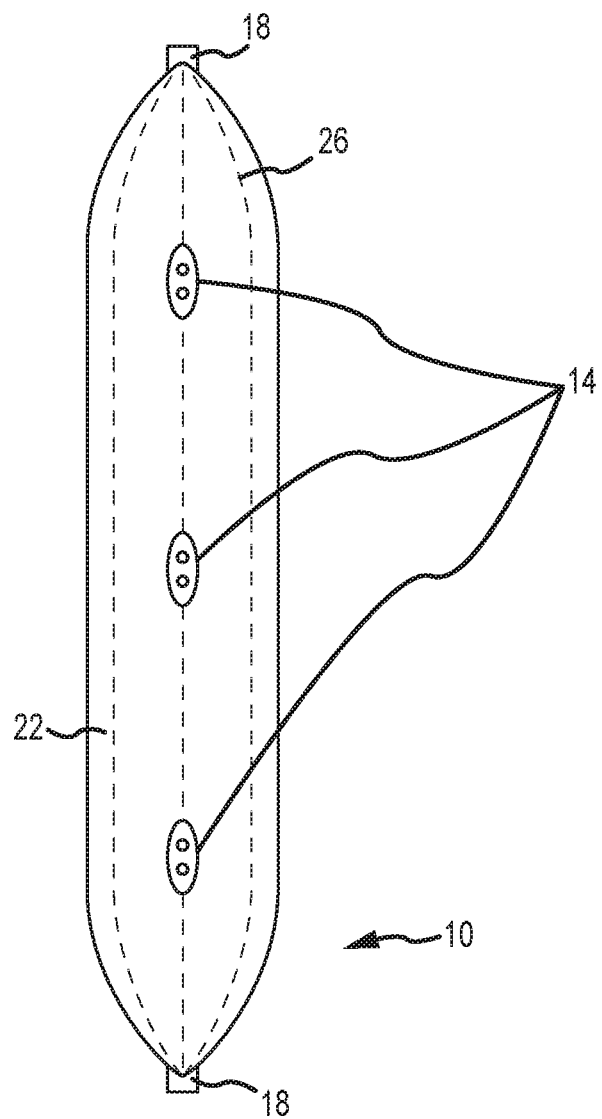
FIG. 1 is a top plan view of a towed vessel suitable for transporting liquids according to one embodiment.

FIG. 1 depicts a towable vessel 10 for transporting fluent cargoes. Note that the towable vessel may also be called a bag, bladder, very large bag, or VLB herein. In one embodiment of the present invention, a towable vessel 10 may comprise a plurality of ports 14 suitable for the inlet and removal of fluids to be transported. One of skill in the art will recognize that a plurality of such ports may be useful in fluid removal operations, both as a means to increase the flow rate of fluid into a vessel 10 and/or to allow for air intake into one port 14 while fluid is extracted from another port 14. In some operations, it may be desirable to transport extremely large volumes of fluid. For example, it may be desirable to transport in excess of 35,000 tons of water in a single vessel 10. Accordingly, increased flow rates to and from a vessel may be desirable and stand to increase the overall efficiency of the system and fluid transport operations.

Vessels 10 of the present invention may be comprised of a variety of non-rigid, flexible materials including, but not limited to, urethane, polyurethane, urethane-coated polyesters, thermoplastic urethane coated nylon, vinyl, and other similar materials or various combinations of the same. Those of skill in the art will recognize the various advantages of constructing a vessel 10 of the present invention out of a flexible material, including, but not limited to, the ability to easily store and transport the towable vessel 10 when it is not in use for transporting liquids.

In one embodiment, a towable vessel 10 further comprises a reinforcing member 18 on at least one node or end of the vessel 10 for attachment to towing members and towing vessels. Reinforcing members 18 may be comprised of rigid structures fastened to or otherwise connected to a pliable or flexible container 22 and capable of withstanding various tension forces imparted to the vessel 10 during towing.

Reinforcing members 18 may further be connected to reinforcing seams 26 which travel through a longitudinal length of a towable vessel 10. Reinforcing seams 26 may be comprised of a variety of known materials, including, but not limited to metal cables, nylon cords, plastics, and various other materials suitable for withstanding tensile loading. The reinforcing seams 26 may be positioned is specific areas and at specific angles relative to a horizontal plane and/or other reinforcing seams 26. In some embodiments, the reinforcing seams 26 are woven, similar to a seatbelt for an automobile or airplane. The reinforcing seams 26 may be woven such that there is no end of a reinforcing seam 26 to reduce fraying and weak points. Reinforcing seams 26 may transmit and resist forces applied to a towed portion of the vessel 10, thereby reducing unwanted deflection of the vessel 10 and associated drag on the vessel 10.

In an alternative embodiment, a towed vessel 10 comprises an ellipsoid shaped hull (when in a filled state) to reduce drag, at least one air chamber to maintain the vessel in an upright position, one or more ports 14 for filling and/or emptying the vessel, one or more removable bladders capable of containing and segregating different liquids or materials, and one or more devices capable of selectively controlling the amount of air within a portion of the towable vessel 10 and corresponding buoyancy.

It will be recognized that the shape of the vessel 10 may take various different forms, depending upon the desired quantity of fluid to be transported, characteristics of the vessel(s) towing the vessel 10, and other factors. However, it will further be recognized that it is desirable to reduce drag in water towing applications. Accordingly, it is known that drag on the vessel 10 will decrease as the wetted surface area and width of the vessel 10 decrease, and while length increases. Therefore, in order to improve towing efficiency, an optimal geometric design may be constructed.

Figure 2:
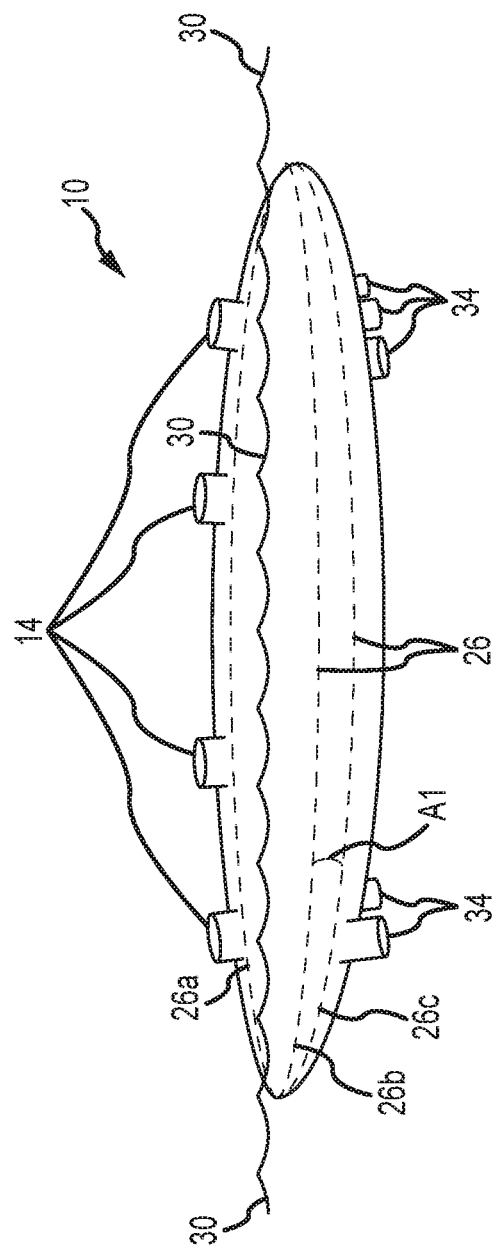
FIG. 2 is a side elevation view of a towed vessel suitable for transporting liquids.

FIG. 2 depicts a side elevation view of one embodiment of the present invention with respect to a water line 30. In water towed operations, it may be desirable to adjust the buoyancy of the towable vessel 10, either due to various environmental conditions or based on the amount and density of the liquid contained within the vessel 10. Accordingly, the present invention contemplates operating a vessel 10 at various depths within a body of water. Variable buoyancy may be obtained, for example, through the use of a dorsal bladder (not shown) which contains air or a gas of lower density than a material to be towed, which both maintains the vessel 10 in an upright position and provides a certain amount of buoyancy relative to the vessel's surroundings. Alternatively, air or gas may be housed within a main portion of the device 10 to provide similar functionality.

In one embodiment, ports 14 include the ability to exhaust and intake air based on a desired level of buoyancy. For example, one or more ports 14 are equipped with means, such as reversible impellers to draw air in or exhaust air from a previously disclosed bladder or from one or more fluid containing compartments of the vessel 10.

Buoyancy may be adjusted, for example, when various environmental conditions change. In long-distance open-sea transit, it is known that temperature changes may occur in the surrounding waters. Accordingly, a fluid containing vessel 10 that has been towed in relatively cold waters for a length of time may obtain an increased density due to cooling effects from the surrounding water. When such a cooled vessel 10 reaches warmer waters, and particularly when there is an abrupt transition, the cooled vessel 10 may have a tendency to sink or reside lower in its surrounding water. To account for this, embodiments of the present invention comprise means for taking in additional air and increasing buoyancy. For example, ports 14 comprise manually activated or logic driven motors to adjust buoyancy while the device is in operation. A manually activated motor may be controlled from within a towing vessel or from another remote location and may allow a user to increase the volume of air contained within a vessel 10 based on the visual appearance of the vessel 10 or other indicia. Logic driven motors may be comprised of devices which sense one of: a difference between the temperate of water within the vessel 10 and the vessel 10 itself, a sudden change in the temperature of the water within which the vessel 10 is being towed, or the amount of submersion of the vessel 10 within its surroundings. For example, a sensor may be employed at a certain location of the vessel 10 which senses the presence of an unacceptably high level of submersion and triggers motor(s) within one or more ports 14 to intake air and thereby increase the buoyancy of the vessel 10.

It will be recognized that it is often desirable to prevent materials, such as rain, sea water, and other contaminants from entering the ports 14 and thus impacting the purity of water or fluids to be transported. Accordingly, the present invention contemplates means to secure the ports 14 when venting or adding fluid or gas is not desired. For example, covers suitable for preventing the unwanted entrance of materials may be selectively actuated, such as by a remote user. Alternatively, ports 14 for venting air may be connected solely to a bladder which is not interconnected to a main fluid containing portion of the device 10. In one embodiment, physical barriers may be constructed around ports 14 which allow for the entrance and exhaust of gas, but prevent the unwanted entrance of various fluids and contaminates.

In one embodiment, one or more one-way valves may be constructed on a portion of the vessel 10 that is to reside above the water line. One-way valves are known to those of skill in the art and may be provided to allow for the venting of gases, yet still prevent the unwanted entrance of other fluids or contaminants. For example, one one-way valve may be employed to allow for the release of air when less buoyancy is desired and another may be provided to allow for the opposite flow of air into a vessel 10 when greater buoyancy is desired. In one embodiment, one or more of these valves are selectively controlled by a user. In this manner, a user may have discretion as to when to insert air (i.e., a user may elect to insert air during optimal conditions when the risk of taking sea or rainwater is low) and/or remove air.

As shown, one or more fins or skegs 34 may be included on a vessel at a location below the water line 30 to increase directional stability of the vessel 10 while being towed. In one embodiment, one or more skegs 34 may be selectively controlled to assist in steering and/or maneuvering the potentially cumbersome vessel.

In one embodiment, the present invention comprises locating means. As will be recognized, submerged or partially submerged vessels may be difficult to identify, particularly in poor lighting conditions or at night. Additionally, it is a known risk that vessels 10 of the present invention and similar objects may become dislodged from their towing vessel. In such circumstances, these vessels 10 may pose significant safety risks. While it is an aspect of the present invention that damage to or loss of devices 10 of the present invention pose reduced risk to the environment, vessels 10 separated from their host or towing vessel may still pose a collision risk. Accordingly, a transmitting device, such as a Global Positioning System ("GPS") transmitter is incorporated into one embodiment of the present invention. The GPS transmitter may, for example, transmit the coordinates of a vessel 10 at specified temporal increments or when another related device requests such information. Additionally, other vessels or remote locations may be equipped with GPS sensing means to detect and convey the transmitted location of a vessel 10.

The vessel 10 may comprise reinforcing seams 26 that extend a longitudinal length of the towable vessel 10. In one embodiment, the vessel 10 may comprise an upper reinforcing seam 26a along the top of the vessel 10, an equatorial reinforcing seam 26b along the equator of the vessel 10, and one or more side reinforcing seams 26c either above or below the equatorial reinforcing seam 26b. The side reinforcing seam 26c may be an angle A1 away from the equatorial reinforcing seam 26b.

The towable vessel 10 may experience various forces on the front end of the bag when it is being towed. These forces may vary along the surface of the bag.

Figure 3:
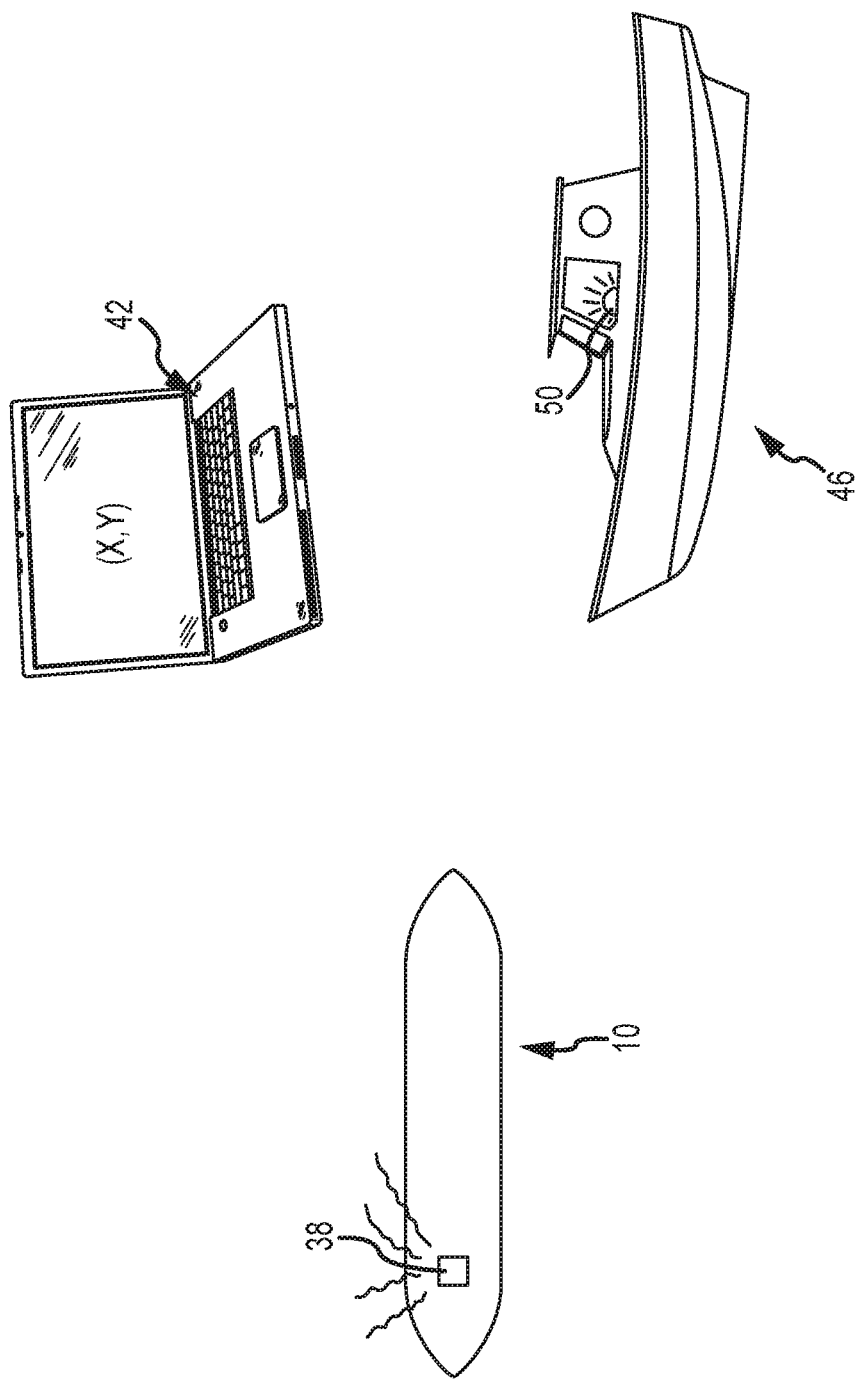
FIG. 3 is a diagram depicting various features of a towed vessel suitable for transporting liquids according to one embodiment.

FIG. 3 depicts a towed vessel 10 for fluent cargo transport equipped with a GPS transponder 38. In one embodiment, the GPS transponder 38 may be activated remotely, such as when a towing vessel recognizes that it has lost contact with the towed vessel 10.

In another embodiment, the towed vessel 10 may constantly transmit information regarding its own coordinates. For example, the vessel 10 may transmit information regarding its location at predetermined time intervals whether or not it is detached from a towing vessel. In yet another embodiment, a vessel 10 may transmit information regarding its location upon request (i.e., at the receipt of a signal from another location or device). Information regarding a vessel's 10 position may be transmitted to and received by various different locations and objects. For example, the signal and information transmitted by a GPS transmitter 38 may be obtained by a remote computing station 42 for processing and displaying the information. A remote computing station 42 may reside in a variety of locations, including on other vessels and various fixed on-shore locations. Information transmitted by a GPS transmitter 38 may also be received by various other vessels 46 potentially in the vicinity of the towed (or misplaced) vessel 10. Vessels 46 may be equipped with indicator means 50 capable of alerting crew members that a partially submerged object 10 is present in their vicinity and may pose a safety risk.

Various other advantages of equipping a vessel 10 with GPS locating means 38 will be recognized by those of skill in the art. For example, the status and progress of a fluid containing vessel 10 may be tracked remotely by interested parties to determine logistical information.

A vessel 10 may comprise visual indicia of its location and size, such as conventional lighting members positioned at various locations on the vessel 10. Additionally, given the significant width that floating vessels of the present invention may comprise, it is further contemplated that a vessel 10 may be equipped with port and starboard indicator lights to indicate the lateral boundaries of a vessel 10 (i.e., conventionally, green lights are used to indicate the starboard side and red lights to indicate the port side).

One of skill in the art will recognize that it may be desirable to transport a vessel 10 of the present invention in an emptied state, such as when a vessel 10 has been transported from a source to a delivery site and must thereafter be returned. In these circumstances, it is desirable to transport the vessel 10 in a manner requiring the least amount of storage space, weight and fuel costs. Accordingly, one embodiment of the present invention comprises the ability to at least partially deflate or extract a volume of air from a vessel 10 either during emptying operations or subsequent thereto. For example, vacuum powered means for emptying a vessel 10 may be attached to ports 14 to enable the extraction of an internal volume of fluid. Once all or most of an internal volume of fluid has been removed, the same or similar vacuum powered devices may be utilized to further extract a remaining internal volume of air from the vessel 10. It will be recognized that in such operations, measures may need to be taken to prevent a fully deflated vessel from sinking. Accordingly, the device 10 may be tethered to various objects, such as a towing vessel or fixed on-shore objects via attachment means 18 or other similar structures on the device 10. Deflating a vessel 10 as described offers the benefits of reducing the overall weight and volume of a device 10 to be transported, as well as reducing the potential for mold and other contaminants to grow inside of an otherwise damp and dark internal volume.

Once deflated, a vessel 10 may be further compacted by folding or rolling the vessel 10 onto a storage drum or wheel. Devices for rolling a large vessel 10 onto a storage drum are described in, for example, U.S. Pat. No. 6,550,410 to Reimers, which is hereby incorporated by reference in its entirety.

As an alternative to deflation, it is contemplated that vessels of the present invention may be alternatively filled with an air or gas of a sufficiently lower density than water to provide adequate buoyancy. In this manner, vessels 10 may then be towed in an "empty" state with minimal drag and associated fuel consumption needed to return a vessel 10 to another location for further filling or recycling. For example, helium and/or ambient air may be inserted into an emptied vessel 10 to provide sufficient buoyancy and minimal drag upon the vessel when towed without fluent cargo. In one embodiment, after most of the water has been drained from the towable vessel 10, the vessel is towed back to its point of origin with just a small amount of water remaining in the bag. Accordingly, the mostly-empty towable vessel 10 is towed behind a ship like a noodle.

Embodiments of the present invention may take the form or appearance of various objects which, for example, may hold commercial appeal or value. For example, at least a portion (e.g., a non-submerged portion) of towed vessels 10 of the present invention may comprise specific shapes or form specific characters for the purpose of displaying an image or a message. Images contemplated by the present invention include, but are not limited to, those with commercial appeal, such as trademarked or otherwise recognizable images or slogans which can be viewed by individuals including cruise passengers, airline passengers, and extraterrestrial image sensors (e.g., satellite photography).

It is further contemplated to provide vessels 10 of the present invention with the ability to selectively or temporarily display various images or messages. For example, portions of a vessel 10 which are inflated may be selectively inflated or positioned to display various images or text. In this manner, customizable messages may be displayed to various viewers. Alternatively, a portion of a vessel 10 of the present invention may include the ability to display written or marked images. For example, various inks, dyes, and similar materials may be placed upon a visible portion of the present invention. Such materials may be used to display, for example, the name of a company transporting contents, a third-party advertiser, or personal messages (e.g., a marriage proposal or a birthday wish).

In one embodiment, the present invention contemplates preserving the integrity and purity of fluids to be contained within a vessel 10 by incorporating various features and materials of the fluids original natural surroundings. For example, embodiments of the present invention may be utilized in transporting water from remote and pristine regions of the Earth. In such applications, various natural features of these regions, such as natural soils and clays, may be incorporated into in the towed vessel 10. U.S. Provisional Patent Application 61/251,912 to Szydlowski, which is hereby incorporated by reference in its entirety, discloses various benefits of naturally occurring soils when used for water filtration purposes.

Figure 4:
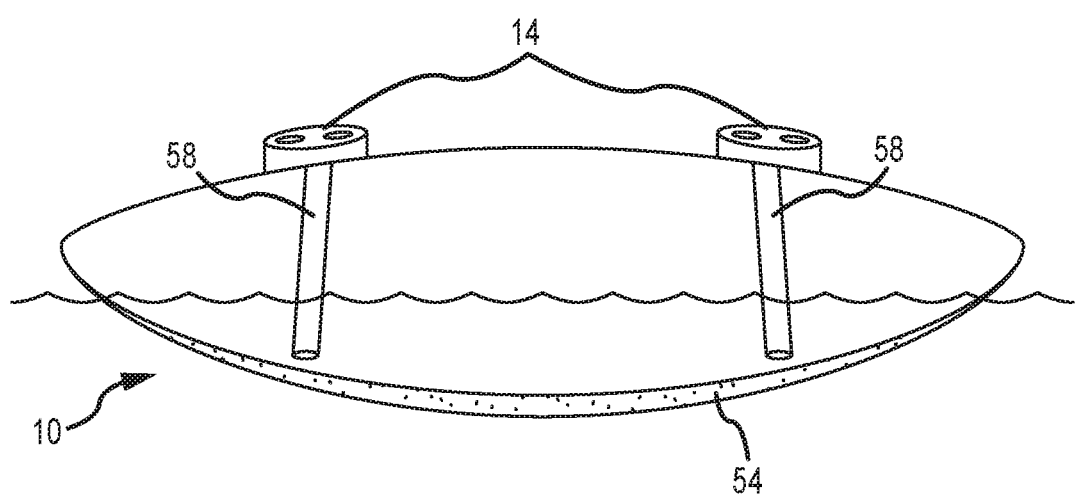
FIG. 4 is a cross-sectional side elevation view of a towed vessel suitable for transporting liquids according to one embodiment.

In applications where water to be transported is desired for its natural characteristics, including purity, mineral content, and other attributes, it is often desirable to maintain those characteristics throughout filling, transporting, and emptying a vessel 10. Accordingly, the present invention contemplates various means to preserve purity of a transported fluid, particularly when polyurethane, polyethylene, XR-5 vinyl plasticizer, woven cloth, and other materials are employed as the structure of a vessel 10. As shown in FIG. 4, natural sediment 54 may be deposited within a towed vessel 10 which may act to isolate vessel contents from an inner surface of the vessel 10 as well as provide for filtration of the vessel contents upon entrance or exit from the vessel 10. Natural sediment 54 may be comprised of a variety of known soils, preferably those indigenous to the source of the water or fluid to be transported. For example, native clay minerals may be disposed within a vessel 10 to serve this function. Those of skill in the art will recognize the benefits offered by clay, including, but not limited to, its ability to isolate fluids from a vessel's inner surface and its effectiveness in filtration.

In one embodiment, the vessel 10 may comprise a coating on the top of the bag that is UV resistant to protect the integrity of the vessel's 10 material and vessel's contents. For example, Tedlar may be used on the top of the vessel 10.

In addition to acting as an isolating barrier between fluid to be transported and at least a portion of vessel's inner surface, the sediment 54 may also be useful in filtering fluids contained within the vessel 10. For example, where emptying of the vessel 10 is accomplish by connecting vacuum powered means to ports 14, sediment 54 may be allowed to be drawn toward the ports 14. In one embodiment, this may be accomplished through the use of one or more flexible tubes or conduits 58. Upon reaching the ports 14, the sediment 54 may be allowed to be trapped by any number of known filter devices. Such filter devices may include, for example, various mesh screens which may trap sediment particles and create a sedimentary filtration mechanism at an outlet 14 of the vessel 10.

In addition to or in lieu of depositing a layer of sediment 54 within a vessel 10, the interior surface area of a vessel 10 may be coated with a substance known to preserve the integrity and purity of fluid to be transported. Various coating methods and substances are known and described in, for example, U.S. Pat. No. 6,808,808 to Freeman et al., which is hereby incorporated by reference in its entirety. One embodiment of the vessel 10 includes a surface generally known as Sharklet™, which inhibits bacterial survival, growth, transfer and migration through pattern alone. Specific patents and publications describing the Sharklet surface technology are listed above.

In various embodiments of the present invention, coatings are utilized on a bottom portion of a vessel 10. For example, where vessels are required to be towed into shallow water ports, a risk of puncture or tear to the bottom of the device 10 may be present. Accordingly, an abrasion and tear resistant material comprises at least a lower portion of the vessel 10. For example, various different Teflon fabrics may comprise or be added to a bottom portion of a vessel 10 to avoid unwanted tearing. Additionally, the bag should be made of a material or have a coating or layer that prevents puncturing of the bag by animals, ice, boats, rocks, etc.

Figure 5:
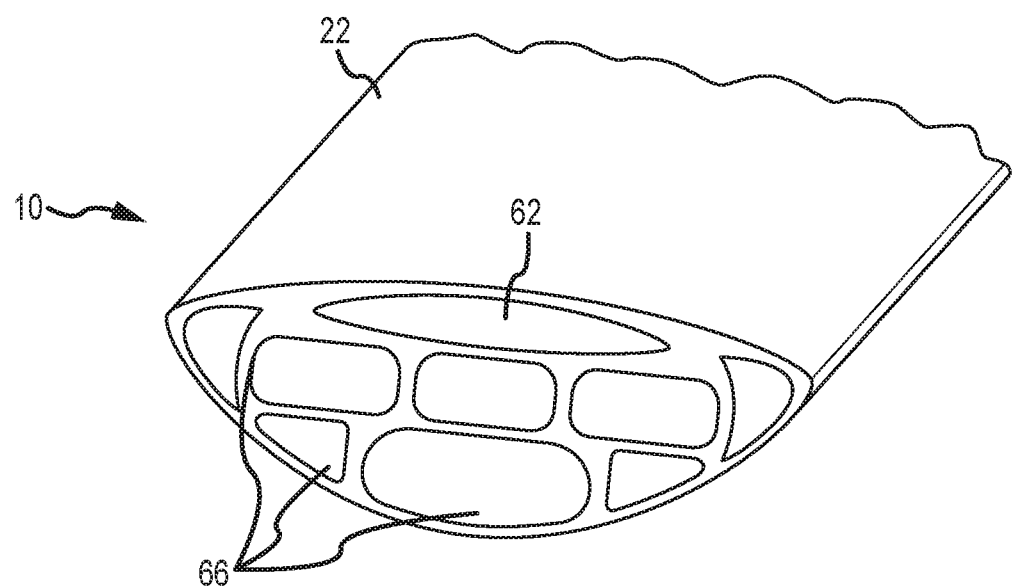
FIG. 5 is a cross-sectional perspective view of a towed vessel suitable for transporting liquids according to one embodiment.

FIG. 5 is a cross-sectional perspective view depicting one embodiment where a towed vessel 10 is comprised of various different internal compartments. Embodiments of the present invention may include, for example, a bladder 62 which may be used to provide buoyancy for the vessel 10 as well as assist in maintaining the vessel 10 in a substantially upright position. In addition to a bladder 62, embodiments of the present invention may further comprise various compartments 66 within a larger vessel body 22. Various sizes and shapes of additional compartments 66 may be useful, for example, where a variety of different fluids are to be transported and comingling of these fluids is undesirable. Embodiments of the present invention comprising multiple internal compartments 66 allow for the simultaneous transport of, for example, fresh water, juice, wine, and a variety of other fluids. To allow access to various different compartments 66, embodiments of the present invention provide for a variety of ports 14 which allow for exclusive access to specific compartments 66. For example, each compartment 66 may have its own port 14. Ports 14 may be connected to compartments 66 through previously described flexible tubes or conduits. Embodiments of the present invention further contemplate marking systems to identify which ports 14 are associated with which compartments 66. For example, where cross-contamination of ports 14, associated tubes or conduits 58, and compartments 66 is undesired (i.e., where one or more port 14, conduit 58, and compartment 66 should be used only for a single type of fluent cargo), marking means such as text and color indicators are provided on a portion of the port 14 or vessel structure 22 to indicate to a user which materials should or should not be associated with a port 14. Those of skill in the art will recognize that the present invention is not limited to any number, sizes, or types of internal compartments 66. Indeed, the present invention contemplates the use of a single internal volume within a towed vessel as well as numerous compartments 66.

In one embodiment of the present invention, a towed vessel 10 further comprises mooring devices or means for attaching to mooring devices. For example, a towed vessel 10 includes fasteners, rigid members, and/or connecting devices to allow for a towed vessel 10 to be moored. Devices, and rigid members which may be connected to various portions of a mooring device include those disclosed in U.S. Patent Application Publication No. 2004/0157513 to Dyhrberg and U.S. Pat. No. 4,627,375 to Davis et al., which are hereby incorporated by reference in their entireties, and other similar known mooring devices. Including mooring devices as part of a towed vessel 10 or, alternatively, providing means to attach a towed vessel 10 to various mooring devices allows for the ability to fill or empty devices of the present invention in a number of locations or orientations, store the towable vessel 10 in a docked or off-shore location, and generally stabilize the structure 10 when transport is not desired.

Figure 6:
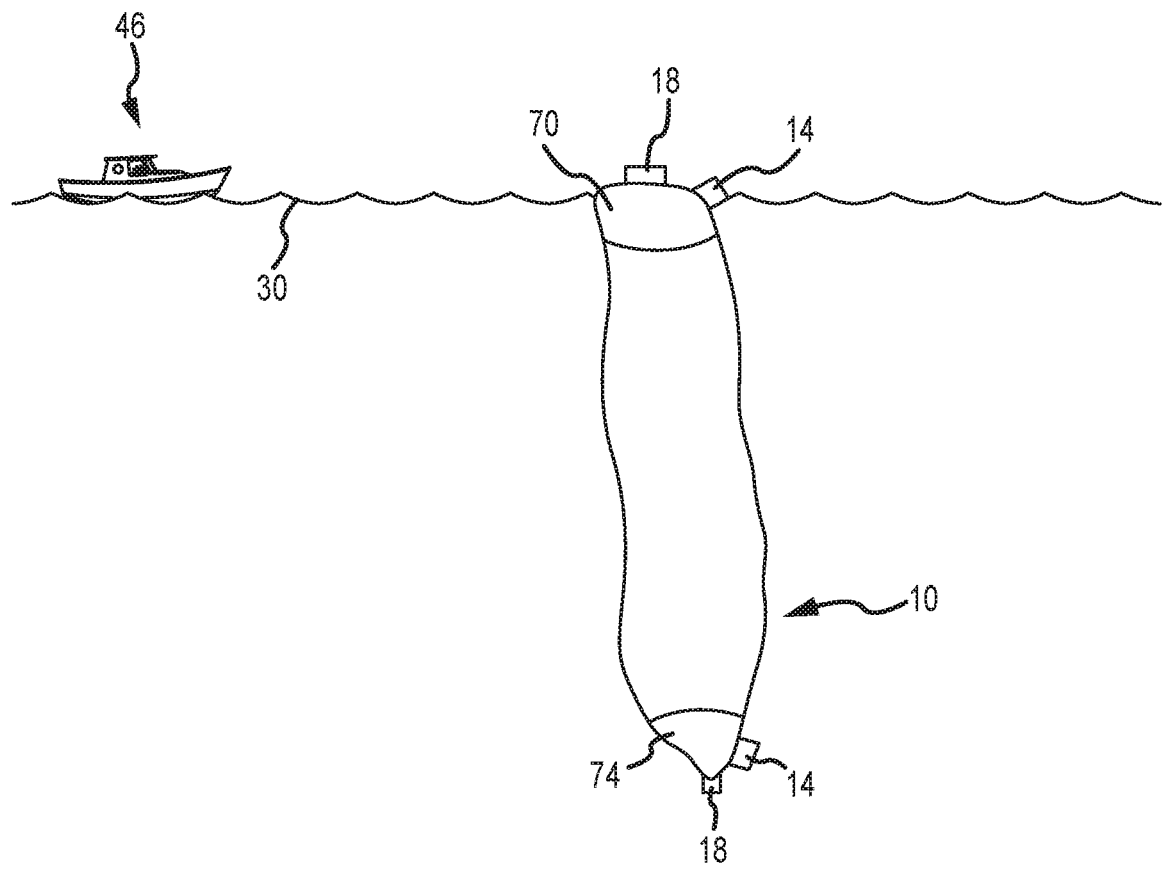
FIG. 6 is a side elevation view of a towed vessel suitable for transporting liquids according to one embodiment.

Referring now to FIG. 6, one embodiment of the present invention is shown for storing a towed vessel 10 in a marine environment in a substantially vertical position with respect to a water line 30. Other vessels 46 may use means described herein to locate or avoid the towed vessel 10. In one embodiment, the present invention is capable of carrying up to 1,000,000 m³ of bulk water. Accordingly, those of skill in the art will recognize that such an object, particularly when oriented in a generally horizontal position, will occupy a significant surface area. In one embodiment, the vessel 10 may be over 700 meters long. Therefore, one embodiment of the present invention contemplates devices and methods for storing a towed vessel 10 in a generally vertical position with respect to a water line 30. A first portion 70 of a towed device is inflated or similarly experiences an increase in buoyancy while an additional portion 74, preferably disposed at the distal longitudinal end, is filled with water or similarly experiences a decrease in buoyancy/density. In this manner, the device 10 may be allowed to float on-end and occupy substantially less volume than it would if docked or allowed to remain horizontal. In one embodiment, the contents and associated buoyancy of compartments 70, 74 are varied and/or controlled by one or more one-way or two-way valves 14. For example, compartment 74 may be filled with water via the control of valve 14. The volume of water taken in by valve 14 is then allowed to cool due to its position in a deeper portion of a body of water which is known to generally be colder than areas disposed closer to the surface 30. In one embodiment, valve 14 comprises a two-way valve capable of dispelling water from a compartment 74 and facilitating the repositioning of the device 10 to a surfaced position.

In an alternative embodiment, a towed vessel 10 may be stored in a generally vertical position either when it is an emptied or full state. Such a device is capable of being attached to various fixed and/or floating objects (e.g., mooring devices, which includes buoys) via a reinforcing member 18, while a distal end of the device 10 is allowed to sink. In one embodiment, the distal end is allowed to sink by decreasing the buoyancy of a portion 74 of the vessel 10 through the addition of water, sand, ballast, etc., which is further capable of being expelled from the device via two-way valve 14 in order to restore the vessel 10 to a generally horizontal position.

Figure 7:
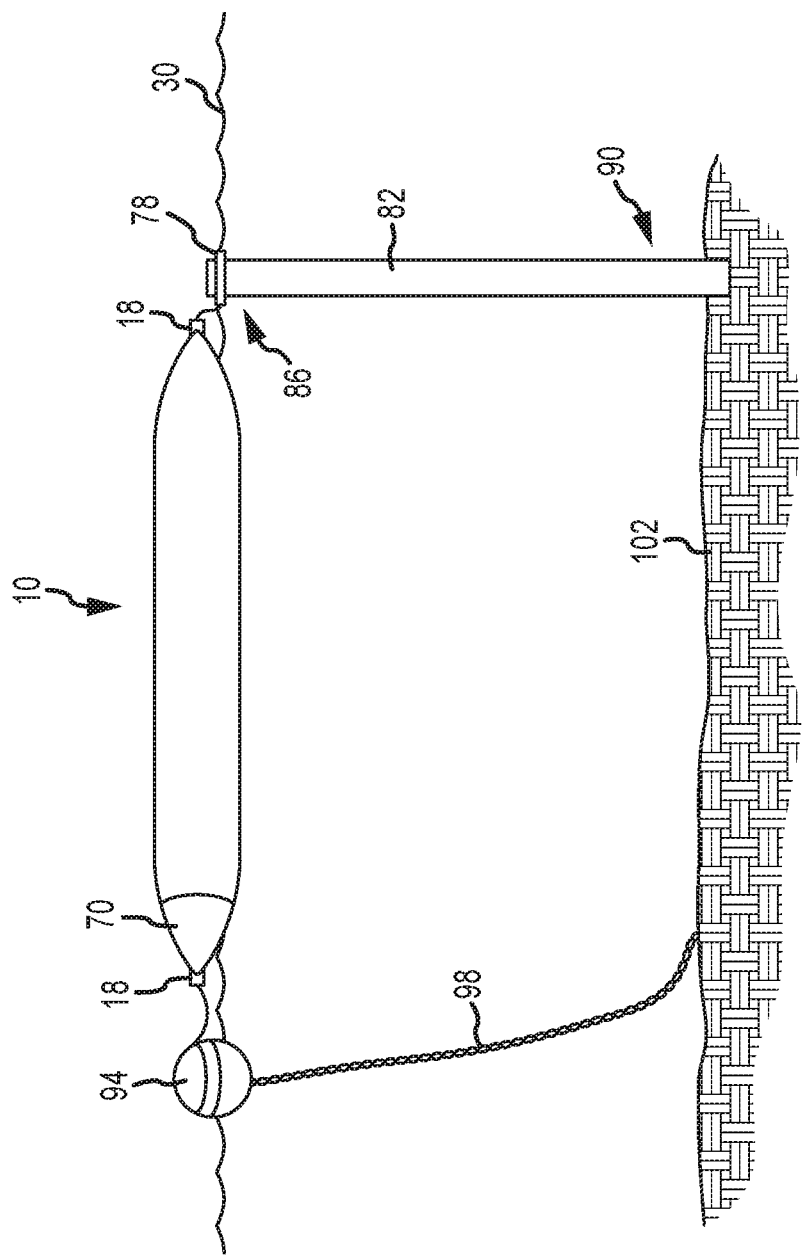
FIG. 7 is a side elevation view of the present invention according to one embodiment.
Figure 8:
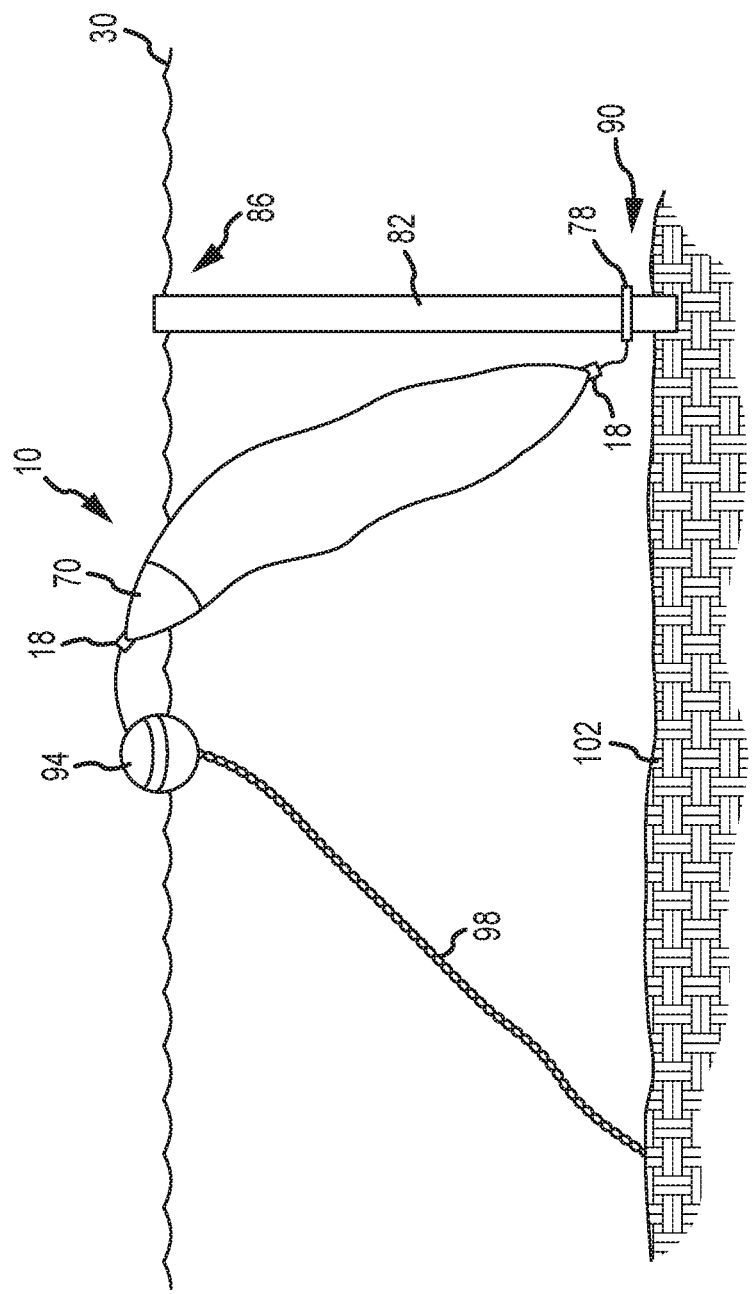
FIG. 8 is a side elevation view of the present invention according to one embodiment.

Referring now to FIGS. 7-8, a towed vessel 10 and associated storage means are depicted. When a vessel 10 is to be stored, a reinforcing member 18 may be attached to a securing device, such as a mooring buoy 94 and associated anchor line/chain 98 which may be securely fixed to a floor 102 of a marine environment. Additionally, a second end may be secured to a translatable device 78 positioned on a fixed member 82. Thus, in one embodiment, the vessel 10 resides at the surface 30 of a body of water in a substantially immobile position when the translatable device 78 is located at or near a surface position 86. Towed vessels 10 of the present invention may be selectively positioned in a substantially vertical position by translating the translatable device 78 along a vertical length of the fixed member 82 so that the translatable device 78 and second end of the vessel 10 is disposed in a submerged position 90. One of skill in the art will recognize that mooring devices 94, 98 of embodiments of the present invention, although generally fixed, may be free to translate within a given radius. Thus, when one end of a vessel 10 is submerged, an end attached to a mooring buoy 94 may reposition itself to a location proximal to the fixed member 82, thus allowing the vessel 10 to reside in a substantially vertical position for storage. The vertical positioning of vessels 10 of the present invention may be facilitated by the inclusion of a portion 70 of the vessel 10 which retains a sufficient amount of buoyancy so as to prevent the entire vessel 10 from sinking. Alternatively, mooring buoys 94 of the present invention may comprise sufficient buoyancy to support a load applied by a partially submerged vessel 10.

Vertical positioning devices 82 of the present invention may comprise various known devices useful in the linear translation of objects. For example, worm gears adapted for use in translating associated nuts, pulley systems, hydraulic jack or elevator devices, rail actuators, and various other known devices useful for translating a device 78 between a raised 86 and lowered 90 position may be incorporated into embodiments of the present invention.

Figure 9:
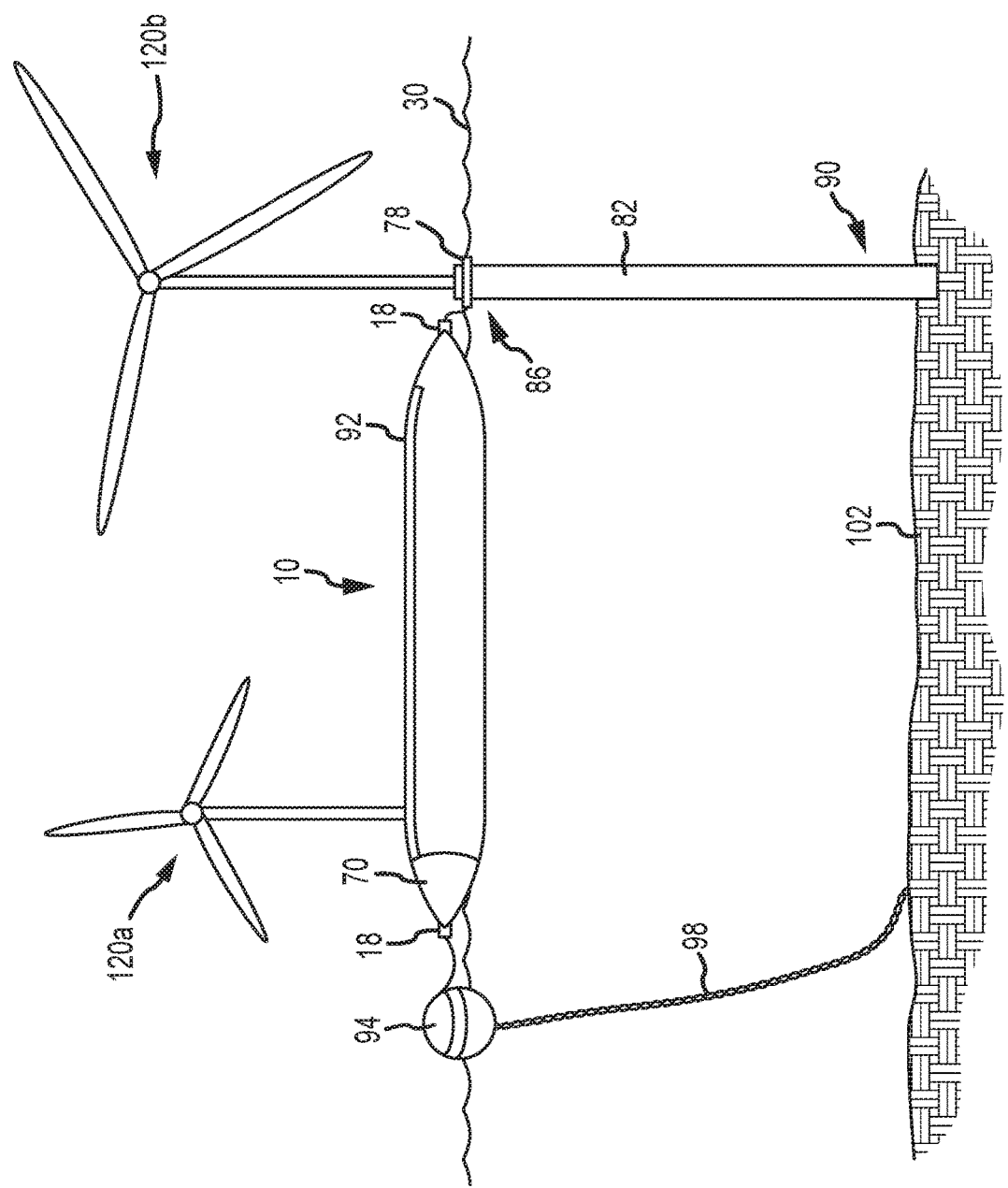
FIG. 9 is a side elevation view of an embodiment of a towed vessel in an anchored position.

FIG. 9 shows a towed vessel 10 with solar cells 92 on a top surface of the vessel 10. The solar cells 92 may be photovoltaic solar cells in one embodiment and allow the vessel 10 to collect solar energy for various functions, as described above. Thus, the vessel 10 may have photovoltaic cells 92 on a surface to convert solar energy to electrical power that may be utilized on-board a tug 46 or towing vessel. The towable vessel 10 may also comprise a windmill 120a to collect wind energy for uses described above. The vessel 10 may only have solar cells 92 in one embodiment, may only have a windmill 120a in another embodiment, or may have both solar cells 92 and one or more windmills 120a in a further embodiment. In some embodiments, the vertical positioning device 82 may comprise a windmill 120b. Any windmill 120 known in the art may be use.

The following references disclose windmills and wind technology and are hereby incorporated by reference herein in their entireties to provide written description and enablement support: U.S. Patent Application Publication No. 2013/0230396 to Wakasa; U.S. Pat. No. 8,522,707 to Shiban; U.S. Patent Application Publication No. 2013/0217822 to Hofmann; U.S. Pat. No. 8,508,065 to Lee; U.S. Patent Application Publication No. 2013/0202435 to Beaudoin; and U.S. Pat. No. 8,496,423 to Springett.

Figure 10:
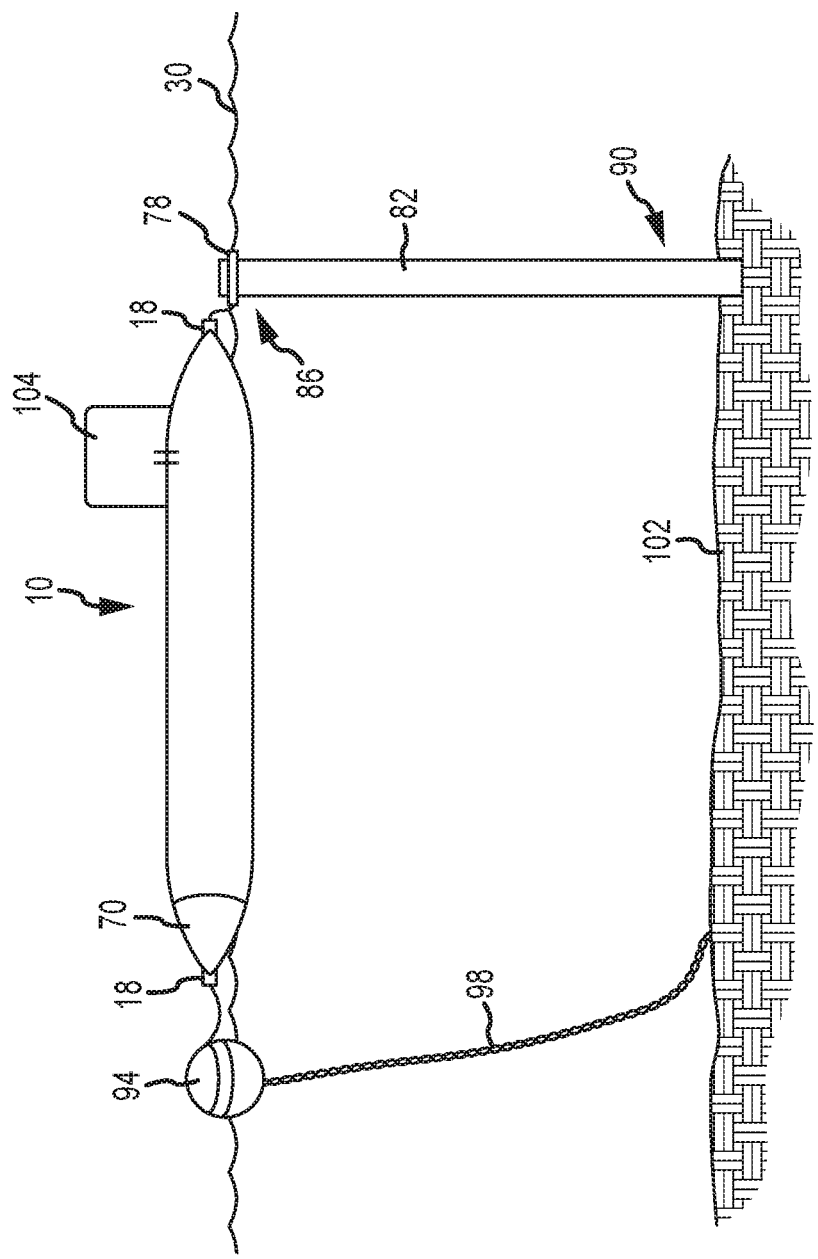
FIG. 10 is a side elevation view of another embodiment of a towed vessel in an anchored position.

FIG. 10 shows a towed vessel 10 with a purification/filtration system 104. The purification system 104 may treat the liquid or water in the vessel 10 by circulating the water or liquid through a port interconnecting the contents of the vessel 10 and the purification system 104. The purification system 104 may operate continuously or on an as-needed basis, which may be determined by sensors within the vessel 10. In an alternate embodiment, the purification system 104 may only treat the liquid as it is exiting the vessel 10, i.e., as a boat or vessel 46 takes water from the towable vessel 10. The purification system 104 may be powered by solar energy, wind energy, or any other means described herein or known in the art. Thus, in one embodiment, the vessel 10 may comprise solar cells 92 or a windmill 120 to power the purification system 104.

Figure 11:
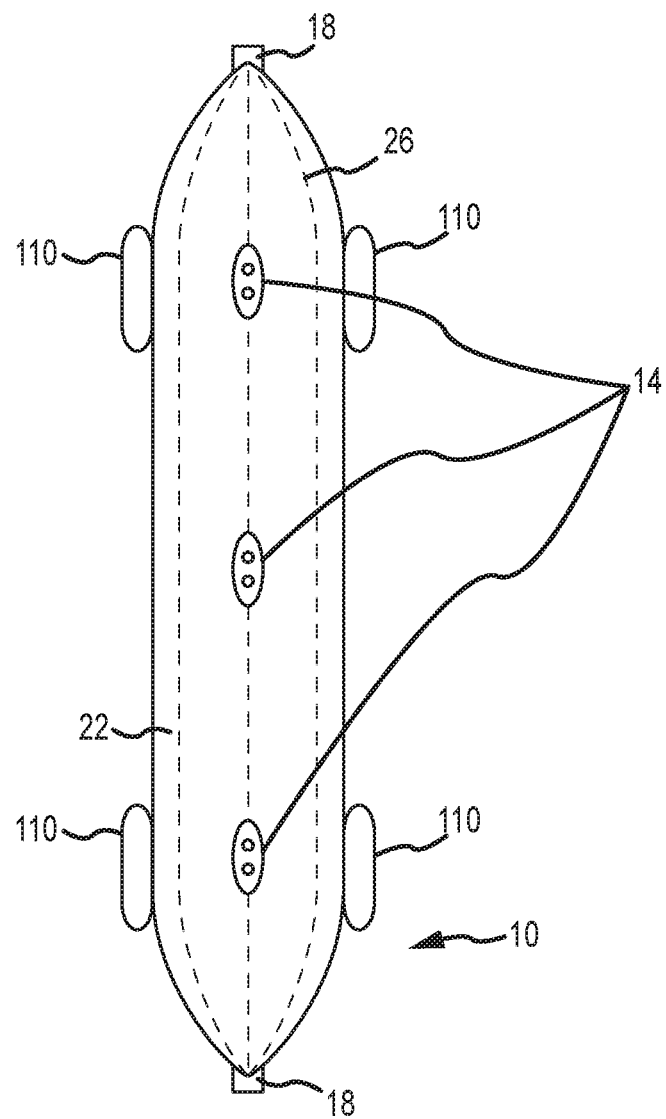
FIG. 11 is a top plan view of an embodiment of a towed vessel with drones.
Figure 12A:
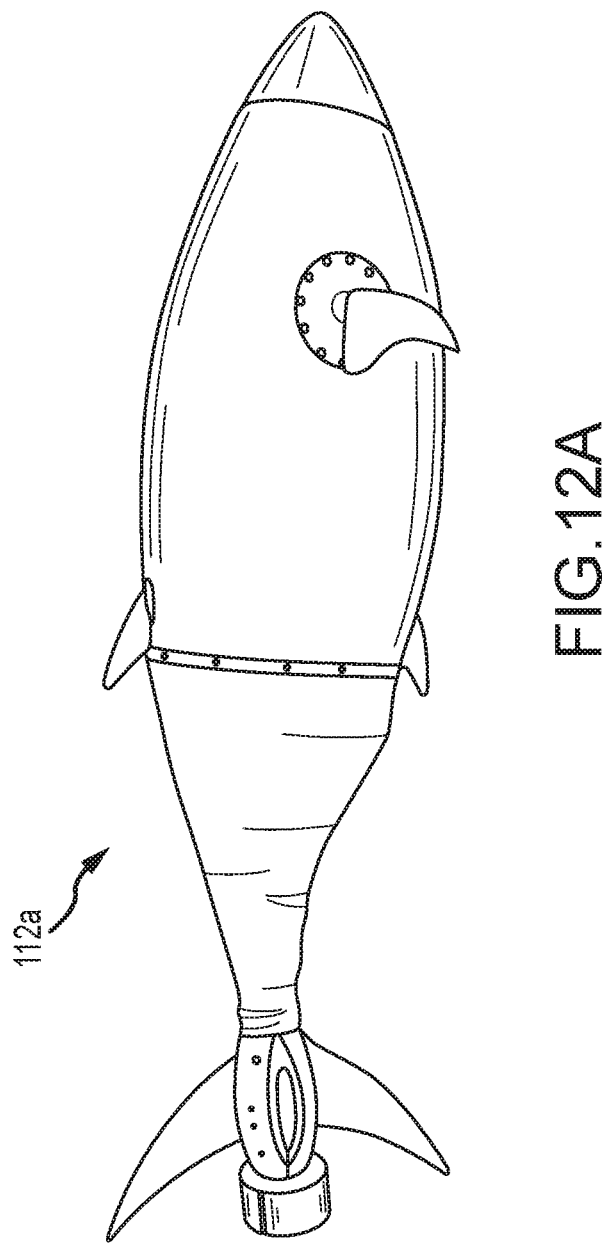
FIGS. 12A-E are embodiments of water drones.
Figure 12B:
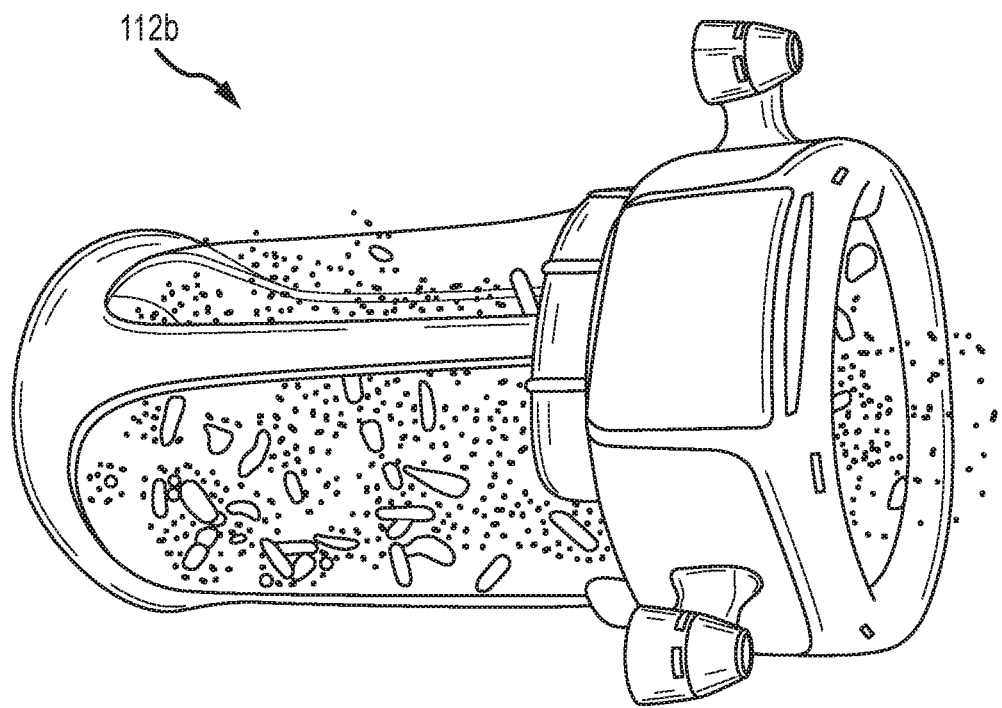
Figure 12C:
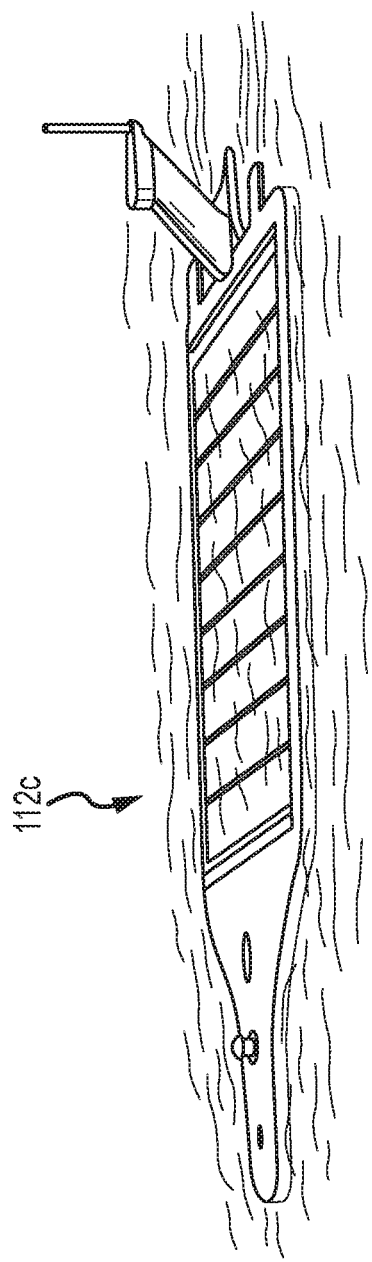
Figure 12D:
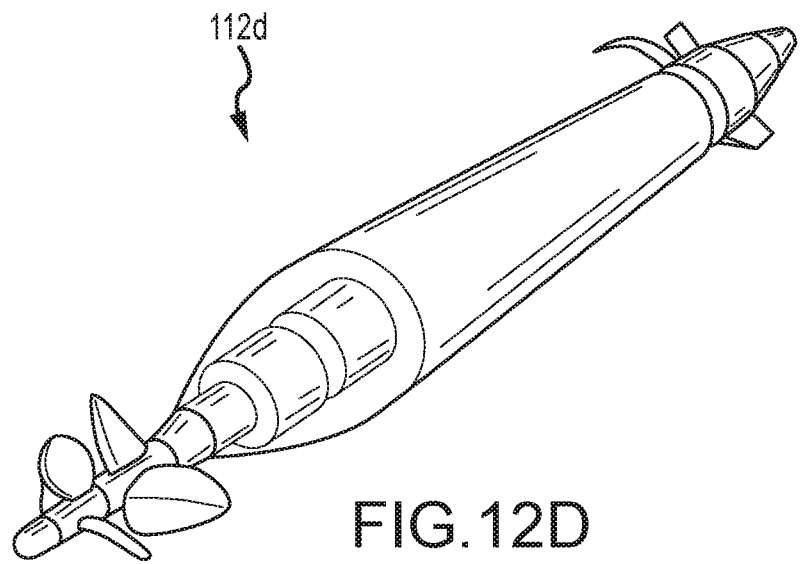
Figure 12E:
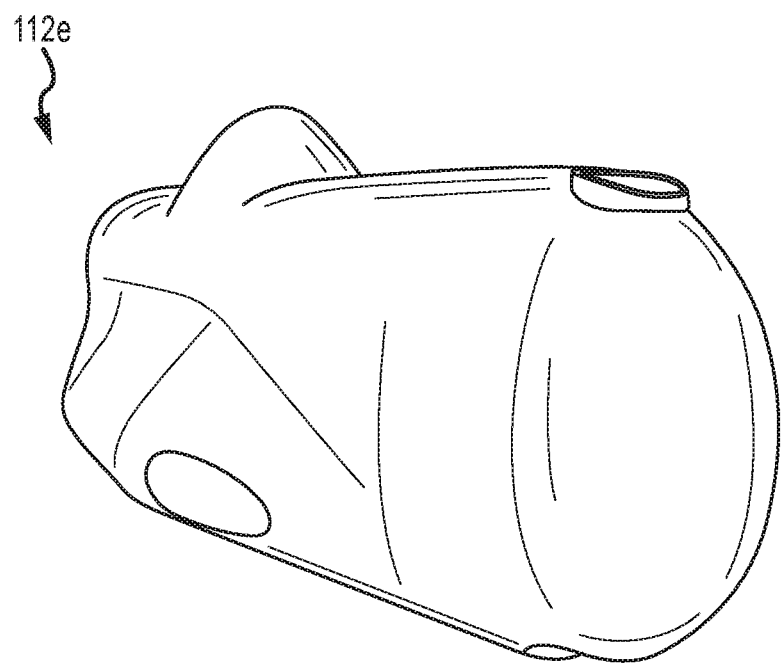

FIG. 11 shows a towed vessel 10 with drones 110 secured thereto. The drones 110 may comprise an engine and propulsion mechanisms to maneuver the vessel 10. The drones 110 may also have sensors, a positioning system, and a control system that is remotely operated. Any known water drones may be used in embodiments of the present invention. For example, various water drones 112a-e, as shown in FIGS. 12A-12E, may be used.

Figure 13:
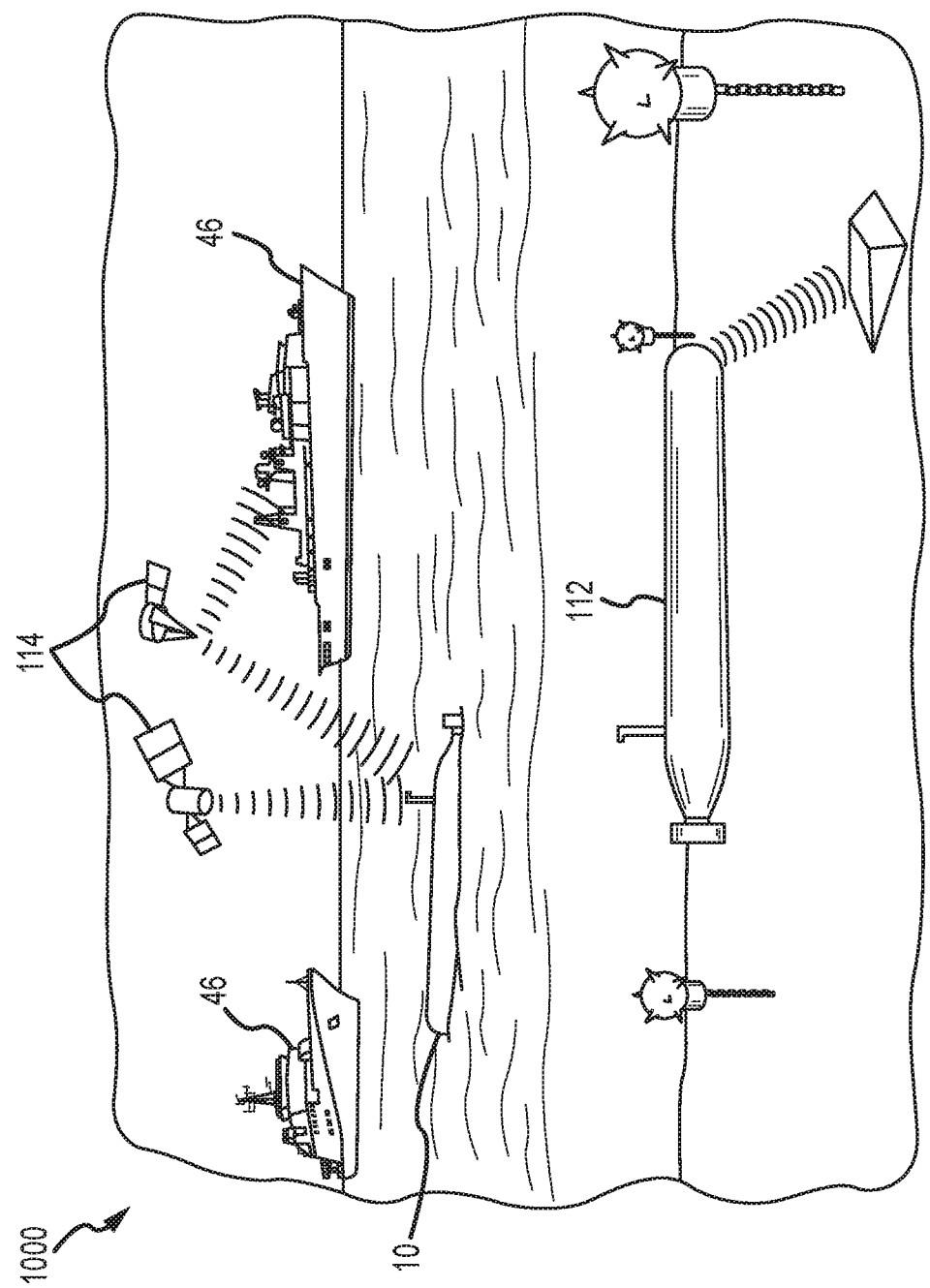
FIG. 13 is an embodiment of a water transporting system.

FIG. 13 shows one embodiment of a water transport system 1000. The system 1000 may comprise towable vessels 10, drones 110, 112, and satellites 114 to transport, position, locate, and track water or other liquids across the world.

Figure 14:
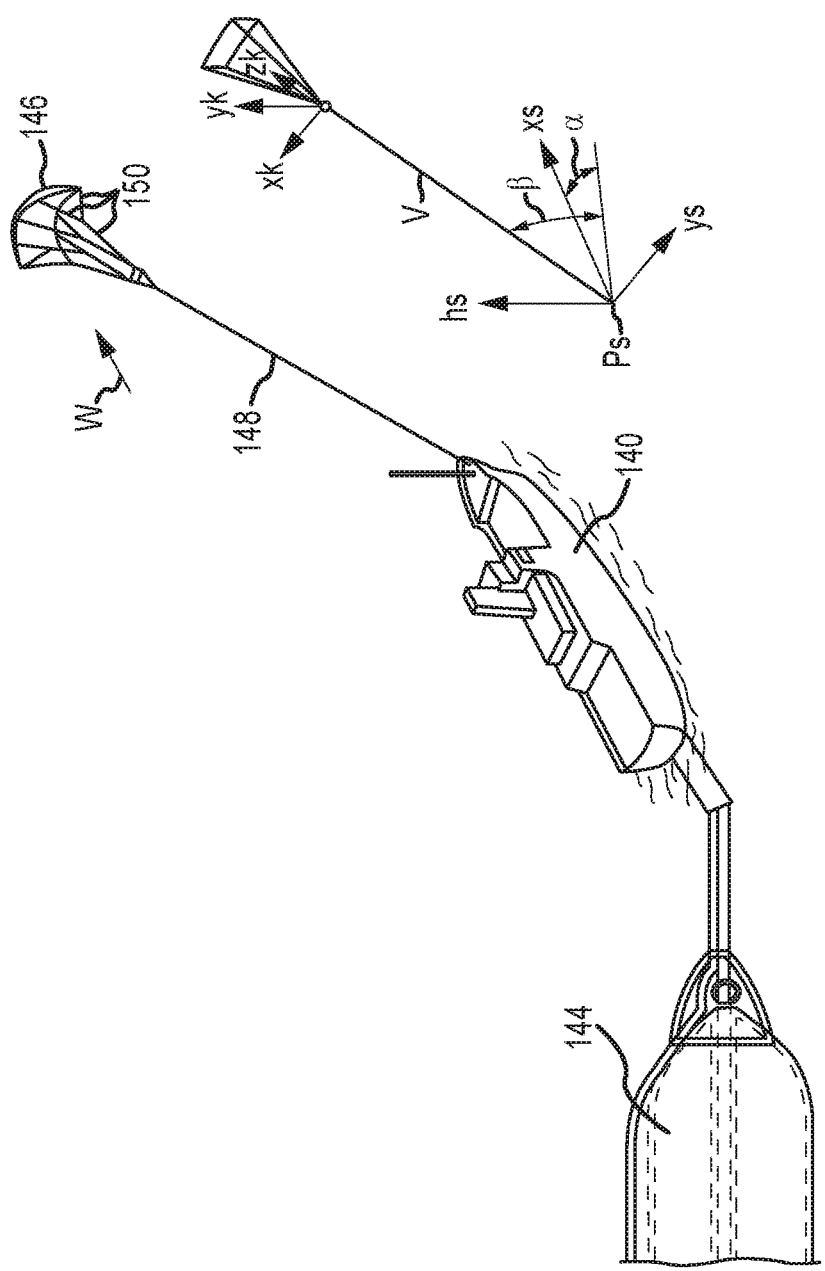
FIG. 14 is an embodiment of a towing vessel with a sail towing a towed vessel.

FIG. 14 depicts one embodiment of a water transport system 1000 comprising a first towing vessel 140, a VLB 144, and at least one additional propulsion device 146. As shown in FIG. 14, the VLB 144 is a bag or towable vessel, such as those described herein. The additional propulsion device 146 provided in FIG. 14 comprises a kite or sail feature for wind-powered propulsion of the first towing vessel 140 and VLB 144. In various embodiments, propulsion device 146 comprises an auxiliary propulsion source, provided primarily to aid in propulsion and increase the efficiency of the transport system 1000. It will be recognized that where propulsion device 146 is deployed, a propulsion force translated via tension cord 148 and connection chords 150 to first vessel 140 will reduce the fuel/power demands of the first vessel 140. U.S. Pat. No. 8,506,739 to Gautier discloses a method of producing sails and is incorporated by reference herein in its entirety.

Figure 15:
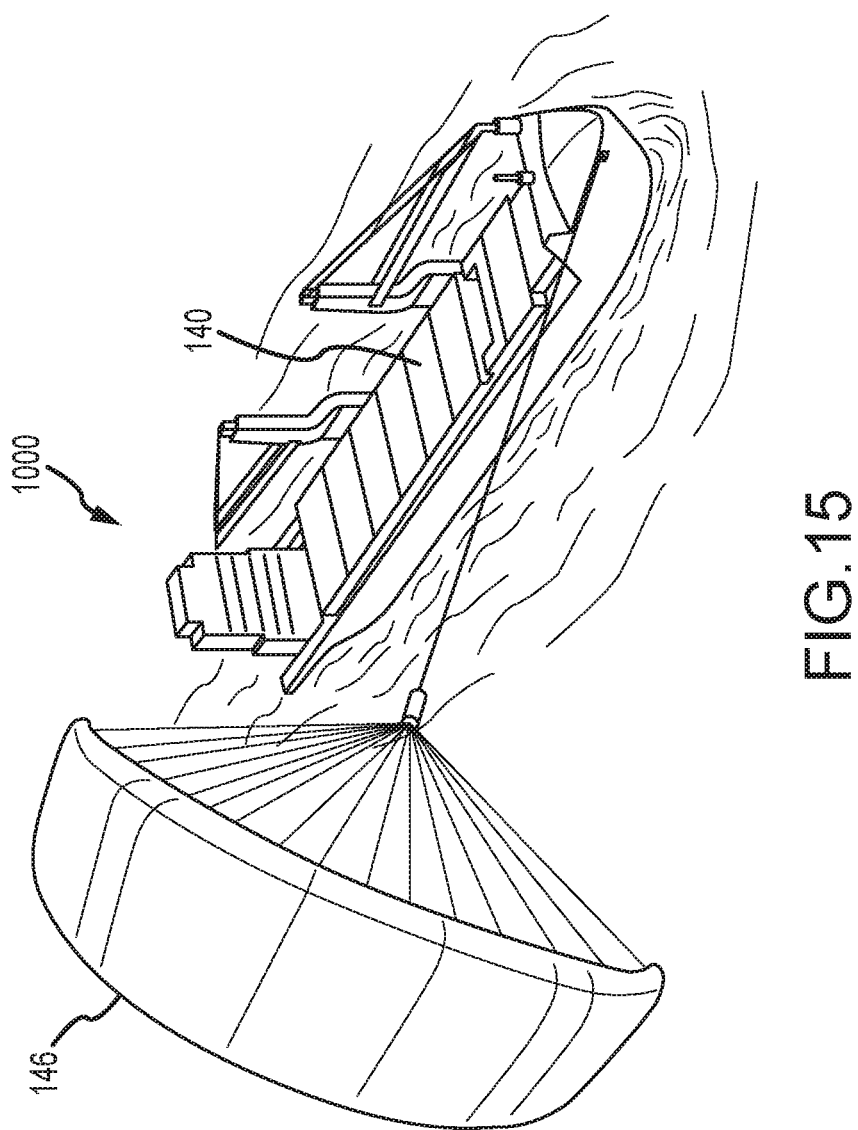
FIG. 15 is an embodiment of a towing vessel with a sail.

FIG. 15 depicts a second embodiment of a water transport system 1000 comprising a first towing vessel 140 and at least one sail 146.

Figure 16:
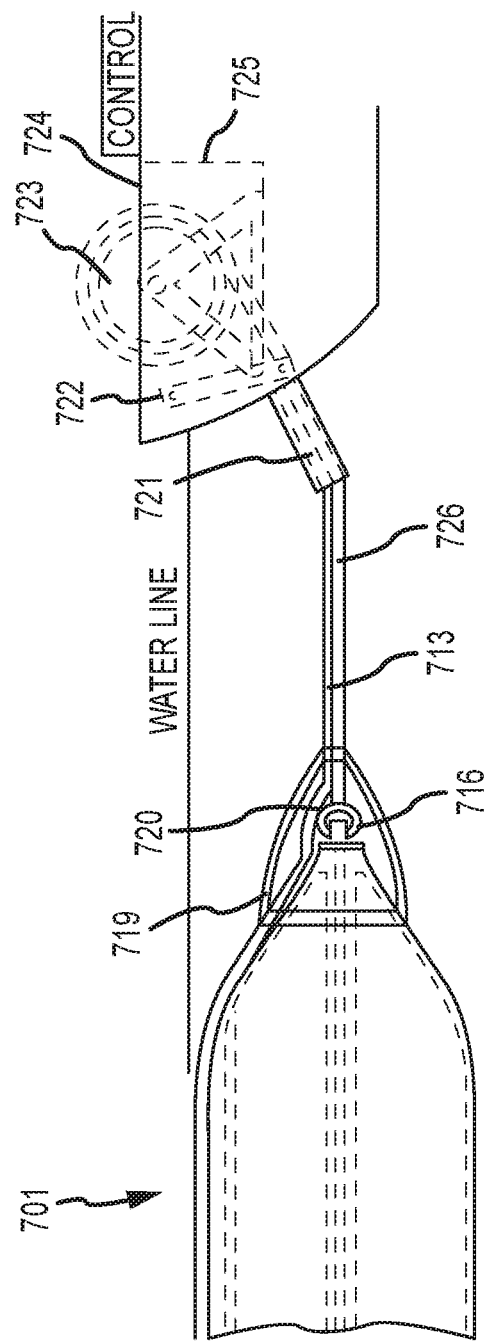
FIG. 16 is an embodiment of a towing vessel and a towed vessel.

In one embodiment of the present invention, water is transported in a large water bag. Such bags are made of a suitable material, such as plastic, rubber, nylon, combinations thereof, and the like, and can vary in size depending on the amount of water being transported. Such bags have the advantage of not altering the quantity or characteristic of the water contained therein. To transfer water using such devices, the bags are filled with the water to be transported, sealed and then transferred to the final destination. Any method of moving such bags can be employed. A particularly useful method is to tow such bags through the ocean, rivers, or lakes using ships, barges, tankers, boats, and the like. In one embodiment, unmanned GPS-guided boats tow the bags. Other space-based and terrestrial guidance systems may also be used to guide vessels towing such bags. In some embodiments, the vessels operate autonomously. In still other embodiments, the vessels operate autonomously but can receive updated commands and instructions from remotely located operators. Such transport mechanisms would reduce the cost associated with a crew. FIG. 16 is a side view of a towing and attachment arrangement for a transporter embodiment.

Figure 17:
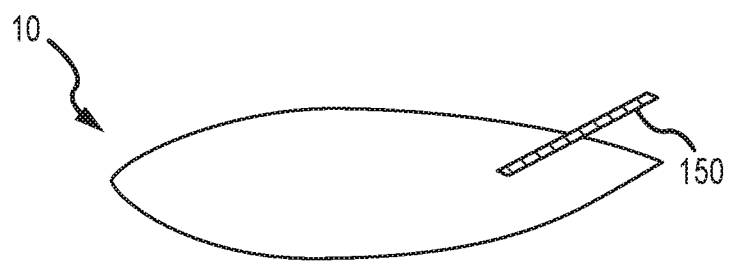
FIG. 17 is a cross-sectional side elevation view of a towed vessel suitable for transporting liquids according to one embodiment.

FIG. 17 shows a towable vessel 10 with a straw-like draining mechanism 150. The straw 150 allows liquid to be removed from the bag. The vessel 10 may also comprise pumps and vacuums to suck liquid out of the bag more quickly. In another embodiment, a plurality of straws 150 may be used to evacuate the liquid quicker.

Figure 18:
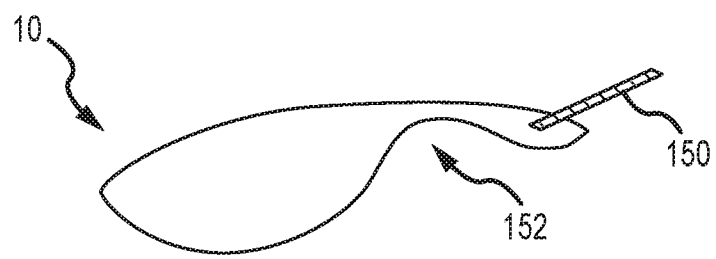
FIG. 18 is a cross-sectional side elevation view of a towed vessel suitable for transporting liquids according to one embodiment.

FIG. 18 shows the vessel 10 with a fold 152 and a straw-like draining mechanism 150. The vessel 10 may purposefully be folded to increase the pressure of the contents within the vessel 10 such that the liquid is evacuated quicker than without the fold 152. In other embodiments, the straw 150 may be a mechanism to release liquid in the vessel 10 and thus reduce the internal pressure of the vessel 10 if the vessel should get a fold 152. Air inlets may also be included in the vessel 10 to increase the speed of the liquid evacuation.

Figure 19:
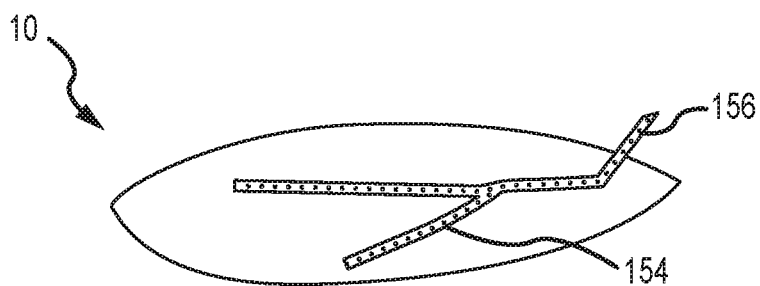
FIG. 19 is a cross-sectional side elevation view of a towed vessel suitable for transporting liquids according to one embodiment.

FIG. 19 shows a vessel 10 with a French drain 154. The French drain 154 may comprise more than one draining member along the interior of the vessel 10. The French drain 154 also has an outlet 156 to allow the liquid to exit the vessel 10.

Figure 20:
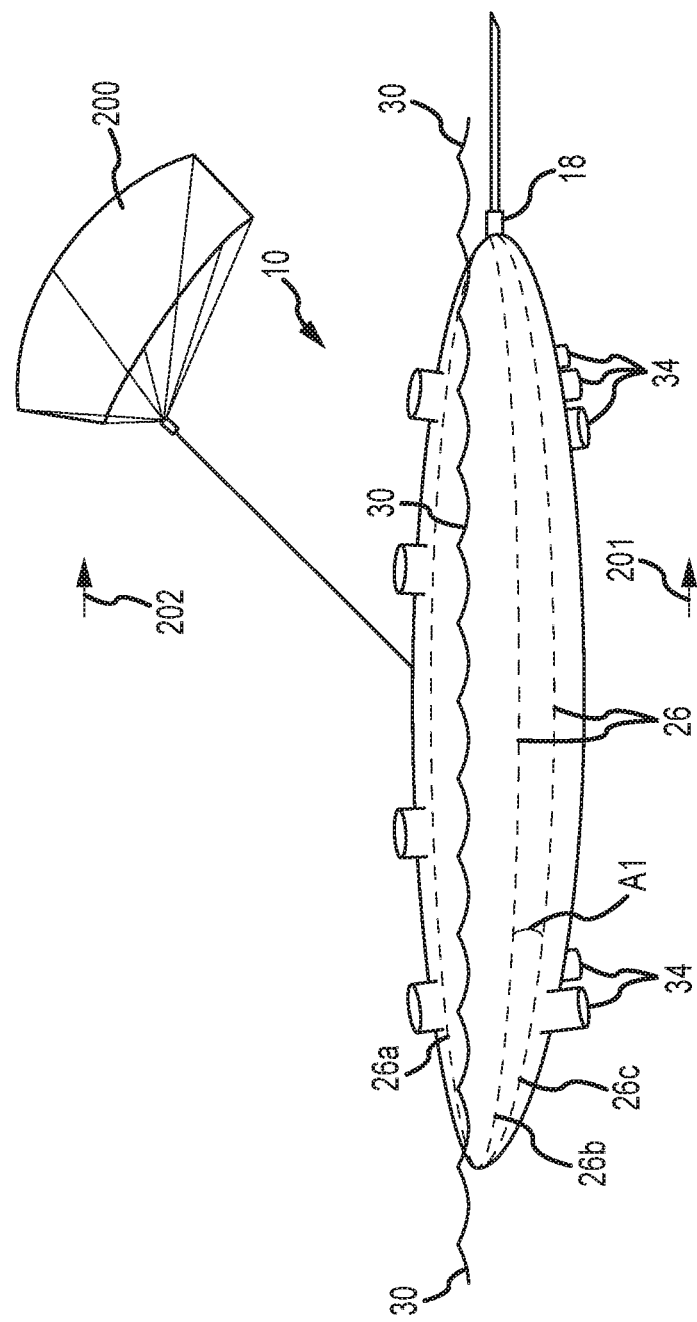
FIG. 20 is a side perspective view of a towed vessel suitable for transporting liquids according to one embodiment.

FIG. 20 shows a vessel 10 being towed. An arrow 201 shows the direction of travel of the vessel 10. The vessel 10 may comprise a sail 200 that uses wind, shown by arrow 202, to further assist in the towing of the bag. The sail 200 may function similar to a sail on a sail boat and catch the wind 202 to pull the vessel 10.

Figure 21:
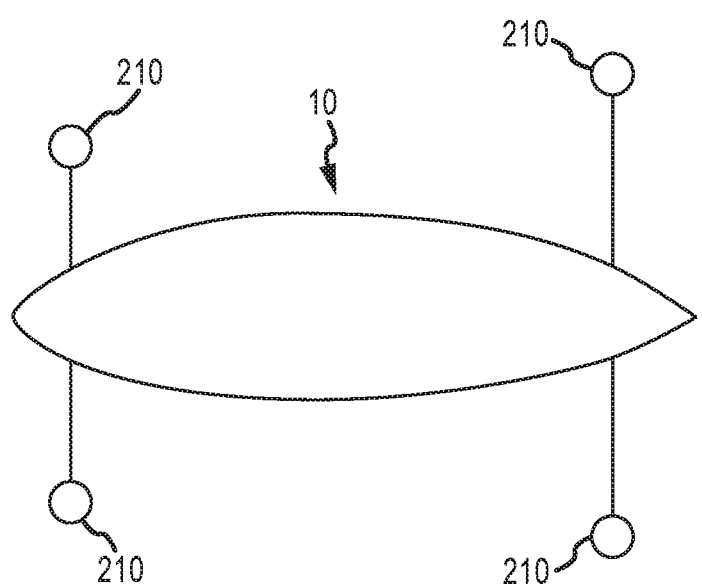
FIG. 21 is a top plan view of a towed vessel suitable for transporting liquids in a stationary and secured position according to one embodiment.

FIG. 21 shows a towable vessel 10 filled with a liquid and secured by 4 ocean buoys 210. The 4 ocean buoys 210 keep the vessel 10 in the same location and do not allow the vessel 10 to rotate onto its side.

Figure 22:
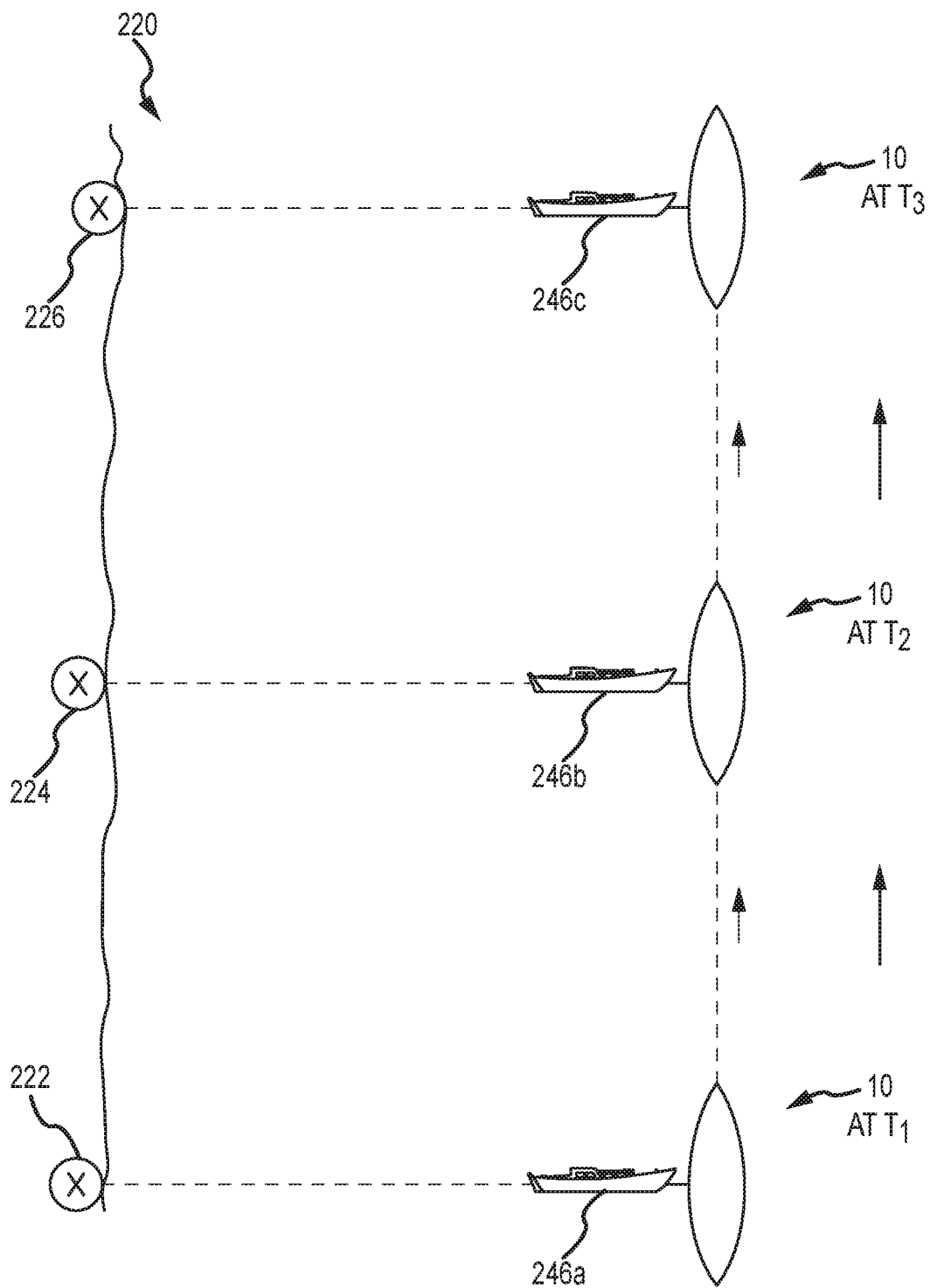
FIG. 22 shows a moving vessel transporting liquids according to one embodiment.

FIG. 22 shows one embodiment of a water transport system 220. In the system 220 shown, three cities or ports 222, 224, 226 need fresh water. The towable vessel (VLB) 10 comprising fresh water travels along a coast line. At time T1 the VLB 10 is proximate to a first city 222. A first boat or other vessel 246a travels from the first city 222 to the VLB 10. At time T1 the first boat 246a gets fresh water from the VLB 10 and then returns to the first city 222. The entire time the VLB 10 is moving at approximately 3 knots (the direction of travel is shown by the arrows). At time T2 the VLB 10 is proximate to a second city 224. A second boat or other vessel 246b travels from the second city 224 to the VLB 10. At time T2 the second boat 246b gets fresh water from the VLB 10 and then returns to the second city 224 with the fresh water. At time T3 the VLB 10 is proximate to a third city 226. A third boat or other vessel 246c travels from the third city 226 to the VLB 10. At time T3 the third boat 246c gets fresh water from the VLB 10 and then returns to the third city 226 with the fresh water.

In some embodiments, solar-powered mooring stations for VLB water islands are provided. Similar to the example shown in FIG. 22, boats or vessels may come to a stationary VLB water island to get water. The VLB water island may have solar cells or windmills to collect solar and/or wind energy. Thus, the boats may use the VLB water islands as a sea anchor, a docking station, a charging station, and a fresh water source.

Figure 23A:
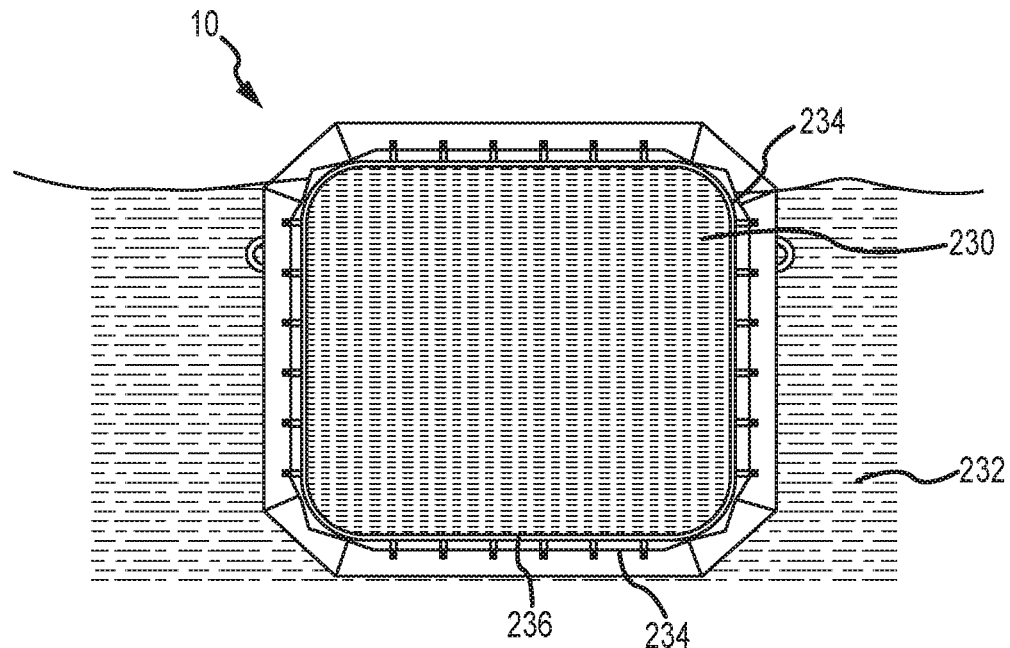
FIGS. 23A-B show a vessel comprising two liquids of different densities according to one embodiment.
Figure 23B:
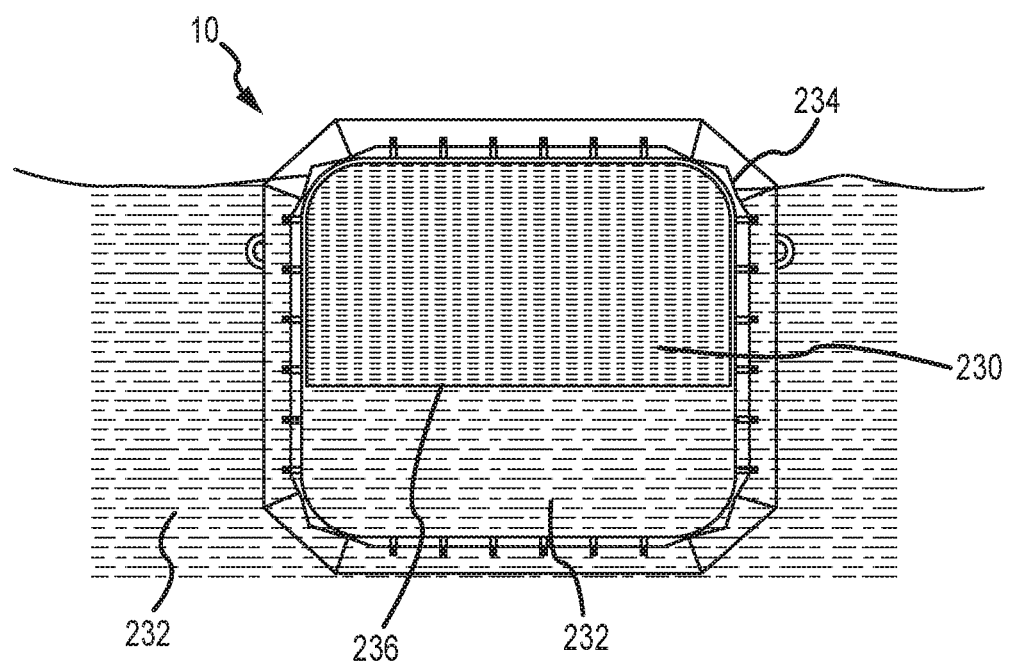

FIGS. 23A-B show a VLB 10 being filled with salt water 232 to push the fresh water 230 to the top of the bag because fresh water 230 is approximately 2.5% lighter (i.e., less dense) than salt water 232 and thus floats on salt water 232. Membranes 234, 236 within the VLB 10 may be used to keep the salt water 232 separated from the fresh water 230. Additionally, the salt water 232 may be fully contained within a bladder 236 within the VLB 10 such that the salt water 232 does not contaminate the VLB 10 for future use with fresh water 230. For example, various liners 236 available from Fab-Seal Industrial Liners, Inc. may be provided to accommodate water to be stored within a VLB 10 and isolate the clean, non-salt water from salt water, dirty water, or various materials, gases, debris, etc. Liners suitable for use in some embodiments of the present invention include, but are not limited to, P.V.C. flexible membrane liner materials. In various embodiments, liners or bags 234, 236 may also be made of similar materials to the shipping container bags or very large bags 10 towed by a ship.

In various embodiments, bags or liners for isolating water or liquids may be fabricated in any desired manner, including in a completely flattened conformation. For example, two sheets of fabric may be cut to the desired plan shape and joined at their adjacent edges by suitable means consistent with the material of construction. For example, heat welding or solvent welding may be used if certain polymeric materials have been employed as the substance coating the fabric. Sewing may be necessary in addition. It is possible that the overall cost of a bag may be reduced if the center section and the edges are fabricated separately, i.e., not the flattened conformation.

In one embodiment, internal surfaces or portions may be coated with various materials to prevent or minimize risk of cross-contamination. For example, various spray-coatings may be applied once a quantity of water is emptied from a portion or section of the VLB to create a virgin surface for the holding and contacting with water or similar fluid cargoes. By way of example, industrial water-proof coatings provided by the Procachem Corporation may be provided to coat, cover, or seal a surface that was exposed to or in contact with salt water, dirty water, or a different type of water so as to render the surface capable of accommodating water without significant risk of cross-contamination. In various embodiments, internal volumes of bladders or similar structures are coated with a layer of material, the layer of material comprising an appropriate thickness to substantially eliminate the risk of cross-contamination between a liquid or material to be stored and a liquid or material previously stored in the same tank. In various embodiments, the layer of material applied is not so thick as to substantially impact the overall internal volume of the container, tank, vessel, etc.

It will be recognized that various different liquids and gases may be contained and transported within embodiments of the present invention. Accordingly, the present invention is not limited to the transport of water, wine, or human potable substances.

While various embodiments of the present invention have been described in detail, it is apparent that modifications and alterations of those embodiments will occur to those skilled in the art. However, it is to be expressly understood that such modifications and alterations are within the scope and spirit of the present invention, as set forth in the Summary, Detailed Description, and in the following claims. Further, the invention(s) described herein are capable of other embodiments and of being practiced or of being carried out in various ways. In addition, it is to be understood that the phraseology and terminology used herein is for the purposes of description and should not be regarded as limiting. The use of "including," "comprising," or "adding" and variations thereof herein are meant to encompass the items listed thereafter and equivalents thereof, as well as, additional items.

Figure 24:
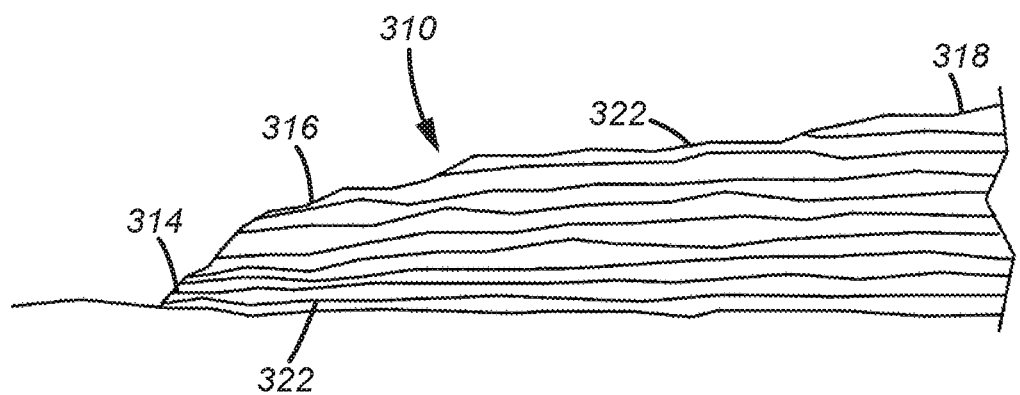
FIG. 24 depicts a cross-sectional side view of an ice source in accordance with one embodiment of the present invention.
Figure 25:
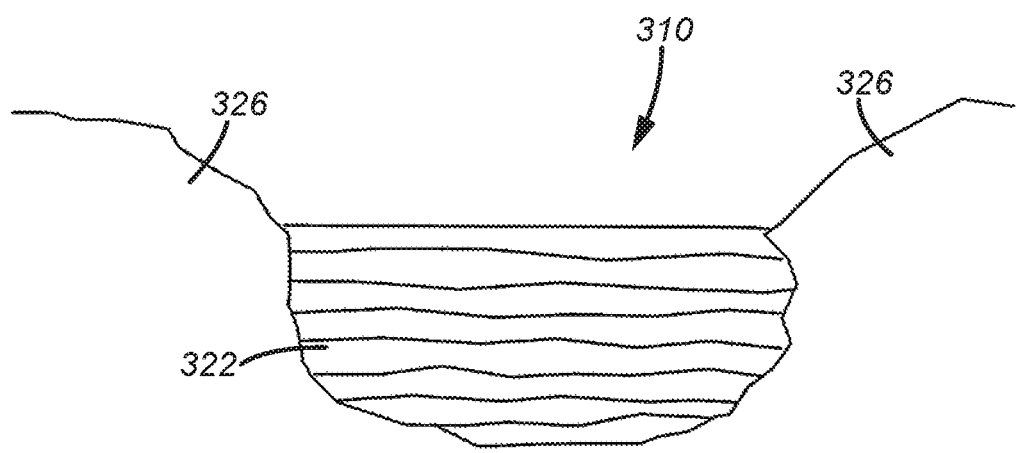
FIG. 25 depicts a cross-sectional front view of an ice source in accordance with another embodiment of the present invention.

The present invention is directed towards a method and system of recovering, grouping, and processing ice to form drinking water. With reference to FIGS. 24 and 25, an ice source 310 (e.g., glacier, ice sheet, ice cap, or the like) will be described. The ice source 310 comprises a plurality of layers 322. Each layer 322 of the ice source 310 corresponds to a different time period. Each year accumulation of precipitation in the form of typically snow fall or snow from wind and the like builds up on top of the ice source. Therefore, the further down a layer 322 is, the older it is relative to layers above it. Generally, ice and snow accumulate at the upper regions of the ice source in what is known as an accumulation zone 318. The accumulation zone 318 is typically defined by newer, less dense water. Because the ice source is made of water it flows but at a very slow rate. The ice source has a terminus 314 where the ice source ends and either land or water begins. Between the terminus 314 and the accumulation zone 318 there is an area known as the ablation area 316. Generally, the ablation area in contrast to the accumulation area is where snow, ice and the like tends to leave at a quicker rate than it accumulates. Therefore, generally older layers of ice are exposed at the surface as can be seen in FIG. 24 towards the ablation area 316 and the terminus 314 of an ice source 310.

The fact that older layers of ice are exposed toward the ablation area 316 and the terminus 314 and of the ice source 310 makes it preferable to recover and process the ice towards the ablation area 316 and/or terminus 314 of the ice source 310, rather than recovering and processing the ice and/or snow from area closer to the accumulation zone 318 of the ice source 310. Generally ice sources at their terminus 314 of the source 310 are surrounded by land 326 as can be seen in FIG. 25. The layers 322 are exposed typically horizontally at the terminus or just behind the terminus 314 around the ablation area 316.

An ice source 310 is typically defined by the size and type of land that it covers. For example, and ice sheet is a dome-shaped mass of glacial ice that covers surrounding terrain and is greater than 50,000 km². An ice cap is much like and ice sheet but it covers less than 50,000 km². An ice shelf is a portion of an ice sheet that spreads out over water. A mountain glacier is a glacier that is confined by surrounding mountain terrain. Typically, glacier ice is defined by well-bonded ice crystals compacted from snow with a bulk density greater than 860 kg/m³. Other types of ice sources exist other than glacial ice. Specifically, firns can also provide water. A firn is defined as a rounded, well-bonded accumulation of snow that is older than one year. Typically, firns have a density greater than 550 kg/m³. Firns sometimes exist proximate to, or on top of glaciers and dated water can be recovered from them as well as from the glacier ice itself. Usually firns are located toward the accumulation zone 18 of an ice source 310.

Figure 26:
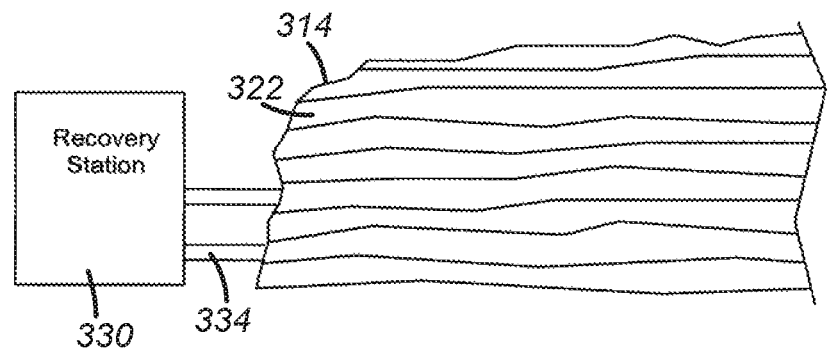
FIG. 26 depicts an ice and/or water recovery system in accordance with yet another embodiment of the present invention.

With reference to FIG. 26, one embodiment of the present invention will be described in some detail. In this embodiment, a recovery station 330 is located towards the terminus 314 of the ice source 310. The recovery station 330 may comprise, for example, a floating vessel, such as an ocean going ship. The recovery station 330 utilizes a recovery member 334 for instance, a tap and/or drill or conveyor mechanism to recover the ice and/or ice water from the ice source 310. Heating mechanisms (not shown) may also be employed as necessary to further enhance recovery of the ice/ice water. In a preferred embodiment, each layer or set of layers is processed separately thereby eliminating a separation step later in the processing of the ice. As can be appreciated, each layer 322 need not correspond to an exact year. As a matter of fact, a layer 322 of ice corresponding to a single year may be too small to be commercially exploitable because the mining of such a small layer would not yield enough product to sell. However, ice layers 322 can be grouped into a number of years, for example, a layer 322 may correspond to a span of 50 to 100 years. This would allow each layer 322 to correspond to a different century of history and may therefore appeal to different consumers. Furthermore, various layers 322 grouped into different categories based not only of their age, but on their chemical and physical properties. For example, a layer 322 may correspond to a time in history where various plants and/or other beneficial pollens were available and were therefore entrapped in the water and still are present in that layer 322. A layer higher than layer 322 may be grouped and have different properties than that of the layer below it. Therefore, layers can be grouped according not only to age but their properties. Furthermore, as the pressure continues to act on the lower ice layers, the physical properties of the layer 322 will change over time. For instance, the deionization of the water as pressure continues to push air bubbles out of the ice will result in a more pure and therefore healthier source of water.

Figure 27:
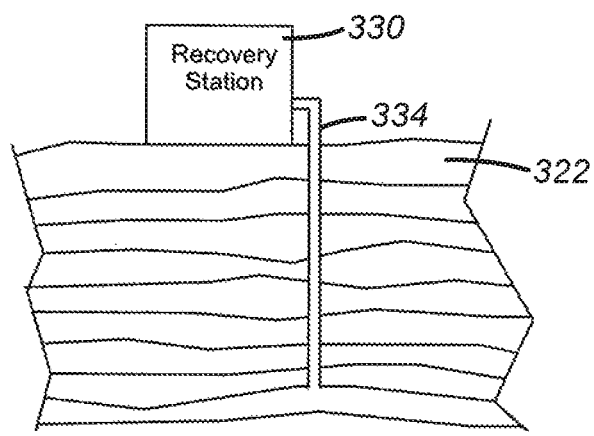
FIG. 27 depicts an ice and/or water recovery system in accordance with a further embodiment of the present invention.

With reference to FIG. 27, an alternative embodiment of the present invention will be described. In this configuration, the recovery station 330 is placed on top of the ice source 310 rather than next to it. The recovery member 334, which may be a pump, drill, set of drills, or the like, is inserted down into the ice source to recover the layers 322 of ice. This embodiment requires ice cores to be recovered then processed according to methods that will be described later. Specifically, the ice cores that are removed will need to be categorized after they are removed rather than before or during removal. In the embodiment where a recovery station is placed next to the ice source as depicted in FIG. 26, the categorization and grouping of layers 322 may be done previous to recovery of an ice layer 322. Whereas in the configuration depicted in FIG. 27, the ice cores must be removed prior to separation into groups.

There are several known methods of recovering and processing water recovered from ice sources. For example, PCT Application No. 00/39408 to Sundberg et al. describes a method and apparatus for utilizing glacier ice as drinking water, and is herein incorporated by this reference in its entirety. The apparatus comprises two stepwise operating and synchronized conveying lines, which cross each other and are perpendicular to each other. It also comprises a cutting station, a packing device, and a cutting device. Ice is cut from a glacier and packaged under hygienic conditions before it melts into liquid water. This process maintains the pristine aspects of the water retrieved from the ice source. Preferably, water is retrieved and processed from the lower layers of the ice source that potentially have more value than the upper layers that are not as old and have relatively fewer unique characteristics.

In still another embodiment of the present invention, the recovery station 330 may be a scraper, or the like, that removes layers 322 one at a time from the ice source. In this embodiment, only the new layers are used (i.e., layers less than a couple of hundred years old). If the recovery station 330 is an ice scraper or the like, the older layers may never be reached because continual accumulation on the top of the ice source 310 may preclude the recovery station 330 from ever getting below a certain depth.

Figure 28:
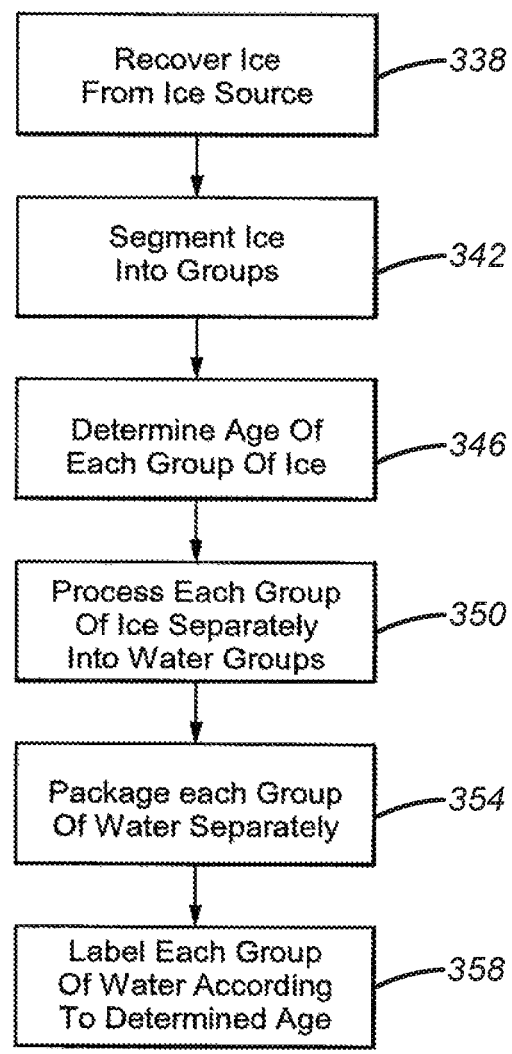
FIG. 28 is a flow chart depicting aspects of the operation of water recovery system in accordance with embodiments of the present invention in connection with grouping and separating water from an ice source.

With reference to FIG. 28, a method of categorizing and processing the ice from an ice source 310 will be described in detail. In step 338, ice is recovered from the ice source. Then the ice is segmented into groups in step 342. As described above, if the recovery station 330 is placed next to, specifically at the terminus 314 of an ice source 310, the ice may be segmented prior to recovery. However, in accordance with certain embodiments of the present invention, the ice may be removed first then segmented and grouped in step 342. In step 346, the age of each group of ice is determined. As described above, the age of the ice may have already been determined for each layer 322 and may have occurred prior to removal or mining of that particular ice layer. Once the ice is properly grouped according to either age, physical, and/or chemical properties, each grouping of ice is processed separately in step 350. Specifically, the ice is processed under hygienic and preferably sterile conditions such that contaminants are not introduced to the water thereby changing the chemical and physical properties of the water, which give it value. Preferably, the ice is processed into water groups in step 350 utilizing stainless steel materials and other sterile utensils. Then, in step 354, each group of water is packaged according to their age and/or physical and chemical properties. The water may be packaged into individual containers ranging between sizes of 0.1 liter to 10 liter. In a preferred range of 0.5 liters to 5 liters and more preferably between 1 to 2 liters.

In an alternative embodiment, a primary source of water that is not categorized and extracted as described above is mixed with an amount of categorized water that was extracted from the ice source 310. Ratios of the primary water and categorized water can vary depending on the desired selling price of the final product and the amount of available categorized water. If a consumer wishes to purchase a bottle of water made purely from dated water, then no other water is mixed with the dated water and subsequently a higher price may be demanded for the premium water. However, in order to create a more price friendly product, a larger ratio of primary water to dated water could be used.

A number of containers may be filled with amounts of the primary water in accordance with embodiments of the present invention. These containers may be placed proximate to the ice source or at a remote site. Regardless of the placement and size of the containers used an amount of dated water that has been categorized and extracted from the ice source 310 is added to a different container depending upon the characteristics of the water. For example, water from a first layer of the ice source 310 is placed into a first container with a first amount of primary water and water from a second layer of the ice source 310 is placed into a second container with a second amount of primary water. The amount of primary water used in each container may depend upon the characteristics of the dated water that is being added as well as the amount of dated water that can be recovered.

Figure 29:
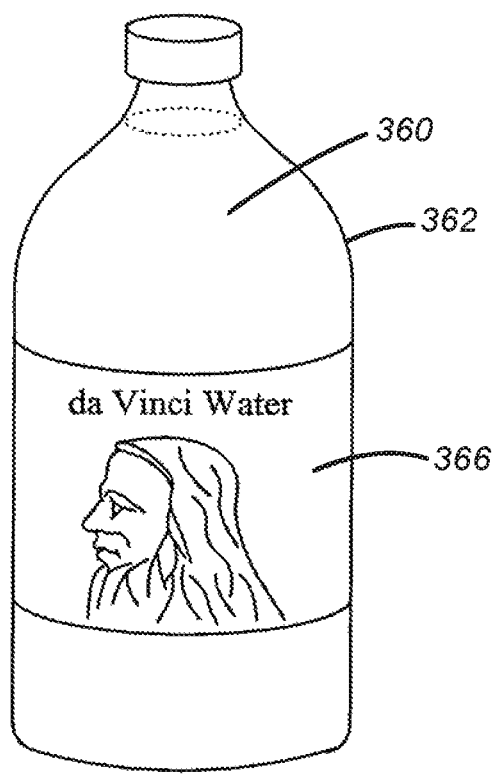
FIG. 29 depicts an exemplary final product in accordance with embodiments of the present invention.

Referring now to FIG. 29 a product produced in accordance with embodiments of the present discussion will be discussed. Ultimately, the final product is water or a beverage derived from water that has certain unique characteristics. These characteristics may include the age of the water, the chemical and/or physical properties of the water, and the taste of the water. After recovering water 360 from an ice source having these unique characteristics, the product is then bottled either in a solid or liquid state depending on the methods used to recover and process the water 360. The water 360 is collected in a container 362. Then, depending on the characteristics of the water 360, a label 366 is placed on the container 362 to provide an indication of the characteristics of the water 360. For example, water recovered from an ice source having an age of about 550 years may be labeled as "da Vinci Water" or "Renaissance Water" to reflect the characteristics of the water 360 contained within the container 362.

In various embodiments of the present invention, steps for recovering, segmenting, determining, and packaging the ice into their respective containers is described. As can be appreciated, various steps of the methods described can be completed in different orders depending on how the water is recovered and processed.

The foregoing discussion of the invention has been presented for purposes of illustration and description. Further the description is not intended to limit the invention to the form disclosed herein. Consequently, variations and modifications commensurate with the above teachings, within the skill or knowledge of the relevant art, are within the scope of the present invention. The embodiments described above are further intended to explain the best mode presently known of practicing the invention and to enable others skilled in the art to utilize the invention in other embodiments and with various modifications required by their particular application or use of the invention. It is intended that the appended claims be construed to include alternative embodiments to the extent permitted by the prior art.

Figure 30:
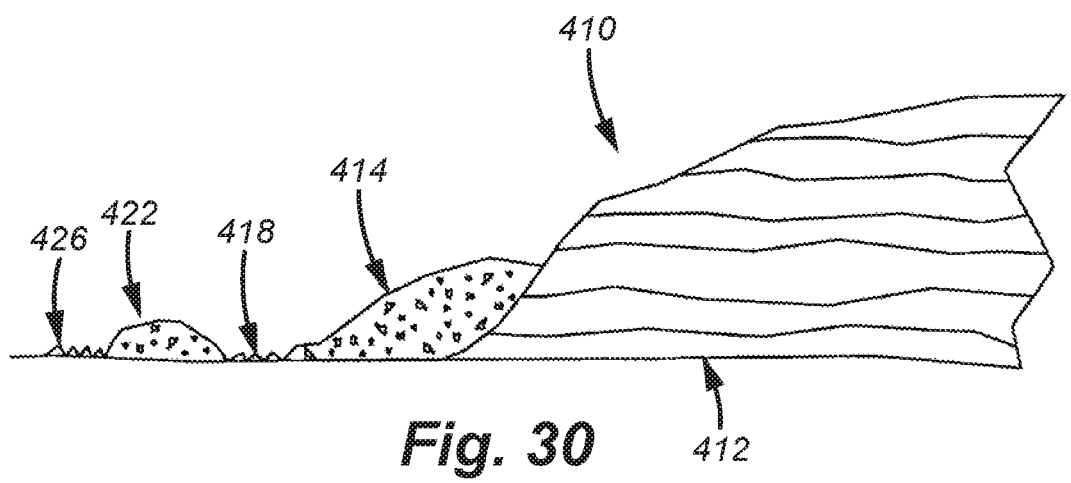
FIG. 30 is a plan view of a natural glacial melt water filtration system, utilizing gravity and additional geologic structural members to provide thorough filtration.

FIG. 30 is a plan view of glacial ice and melt water 412 as it is subjected to colloidal clay filtering. One aspect of the present invention is that the source water 410 is of a high degree of purity at the beginning of the process. With respect to the present invention, a high degree of purity refers to an ice or water source that is substantially free of harmful contaminants. While it will be recognized that certain contaminants may be more or less harmful to different individuals, substantially free of harmful contaminants with the respect to the present invention means that the source contains such a low level of contaminants as to not cause illness or harm to an adult human when up to 428 fluid ounces are consumed on a daily basis. By selecting a water source of sufficient initial purity, natural and organic filtering can be applied to produce high quality potable water without the use of sterilization chemicals or energy intensive filtration means.

It is known that soil acts as a natural filter of water. In addition to the mechanical capturing of solid particles, the term filtering in this context also involves retaining chemicals, transforming chemicals, and restricting the movement of certain substances. These acts of filtering are often known as soil attenuation. Soil attenuation includes the ability to immobilize metals and remove bacteria that may be carried into the water through such means as human or mammalian waste. It is further known that fine textured soils, such as clay, provide superior filtration of water when compared to large grained or coarse soils such as sand. Water travels through coarse soils more rapidly, thereby reducing contact between the water and soil and thus reducing filtration or attenuation. Permeability is a typical measure of a soil's ability to transmit water and other fluids. Clay is known to have a relatively low permeability as a result of its small grain size and large surface area, causing increased friction between water transmitting through the clay. Clay may have a permeability, or hydraulic conductivity, as low as $10^{-10}$ centimeters per second whereas well sorted sands and gravels typically have a permeability of $10^{-3}$ to 1 centimeter per second.

The method depicted in FIG. 30 depicts the natural process by which glacial water 418, 426 is filtered through clay deposits 414 under the force of gravity and is further subjected to additional filtering 422 through clay of the same composition that is selectively positioned by the operator of the current invention. In one embodiment of the present invention, the soil used in filtration is of permeability between 1 and $10^{-12}$ centimeters per second. In a preferred embodiment, soil used in the filtration has permeability approximately between $10^{-5}$ and $10^{-11}$ centimeters per second. In a more preferred embodiment, soil is used in the filtration process that has permeability approximately between $10^{-8}$ and $10^{-10}$ centimeters per second. This additional phase of clay filtration 422 is selectively implemented by the user to create an additional filtration process in an area with sufficient flow rate.

It will be recognized that this additional clay filter need not be of any particular size. Creation of the appropriate sized filter will largely be determined by the user's needs and the natural flow rate of melt water in the particular setting. By taking advantage of the gravitational potential energy of glaciers, ice caps, and the like, the present invention offers a significant advantage over traditional household and commercial filtration processes, such as reverse osmosis, in that the current process does not require energy input generated from hydrocarbon sources. While it will be recognized that initial construction of additional clay filtration stages 422 may potentially require energy input from hydrocarbon fuels, renewable energy sources including human power, or other input, it is an object of the present invention that these filtration stages will operate under the energy provided by gravitational potential energy and the kinetic energy of ice and water.

Figure 31:
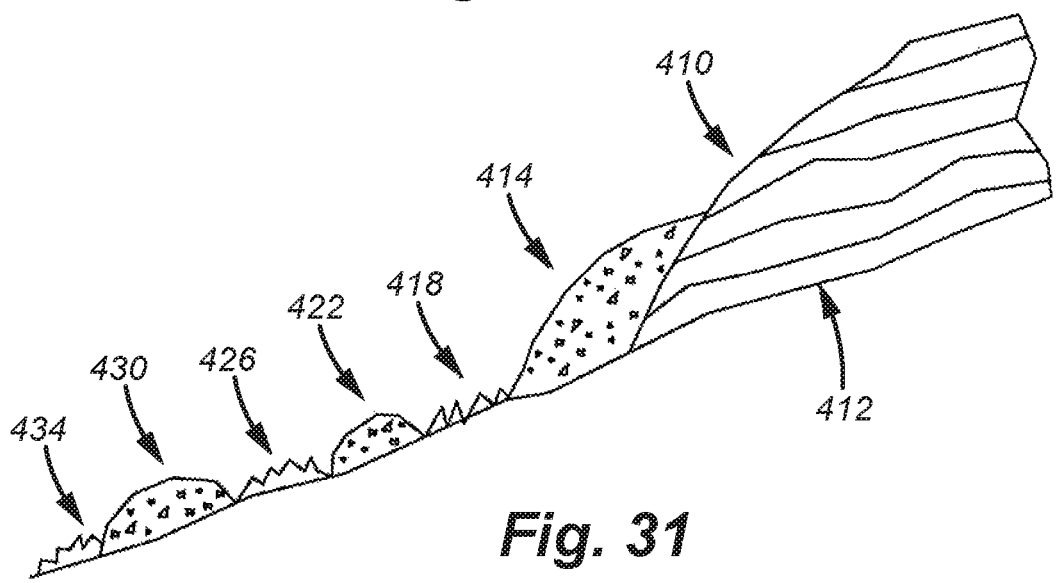
FIG. 31 is a plan view of an embodiment of the present invention using multiple iterations of natural filtration for glacial melt waters.

FIG. 31 depicts an embodiment of the present invention where a plurality of additional clay filters 422, 430 have been constructed to further filter and purify glacial water. It will be known to one of skill in the art that any number of additional filtration phases may be constructed. Accordingly, the present invention may be accomplished as described herein with any feasible number of filters.

Figure 32:
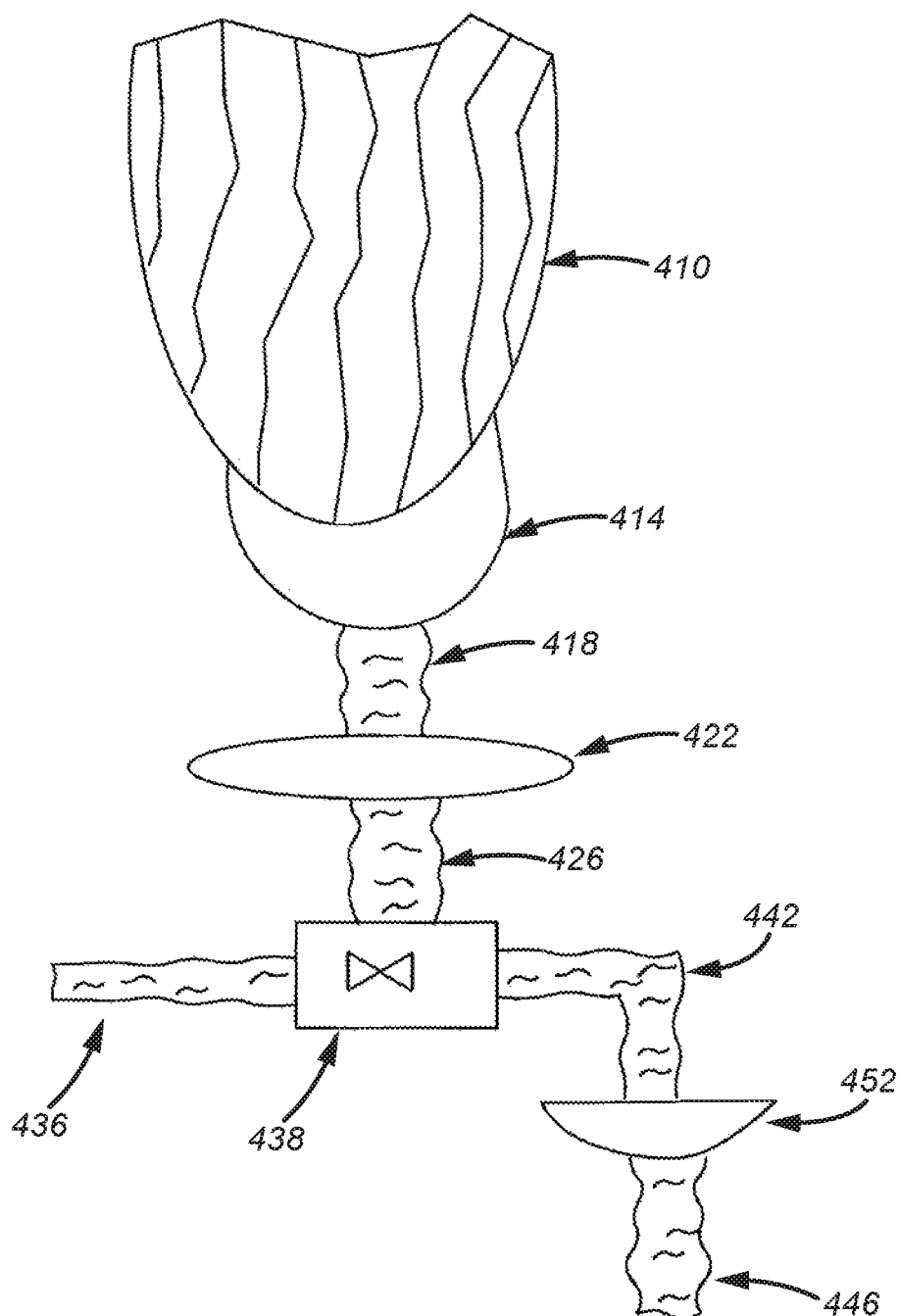
FIG. 32 is a top view of an embodiment of the present invention where glacial ice or water may be selectively diverted through various filters.

FIG. 32 depicts another embodiment of the present invention where the source ice or water 410 is filtered through natural clay 414, further filtered through a constructed additional clay filter 422, and selectively diverted by a control valve 438 based on whether or not additional filtration is desired. The control valve 438 may be selectively adjusted to divert water and ice 436 that the user does not desire to undergo additional filtration to bottling or processing facilities. Alternatively, the control valve 438 may also be selectively positioned so that water and ice 426 are subjected to further constructed filter iterations 432. The resulting water and ice 446 may then be diverted to processing and bottling facilities, subjected to further filtrations, or subjected to additional control valve and filtration steps as previously described.

Figure 33:
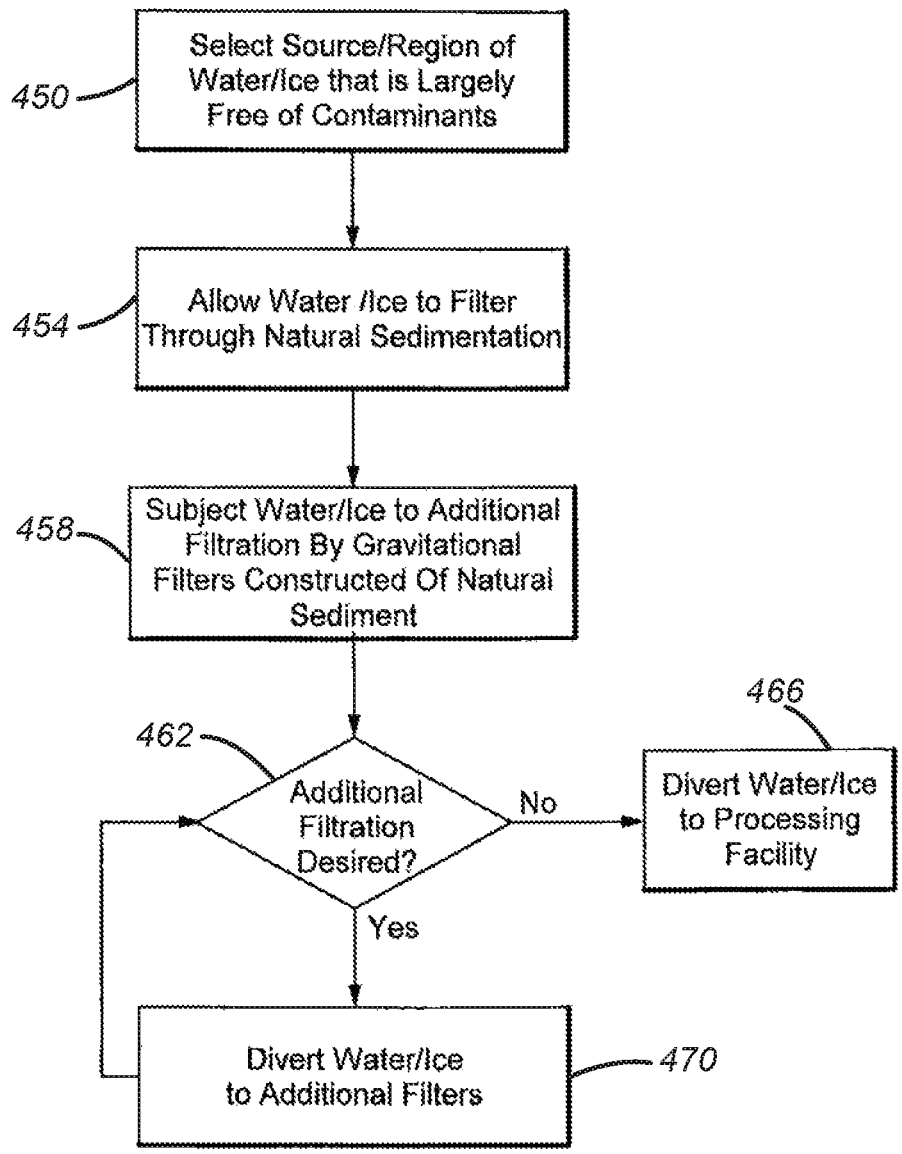
FIG. 33 is a flowchart illustrating one embodiment of the present invention where natural potable water is obtained from glacial ice.

FIG. 33 depicts a flowchart describing one embodiment the present invention. The initial step 450 involves selecting a glacial body or ice cap of sufficient purity. While it will be recognized that many natural sources of water and ice contain some level of impurity, the present invention contemplates a source that is generally untouched by human and/or mammalian beings and located in latitudes where emissions from industrialized nations have very little impact. While the present invention is not limited to application in any particular region, glacial ice and ice caps south of 15 degrees latitude are well suited for this process. Once a water source is identified, the present invention contemplates allowing the glacial ice and melt water to channel naturally through sediment in its surroundings 454. Ideally, this sediment is composed of clay or similar soil which provides a low permeability and naturally filters the water. After this first step of filtration has occurred, the resulting water is then passed through additional man-made sedimentary filters 458. In one embodiment of the present invention, these filters are composed of the same or similar clay-like soil as in process 454. The water may either be selectively diverted to the additional man-made filters, or the filters may be constructed in the natural path of the water. It is a critical feature of the present invention that this sedimentary filtration 454, 458 is powered solely by gravitational forces. One benefit that will be recognized is the reduced or eliminated need to provide energy input to achieve filtration. Decision block 462 involves a determination of whether the water and ice should be subjected to additional sedimentary filters or diverted to a facility for processing and/or bottling. If additional filtration is not desired, the water may be diverted by, for example, a valve 438 to the processing or bottling facility 466. One of ordinary skill in the art will realize that this valve may be comprised of a gate valve, ball valve, globe valve, three-way valve, or any valve suitable for diverting water or ice. If additional filtration is desired, the valve may be selectively positioned to divert the water or ice to additional sedimentary filters of the previously discussed composition 170.

Figure 34:
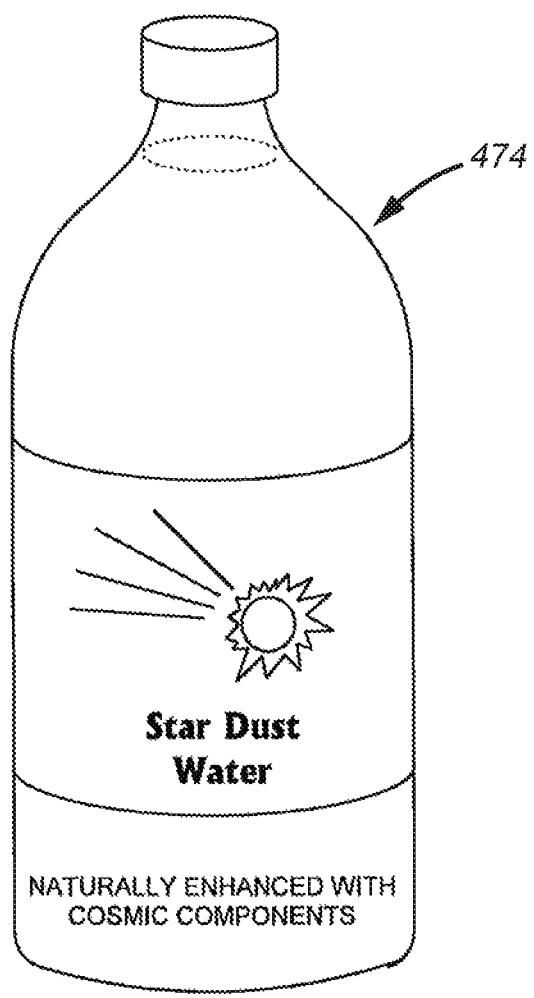
FIG. 34 depicts an exemplary final product in accordance with embodiments of the present invention.

FIG. 34 depicts an exemplary final product 474 of the present invention whereby clean, filtered, potable water is produced without the use of sterilizing chemicals, such as chlorine or iodine, or energy intensive filtration processes. A benefit of the present invention is the ability to produce pure, potable water without destroying, filtering, or eliminating desirable active contents. By filtering the source water by natural sedimentary processes, it is possible to market a product that may contain amino acids, such as glycine and other amino acids traceable to extraterrestrial bodies. With respect to the present invention, extraterrestrial bodies refer to comets, meteors, and other similar bodies. The prospect of producing pure, healthy water with prospect of drinking the original building blocks of life on Earth holds significant commercial appeal.

The foregoing discussion of the invention has been presented for purposes of illustration and description. Further the description is not intended to limit the invention to the form disclosed herein. Consequently, variations and modifications commensurate with the above teachings, within the skill or knowledge of the relevant art, are within the scope of the present invention. The embodiments described above are further intended to explain the best mode presently known of practicing the invention and to enable others skilled in the art to utilize the invention in other embodiments and with various modifications required by their particular application or use of the invention. It is intended that the appended claims be construed to include alternative embodiments to the extent permitted by the prior art. It will be recognized that the steps described herein may be conducted in a variety of sequences without violating the novelty or spirit of the present invention. In one particular embodiment, the present invention is conducted by adhering to a sequence of first selecting a water source substantially free of harmful contaminants, including heavy metals, PCBs, and pesticides, subsequently constructing one or more filters at a point of lower gravitational potential energy than the source, subsequently identifying signature characteristics of the filtered water, and finally packaging the water for distribution.

What is claimed is:

1. A system for storing and conveying fluids, said system comprising:
   a non-rigid, water-impermeable device with an elongate shape having a first end, a second end and having a generally streamlined shape in plan view; the first end comprising a first attachment device; the second end comprising a second attachment device;
   at least two ports for intake and exhaust of fluids; at least one of the at least two ports comprising a valve for a user to adjust buoyancy of the non-rigid, water-impermeable device;
   one or more valves in two-way communication with at least a portion of an interior volume of the non-rigid, water-impermeable device and an outside environment;
   a global positioning system (GPS) transponder positioned on the non-rigid, water-impermeable device for conveying information related to the geographic position of the device;
   at least a portion of an internal surface area of the non-rigid, water-impermeable device being comprised of a flexible and tear resistant material; and
   one or more drones capable of maneuvering the non-rigid, water-impermeable device.

2. The system as set forth in claim 1, further comprising a water purification system for treating fresh water.

3. The system as set forth in claim 1, wherein at least a portion of the non-rigid, water-impermeable device contains a fluid of lower density than a fluid through which said non-rigid, water-impermeable device is transported.

4. The system as set forth in claim 1, further comprising one or more photovoltaic arrays to collect solar energy, said arrays being adapted to contact a non-submerged surface of the non-rigid, water-impermeable device.

5. The system as set forth in claim 1, wherein the amount of air within a portion of the non-rigid, water-impermeable device adjusts the buoyancy of the non-rigid, water-impermeable device.

6. The system as set forth in claim 1, wherein the internal surface of the non-rigid, water-impermeable device has a coating to preserve the purity of said lower density fluid.

7. The system as set forth in claim 1, wherein the non-rigid, water-impermeable device is in a generally horizontal position with respect to a water line.

8. The system as set forth in claim 1, wherein the non-rigid, water-impermeable device is reduced in volume for ease of transport.

9. A system for storing and conveying fluids, said system comprising: a non-rigid, water-impermeable device with an elongate shape having a first end, a second end and having a generally streamlined shape in plan view; the first end comprising a first attachment device; the second end comprising a second attachment device; at least two ports for intake and exhaust of fluids; at least one of the at least two ports comprising a valve for a user to adjust buoyancy of the non-rigid, water-impermeable device; at least a portion of the non-rigid, water-impermeable device containing a fluid of lower density than a fluid through which said non-rigid, water-impermeable device is transported; one or more valves in two-way communication with at least a portion of an interior volume of the non-rigid, water-impermeable device and an outside environment; a global positioning system (GPS) transponder positioned on the non-rigid, water-impermeable device for conveying information related to the geographic position of the device; at least a portion of an internal surface area of the non-rigid, water-impermeable device being comprised of a flexible and tear resistant material; and the non-rigid, water-impermeable device being moored to a fixed or floating object; wherein the internal surface of the non-rigid, water-impermeable device has a coating to preserve the purity of said lower density fluid; and
   one or more photovoltaic arrays operably associated with the non-rigid, water-impermeable device.

10. The system as set forth in claim 9, wherein the non-rigid, water-impermeable device is reduced in volume for ease of transport.

11. The system as set forth in claim 9, wherein the fluid contained within the non-rigid, water-impermeable device is in a state of original integrity when in a submerged position.

12. The system as set forth in claim 9, wherein the non-rigid, water-impermeable device is in a generally horizontal position with respect to a water line.

* * * * *